US012784678B2

(12) United States Patent
Lu et al.

(10) Patent No.: US 12,784,678 B2
(45) Date of Patent: Nov. 3, 2026

(54) PIXEL DRIVE CIRCUIT INCLUDING DRIVING TRANSISTORS CONNECTED IN PARALLEL, DISPLAY PANEL, AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Hongting Lu, Beijing (CN); Hui Lu, Beijing (CN); Yunpeng Zhang, Beijing (CN)

(73) Assignees: CHENGDU BOE OPTOELECTRONICS TECHNOLOGY CO., LTD., Chengdu (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/996,943

(22) PCT Filed: Mar. 1, 2023

(86) PCT No.: PCT/CN2023/079025
§ 371 (c)(1),
(2) Date: Jan. 17, 2025

(87) PCT Pub. No.: WO2024/178673
PCT Pub. Date: Sep. 6, 2024

(65) Prior Publication Data

US 2026/0031035 A1 Jan. 29, 2026

(51) Int. Cl.
*G09G 3/3233* (2016.01)
*H10K 59/121* (2023.01)
*H10K 59/131* (2023.01)

(52) U.S. Cl.
CPC ....... *G09G 3/3233* (2013.01); *H10K 59/1213* (2023.02); *H10K 59/131* (2023.02);
(Continued)

(58) Field of Classification Search
CPC ......... G09G 3/3233; G09G 2300/0426; G09G 2300/0819; G09G 2300/0842; G09G 2310/08; H10K 59/1213; H10K 59/131
See application file for complete search history.

(56) References Cited

U.S. PATENT DOCUMENTS 11,011,112 B2 5/2021 Li et al.
2020/0302860 A1 9/2020 Kim et al.
(Continued)

FOREIGN PATENT DOCUMENTS

CN 110299107 A 10/2019
CN 111739905 A 10/2020
(Continued)

OTHER PUBLICATIONS

Written Opinion of PCT/CN2023/079025 dated Nov. 4, 2023, (7p).
(Continued)

*Primary Examiner* — Rodney Amadiz
(74) *Attorney, Agent, or Firm* — Arch & Lake LLP

(57) ABSTRACT

A pixel drive circuit includes: a plurality of driving transistors, wherein a second electrode of each of the plurality of driving transistors is connected to a first electrode of a same light-emitting unit, and each of the plurality of driving transistors is configured to input a driving current to the light-emitting unit according to a voltage of a gate electrode of each of the plurality of driving transistors.

11 Claims, 45 Drawing Sheets

(52) U.S. Cl.
CPC ............... *G09G 2300/0426* (2013.01); *G09G 2300/0819* (2013.01); *G09G 2300/0842* (2013.01); *G09G 2310/08* (2013.01)

(56) References Cited

U.S. PATENT DOCUMENTS

| | | | |
|---|---|---|---|
| 2020/0410926 | A1 | 12/2020 | Li et al. |
| 2021/0359058 | A1 | 11/2021 | Cho et al. |

FOREIGN PATENT DOCUMENTS

| | | | |
|---|---|---|---|
| CN | 112470286 | A | 3/2021 |
| CN | 113643663 | A | 11/2021 |
| CN | 114122101 | A | 3/2022 |
| CN | 114550652 | A | 5/2022 |
| CN | 115152030 | A | 10/2022 |
| CN | 115472126 | A | 12/2022 |
| CN | 115862537 | A | 3/2023 |

OTHER PUBLICATIONS

International Search Report issued in Application No. PCT/CN2023/079025 dated Nov. 4, 2023, with English translation, (5p).

PIXEL DRIVE CIRCUIT INCLUDING DRIVING TRANSISTORS CONNECTED IN PARALLEL, DISPLAY PANEL, AND DISPLAY DEVICE

CROSS REFERENCE TO RELATED APPLICATION

The present application is the U.S. National Stage of International Application No. PCT/CN2023/079025, filed on Mar. 1, 2023, the contents of which are incorporated herein by reference in its entirety for all purposes.

TECHNICAL FIELD

The present disclosure relates to the display technical field, and in particular, to a pixel driving circuit, a display panel and a display device.

BACKGROUND

In related art, a pixel driving circuit usually includes a driving transistor, and the driving transistor provides a driving current to a light-emitting unit according to a data signal at a gate electrode of the driving transistor. However, Data Range (a voltage range of the data signal) is limited by a chip of the display panel, resulting in the pixel driving circuit being unable to output a relatively large driving current.

It should be noted that the information disclosed in the above background section is only used to enhance understanding of the background of the present disclosure, and therefore may include information that does not constitute prior art known to those of ordinary skill in the art.

SUMMARY

According to an aspect of the present disclosure, there is provided a pixel driving circuit, including:

a plurality of driving transistors, wherein a second electrode of each of the plurality of driving transistors is connected to a first electrode of a same light-emitting unit, and each of the plurality of driving transistors is configured to input a driving current to the light-emitting unit according to a voltage of a gate electrode of each of the plurality of driving transistors.

In an example embodiment of the present disclosure, the gate electrode of each of the plurality of driving transistors is connected to a first node, and a first electrode of each of the plurality of driving transistors is connected to a first power terminal.

In an example embodiment of the present disclosure, the pixel driving circuit further includes: a data writing circuit, a compensation circuit, a light-emitting control circuit, a first reset circuit, a second reset circuit and a storage circuit. The data writing circuit is connected to a data signal terminal, the first electrode of each of the plurality of driving transistors and a first gate driving signal terminal, and is configured to transmit a signal of the data signal terminal to the first electrode of each of the plurality of driving transistor in response to a signal of the first gate driving signal terminal. The compensation circuit is connected to the first node, the second electrode of each of the plurality of driving transistors and a second gate driving signal terminal, and is configured to create connectivity between the first node and the second electrode of each of the plurality of driving transistors in response to a signal of the second gate driving signal terminal. The light-emitting control circuit is connected to the first power terminal, the first electrode of each of the plurality of driving transistors, an enable signal terminal, the second electrode of each of the plurality of driving transistors and the first electrode of the light-emitting unit, and is configured to create connectivity between the first power terminal and the first electrode of each of the plurality of driving transistors in response to a signal of the enable signal terminal and is configured to create connectivity between the second electrode of each of the plurality of driving transistors and the first electrode of the light-emitting unit in response to the signal of the enable signal terminal. The first reset circuit is connected to a first initialization signal terminal, a first reset signal terminal and the first node, and is configured to transmit a signal of the first initialization signal terminal to the first node in response to a signal of the first reset signal terminal. The second reset circuit is connected to a second initialization signal terminal, a second reset signal terminal and the first electrode of the light-emitting unit, and is configured to transmit a signal of the second initialization signal terminal to the first electrode of the light-emitting unit in response to a signal of the second reset signal terminal. The storage circuit is connected between the first node and the first power terminal.

In an example embodiment of the present disclosure, the data writing circuit includes:

a fourth transistor, wherein a first electrode of the fourth transistor is connected to the data signal terminal, a second electrode of the fourth transistor is connected to the first electrode of each of the plurality of driving transistors, and a gate electrode of the fourth transistor is connected to the first gate driving signal terminal;

wherein the compensation circuit includes:

a second transistor, wherein a first electrode of the second transistor is connected to the first node, a second electrode of the second transistor is connected to the second electrode of each of the plurality of driving transistors, and a gate electrode of the second transistor is connected to the second gate driving signal terminal;

wherein the light-emitting control circuit includes a fifth transistor and a sixth transistor: a first electrode of the fifth transistor is connected to the first power terminal, a second electrode of the fifth transistor is connected to the first electrode of each of the plurality of driving transistors, and a gate electrode of the fifth transistor is connected to the enable signal terminal; a first electrode of the sixth transistor is connected to the second electrode of each of the plurality of driving transistors, a second electrode of the sixth transistor is connected to the first electrode of the light-emitting unit, and a gate electrode of the sixth transistor is connected to the enable signal terminal;

wherein the first reset circuit includes:

a first transistor, wherein a first electrode of the first transistor is connected to the first initialization signal terminal, a second electrode of the first transistor is connected to the first node, and a gate electrode of the first transistor is connected to the first reset signal terminal;

wherein the second reset circuit includes:

a seventh transistor, wherein a first electrode of the seventh transistor is connected to the second initialization signal terminal, a second electrode of the seventh transistor is connected to the first electrode of the light-emitting unit, and a gate electrode of the seventh transistor is connected to the second reset signal terminal;

wherein the storage circuit includes:

a capacitor, wherein a first electrode of the capacitor is connected to the first node, and a second electrode of the capacitor is connected to the first power terminal.

In an example embodiment of the present disclosure, the pixel driving circuit includes a plurality of pixel driving sub-circuits, each of the plurality of pixel driving sub-circuits c includes at least one driving transistor of the plurality of driving transistors, and each of the plurality of pixel driving sub-circuits is connected to the same light-emitting unit, and each of the plurality of pixel driving sub-circuits is configured to provide a driving current to the light-emitting unit.

In an example embodiment of the present disclosure, the pixel driving sub-circuit further includes: a data writing circuit, a compensation circuit, a light-emitting control circuit, a first reset circuit, a second reset circuit and a storage circuit. The data writing circuit is connected to a data signal terminal, the first electrode of the driving transistor and a first gate driving signal terminal, and is configured to transmit a signal of the data signal terminal to the first electrode of the driving transistor in response to a signal of the first gate driving signal terminal. The compensation circuit is connected to the gate electrode of the driving transistor, a second electrode of the driving transistor and a second gate driving signal terminal, and is configured to create connectivity between the gate electrode of the driving transistor and the second electrode of the driving transistor in response to a signal of the second gate driving signal terminal. The light-emitting control circuit is connected to a first power terminal, the first electrode of the driving transistor, an enable signal terminal, the second electrode of the driving transistor and the first electrode of the light-emitting unit, and is configured to create connectivity between the first power terminal and the first electrode of the driving transistor in response to a signal of the enable signal terminal, and is configured to create connectivity between the second electrode of the driving transistor and the first electrode of the light-emitting unit in response to the signal of the enable signal terminal. The first reset circuit is connected to a first initialization signal terminal, a first reset signal terminal and the gate electrode of the driving transistor, and is configured to transmit a signal of the first initialization signal terminal to the gate electrode of the driving transistor in response to a signal of the first reset signal terminal. The second reset circuit is connected to a second initialization signal terminal, a second reset signal terminal and the first electrode of the light-emitting unit, and is configured to transmit a signal of the second initialization signal terminal to the first electrode of the light-emitting unit in response to a signal of the second reset signal terminal. The storage circuit is connected between the gate electrode of the driving transistor and the first power terminal.

In an example embodiment of the present disclosure, the data writing circuit includes:

a fourth transistor, wherein a first electrode of the fourth transistor is connected to the data signal terminal, a second electrode of the fourth transistor is connected to the first electrode of the driving transistor, and a gate electrode of the fourth transistor is connected to the first gate driving signal terminal;

wherein the compensation circuit includes:

a second transistor, wherein a first electrode of the second transistor is connected to the gate electrode of the driving transistor, a second electrode of the second transistor is connected to the second electrode of the driving transistor, and a gate electrode of the second transistor is connected to the second gate driving signal terminal;

wherein the light-emitting control circuit includes a fifth transistor and a sixth transistor; a first electrode of the fifth transistor is connected to the first power terminal, a second electrode of the fifth transistor is connected to the first electrode of the driving transistor, and a gate electrode of the fifth transistor is connected to the enable signal terminal; a first electrode of the sixth transistor is connected to the second electrode of the driving transistor, a second electrode of the sixth transistor is connected to the first electrode of the light-emitting unit, and a gate electrode of the sixth transistor is connected to the enable signal terminal;

wherein the first reset circuit includes:

a first transistor, wherein a first electrode of the first transistor is connected to the first initialization signal terminal, a second electrode of the first transistor is connected to the gate electrode of the driving transistor, and a gate electrode of the first transistor is connected to the first reset signal terminal;

wherein the second reset circuit includes:

a seventh transistor, wherein a first electrode of the seventh transistor is connected to the second initialization signal terminal, a second electrode of the seventh transistor is connected to the first electrode of the light-emitting unit, and a gate electrode of the seventh transistor is connected to the second reset signal terminal;

wherein the storage circuit includes:

a capacitor, wherein a first electrode of the capacitor is connected to the gate electrode of the driving transistor, and a second electrode of the capacitor is connected to the first power terminal.

According to an aspect of the present disclosure, there is provided a display panel, wherein the display panel includes the pixel driving circuit described above.

According to an aspect of the present disclosure, there is provided a display panel, wherein the display panel includes a light-emitting unit and a pixel driving circuit for driving the light-emitting unit, the pixel driving circuit includes a plurality of driving transistors, a second electrode of each of the plurality of driving transistors is connected to a first electrode of a same light-emitting unit, and each of the plurality of driving transistors is configured to input a driving current to the light-emitting unit according to a voltage of a gate electrode of each of the plurality of driving transistors. The display panel further includes: a base substrate and an active layer, the active layer is at a side of the base substrate, the active layer includes a plurality of third active portions, and the third active portions are used to form channel regions of the plurality of driving transistors.

In an example of the present disclosure, the active layer further includes an eighth active portion and a ninth active portion, and the third active portions in a same pixel driving circuit are connected in parallel between the eighth active portion and the ninth active portion.

In an example of the present disclosure, an orthographic projection of the eighth active portion on the base substrate and an orthographic projection of the ninth active portion on the base substrate extend along a second direction;

wherein orthographic projections of the plurality of third active portions in the same pixel driving circuit on the base substrate are spaced apart along the second direction.

In an example of the present disclosure, the display panel further includes:

a first conductive layer at a side of the active layer away from the base substrate, wherein the first conductive layer includes a first conductive portion, an orthographic projection of the first conductive portion on the base substrate covers an orthographic projection of each of the third active portions in the same pixel driving circuit on the base substrate; and wherein at least a partial structure of the first conductive portion is used to form a gate electrode of the driving transistors.

In an example of the present disclosure, the pixel driving circuit further includes a fourth transistor and a fifth transistor, a first electrode of the fourth transistor is connected to a data line, a second electrode of the fourth transistor is connected to a first electrode of the driving transistor, a first electrode of the fifth transistor is connected to a first power line, and a second electrode of the fifth transistor is connected to the first electrode of the driving transistor. The active layer further includes a fourth active portion and a fifth active portion, the fourth active portion is connected to an end of the eighth active portion, and the fourth active portion is used to form a channel region of the fourth transistor; the fifth active portion connected to the other end of the eighth active portion, wherein the fifth active portion is used to form a channel region of the fifth transistor. The display panel further includes a first conductive layer, the first conductive layer is located at a side of the active layer away from the base substrate, and the first conductive layer includes a first gate line and an enable signal line; an orthographic projection of the first gate line on the base substrate extends along a first direction and covers an orthographic projection of the fourth active portion on the base substrate, a partial structure of the first gate line is used to form a gate electrode of the fourth transistor, and the first direction intersects the second direction. An orthographic projection of the enable signal line on the base substrate extends along the first direction and covers an orthographic projection of the fifth active portion on the base substrate, and a partial structure of the enable signal line is used to form the gate electrode of the fifth transistor. The orthographic projections of the third active portions on the base substrate are located between the orthographic projection of the first gate line on the base substrate and the orthographic projection of the enable signal line on the base substrate.

In an example embodiment of the present disclosure, the pixel driving circuit includes a plurality of pixel driving sub-circuits, and orthographic projections of the plurality of pixel driving sub-circuits on the base substrate are distributed in an array along a first direction and/or a second direction, and the first direction intersects the second direction; each of the plurality of pixel driving sub-circuits includes the driving transistor, and each of the plurality of pixel driving sub-circuits is connected to a same light-emitting unit, and each of the plurality of pixel driving sub-circuits is used to provide a driving current to the light-emitting unit. The display panel further includes an active layer and a first conductive layer; the active layer is at a side of the base substrate, wherein the active layer includes a plurality of third active portions, and the plurality of third active portions are used to form channel regions of the driving transistors. The first conductive layer is at a side of the active layer away from the base substrate, wherein the first conductive layer includes a plurality of first conductive portions spaced apart, the first conductive portions and the third conductive portions are arranged correspondingly, and an orthographic projection of one of the first conductive portions on the base substrate covers an orthographic projection of a corresponding third active portion on the base substrate, and the first conductive portion is to form the gate electrode of the driving transistor.

In an example embodiment of the present disclosure, the pixel driving sub-circuit further includes a sixth transistor and a seventh transistor, a first electrode of the sixth transistor is connected to a second electrode of the driving transistor, a second electrode of the sixth transistor is connected to a first electrode of the light-emitting unit, a first electrode of the seventh transistor is connected to a second initialization signal line, and a second electrode of the seventh transistor is connected to the first electrode of the light-emitting unit. The active layer further includes a sixth active portion, a seventh active portion and a tenth active portion; the sixth active portion is connected to the third active portion, and the sixth active portion is used to form a channel region of the sixth transistor; the seventh active portion is connected to an end of the sixth active portion away from the third active portion, and the seventh active portion is used to form a channel region of the seventh transistor; the tenth active portion is connected between the sixth active portion and the seventh active portion. The display panel further includes: a fourth conductive layer at side of the first conductive layer away from the base substrate, wherein the fourth conductive portion includes a first bridge portion, the first bridge portion is respectively connected to each of tenth active portions in a same pixel driving circuit, and the first bridge portion is connected to the first electrode of the light-emitting unit.

In an example embodiment of the present disclosure, the pixel driving sub-circuit further includes a first transistor, a second transistor and a seventh transistor. A first electrode of the first transistor is connected to a first initialization signal line, and a second electrode of the first transistor is connected to a gate electrode of the driving transistor; a first electrode of the second transistor is connected to the gate electrode of the driving transistor, and a second electrode of the second transistor is connected to a second electrode of the driving transistor; a first electrode of the seventh transistor is connected to a second initialization signal line, and a second electrode of the seventh transistor is connected to the first electrode of the light-emitting unit. The active layer further includes a first active portion and a second active portion; the first active portion is used to form a channel region of the first transistor; and the second active portion is used to form a channel region of the second transistor. The first conductive layer further includes a first reset signal line and a first gate line; an orthographic projection of the first reset signal line on the base substrate extends along the first direction, the orthographic projection of the first reset signal line on the base substrate covers an orthographic projection of the first active portion on the base substrate, and a partial structure of the first reset signal line is used to form a gate electrode of the first transistor. An orthographic projection of the first gate line on the base substrate extends along the first direction, the orthographic projection of the first gate line on the base substrate covers the orthographic projection of the second active portion on the base substrate, and a partial structure of the first gate line is used to form a gate electrode of the second transistor. The display panel further includes a second conductive layer, the second conductive layer is located at a side of the first conductive layer away from the base substrate, and the second conductive layer includes: a second initialization signal line, wherein an orthographic projection of a second initialization signal line for an adjacent previous row of pixel driving sub-circuits on the base substrate is located between an orthographic projection of a first reset signal line for a current row of pixel driving sub-circuits on the base substrate and an orthographic projection of a first gate line for the current row of pixel driving sub-circuits on the base substrate.

In an example embodiment of the present disclosure, the active layer further includes: an eleventh active portion connected between the first active portion and the second active portion. The second conductive layer further includes: a first protrusion connected to the second initialization signal line, wherein an orthographic projection of the first protrusion on the base substrate extends along the second direction, and the orthographic projection of the first protrusion on the base substrate at least partially overlaps with the orthographic projection of the eleventh active portion on the base substrate.

In an example embodiment of the present disclosure, the second transistor is a double-channel structure, the double channel of the second transistor includes a first channel and a second channel, and the second active portion includes a first active sub-portion and a second active sub-portion; The first active sub-portion is used to form the first channel of the second transistor; and the second active sub-portion is used to form the second channel of the second transistor. The active layer further includes: a third active sub-portion connected between the first active sub-portion and the second active sub-portion. The second conductive layer further includes: a second protrusion connected to the second initialization signal line, wherein an orthographic projection of the second protrusion on the base substrate extends along the second direction, and the orthographic projection of the second protrusion on the base substrate at least partially overlaps with an orthographic projection of the third active sub-portion on the base substrate.

In an example embodiment of the present disclosure, the pixel driving sub-circuits in the pixel driving circuit are distributed at least in the second direction. A pixel driving circuit further includes a first transistor, a second transistor, a fourth transistor, a fifth transistor, a sixth transistor, and a seventh transistor. A first electrode of the first transistor is connected to the first initialization signal line, and a second electrode of the first transistor is connected to the gate electrode of the driving transistor. A first electrode of the second transistor is connected to the gate electrode of the driving transistor, and a second electrode of the second transistor is connected to the second electrode of the driving transistor. A first electrode of the fourth transistor is connected to a data line, and a second electrode of the fourth transistor is connected to the first electrode of the driving transistor. A first electrode of the fifth transistor is connected to the first power line, and a second electrode of the fifth transistor is connected to the first electrode of the driving transistor. A first electrode of the sixth transistor is connected to the second electrode of the driving transistor, and a second electrode of the sixth transistor is connected to the first electrode of the light-emitting unit. A first electrode of the seventh transistor is connected to the first initialization signal line, and a second electrode of the seventh transistor is connected to the first electrode of the light-emitting unit. The first conductive layer further includes: a first reset signal line, a second reset signal line, a first gate line, and an enable signal line. An orthographic projection of the first reset signal line on the base substrate extends along the first direction, and a partial structure of the first reset signal line is used to form the gate electrode of the first transistor. An orthographic projection of the second reset signal line on the base substrate extends along the first direction, and a partial structure of the second reset signal line is used to form the gate electrode of the seventh transistor, and a first reset signal line for an adjacent next row of pixel driving sub-circuits is reused as a second reset signal line for the current row of pixel driving sub-circuits. An orthographic projection of the first gate line on the base substrate extends along the first direction, and a partial structure of the first gate line is used to form the gate electrodes of the second transistor and the fourth transistor respectively. An orthographic projection of the enable signal line on the base substrate extends along the first direction, and a partial structure of the enable signal line is used to form the gate electrodes of the fifth transistor and the sixth transistor respectively. The display panel includes a plurality of pixel units, a pixel unit includes a plurality of pixel driving circuits distributed in the first direction, the pixel driving circuits in the same pixel unit form a pixel driving circuit group, and the first direction is a row direction. A plurality of first reset signal lines include a first long reset signal line and a first short reset signal line. The first long reset signal line and the pixel driving sub-circuits located in the same row are arranged correspondingly. The first long reset signal line is connected to corresponding pixel driving sub-circuit(s). The first short reset signal line and pixel driving sub-circuit in the same row in a pixel driving circuit group are arranged correspondingly, and the first short reset signal line is connected to corresponding pixel driving sub-circuits, and orthographic projections of a plurality of first short reset signal lines corresponding to the pixel driving sub-circuits in the same row on the substrate are spaced apart in the row direction. A plurality of first gate lines include a first long gate line and a first short gate line. The first long gate line and pixel driving sub-circuits in the same row are arranged correspondingly, and the first long gate line is connected to corresponding pixel driving sub-circuit(s). The first short gate line and pixel driving sub-circuits in the same row in a pixel driving circuit group are arranged correspondingly, and the first short gate line is connected to corresponding pixel driving sub-circuit(s). Orthographic projections of a plurality of first short gate lines corresponding to the pixel driving sub-circuits in the same row on the base substrate are spaced apart in the row direction. A plurality of enable signal lines includes a long enable signal line and a short enable signal line. The long enable signal line and pixel driving sub-circuit(s) in the same row are arranged correspondingly, and the long enable signal line is connected to corresponding pixel driving sub-circuit(s). The short enable signal line and pixel driving sub-circuit(s) in the same row in a pixel driving circuit group are arranged correspondingly, and the short enable signal line is connected to corresponding pixel driving sub-circuit(s). Orthographic projections of a plurality of short enable signal lines corresponding to pixel driving sub-circuit(s) in the same row on the base substrate are spaced apart in the row direction. The display panel further includes a third conductive layer. The third conductive layer is at a side of the first conductive layer away from the base substrate. The third conductive layer includes a first connection line, a second connection line, and a third connection line. The orthographic projections of the first connection line, the second connection line and the third connection line on the base substrate extend along the second direction. The first connection line is connected to the first long reset signal line and the first short reset signal line through via holes respectively. The second connection line is connected to the first long gate line and the first short gate line through via holes respectively. The third connection line is connected to the long enable signal line and short enable signal line through via holes respectively.

In an example embodiment of the present disclosure, the display panel further includes a second conductive layer. The second conductive layer is between the first conductive layer and the third conductive layer. The second conductive layer includes the first initialization signal line and the second initialization signal line. Orthographic projections of the first initialization signal line and the second initialization signal line on the substrate extend along the first direction. A plurality of first initialization signal lines include a first long initialization signal line and a first short initialization signal line. The first long initialization signal line and pixel driving sub-circuit(s) the same row are arranged correspondingly. The long initialization signal line is connected to corresponding pixel driving sub-circuit(s). The first short initialization signal line and pixel driving sub-circuit(s) in the same row in a pixel driving circuit group are arranged correspondingly. The first short initialization signal line is connected to corresponding pixel driving sub0circuit(s). Orthographic projections of a plurality of first short initialization signal lines corresponding pixel driving sub-circuit(s) in the same row on the base substrate are spaced apart in the row direction. A plurality of second initialization signal line include a second long initialization signal line and a second short initialization signal line. The second long initialization signal line and pixel driving sub-circuit(s) in the same row are arranged correspondingly. The second long initialization signal line is connected to corresponding pixel driving sub-circuit(s). The second short initialization signal line and pixel driving sub-circuit(s) in the same row in a pixel driving circuit group are arranged correspondingly. The second short initialization signal line is connected to corresponding pixel driving sub-circuit(s). Orthographic projections of a plurality of second short initialization signal lines corresponding to pixel driving sub-circuits in the same row on the base substrate are spaced apart in the row direction. The third conductive layer further includes a fourth connection line and a fifth connection line. The fourth connection line is connected to the first long initialization signal line and the first short initialization signal line through via holes respectively. The fifth connection line is connected to the second long initialization signal line and the second short initialization signal line through via holes respectively.

In an example embodiment of the present disclosure, the pixel driving circuit further includes a first transistor and a seventh transistor. A first electrode of the first transistor is connected to a first initialization signal line, a second electrode of the first transistor is connected to the gate electrode of the driving transistor. A first electrode of the seventh transistor is connected to a second initialization signal line, and a second electrode of the seventh transistor is connected to the first electrode of the light-emitting unit. The display panel further includes: a second conductive layer and a third conductive layer. The second conductive layer is at a side of the active layer away from the base substrate, and the second conductive layer includes the first initialization signal line and the second initialization signal line. An orthographic projection of the first initialization signal line on the base substrate and an orthographic projection of the second initialization signal line on the base substrate extend along the first direction. The third conductive layer is at a side of the second conductive layer away from the base substrate. The third conductive layer includes a first initialization connection line and a second initialization connection line. An orthographic projection of the first initialization connection line on the base substrate and an orthographic projection of the second initialization connection line on the base substrate extend along the second direction, and the first direction intersects the second direction intersect. The first initialization connection line is connected, through a via hole, to a first initialization signal line whose orthographic projection on the base substrate intersects the first initialization connection line. The second initialization connection line is connected, through a via hole, to a second initialization signal line whose orthographic projection on the base substrate intersects the orthographic projection of the second initialization connection line on the base substrate.

In an example embodiment of the present disclosure, the display panel includes a plurality of pixel units. A pixel unit include a plurality of pixel driving circuits distributed in the first direction. Pixel driving circuits in the same pixel unit form a pixel driving circuit group. For a column of pixel driving circuit groups distributed in the second direction, a first initialization connection line and a second initialization connection line are arranged correspondingly, and the orthographic projections of the pixel driving circuit groups on the base substrate are located between the orthographic projections of the corresponding first and initialization connection lines on the base substrate.

In an example embodiment of the present disclosure, a display region of the display panel includes a normal display region, and the display panel further includes a plurality of pixel units. The plurality of pixel units include a first pixel unit. The first pixel unit is located in the normal display region. The first pixel unit includes a plurality of pixel driving circuits distributed in the first direction. Pixel driving circuits in the same first pixel unit form a first pixel driving circuit group. The display panel further includes a fourth conductive layer at a side of the active layer away from the base substrate, wherein the fourth conductive layer includes a first power connection line, the first power connection line is used to provide a high-level power signal to the pixel driving circuit, and an orthographic projection of the first power connection line on the base substrate is a ring. The first power connection line and the first pixel driving circuit group are arranged correspondingly, and an orthographic projection of the first pixel driving circuit group on the base substrate is located within an orthographic projection of the corresponding first power connection line on the base substrate.

In an example embodiment of the present disclosure, the display panel further includes: a third conductive layer between the active layer and the fourth conductive layer, wherein the third conductive layer includes a power bridge line, and an orthographic projection of the power bridge line on the base substrate extends along a second direction, and the first direction intersects the second direction. An orthographic projection of at least part of a structure of the power bridge line on the base substrate is located between orthographic projections of two first power connection lines which are adjacent in the first direction on the base substrate, and the power bridge line is connected, through via holes, to the two first power connection lines which are adjacent to the power bridge line.

In an example embodiment of the present disclosure, the pixel driving circuit includes a fifth transistor, a first electrode of the fifth transistor is connected to the first power line, and a second electrode of the fifth transistor is connected to the first electrode of the driving transistor. The display panel further includes: a third conductive layer between the active layer and the fourth conductive layer, wherein the third conductive layer includes a first power line. An orthographic projection of the first power line on the base substrate extends along the second direction the first direction intersects the second direction. The orthographic projection of the first power line on the base substrate intersects an orthographic projection of a first power connection line on the base substrate, and the first power line is connected through a via hole to the first power connection line whose orthographic projection on the base substrate intersects the orthographic projection of the first power line on the base substrate.

In an example embodiment of the present disclosure, the pixel driving circuit includes a plurality of pixel driving sub-circuits, and orthographic projections of the plurality of pixel driving sub-circuits on the base substrate are distributed in an array along a first direction and/or a second direction, and the first direction intersects the second direction;

wherein each of the plurality of pixel driving sub-circuits includes the driving transistor, each of the plurality of pixel driving sub-circuits is connected to a same light-emitting unit, and each of the plurality of pixel driving sub-circuits is used to provide a driving current to the light-emitting unit;

wherein the pixel driving sub-circuit further includes a fifth transistor, a first electrode of the fifth transistor is connected to a first power line sub-portion, and a second electrode of the fifth transistor is connected to a first electrode of the driving transistor;

wherein the fourth conductive layer further includes the first power line sub-portion, an orthographic projection of the first power line sub-portion on the base substrate includes a portion extending along the second direction and a portion extending along the first direction, the first power line sub-portion and the pixel driving circuit are arranged correspondingly, the first power line sub-portion is connected to the first electrode of the fifth transistor in a corresponding pixel driving circuit, and the first power line sub-portion is connected to the first power connection line.

In an example embodiment of the present disclosure, the pixel driving sub-circuit further includes a second transistor, a first electrode of the second transistor is connected to the gate electrode of the driving transistor, and a second electrode of the second transistor is connected to the second electrode of the driving transistor;

wherein the display panel further includes:

a third conductive layer between the active layer and the fourth conductive layer, wherein the third conductive layer includes a second bridge portion, and the second bridge portion is connected to the gate electrode of the driving transistor and the second electrode of the second transistor;

wherein the first power line sub-portion includes:

a plurality of second conductive portions, wherein the second conductive portions are arranged correspondingly to the pixel driving sub-circuits, and orthographic projections of the second conductive portions on the base substrate at least partially overlap with orthographic projections of second bridge portions of corresponding pixel driving sub-circuits on the base substrate, and the second conductive portion is connected to the first electrode of the fifth transistor in a corresponding pixel driving sub-circuit.

In an example embodiment of the present disclosure, the fourth conductive layer further includes:

a first connection portion, wherein an orthographic projection of the first connection portion on the base substrate extends along the second direction, and the first connection portion is connected to a second conductive portion and a first power connection line which are adjacent in the second direction.

In an example embodiment of the present disclosure, the display panel further includes a third conductive layer. The third conductive layer further includes a plurality of third bridge portions. An orthographic projection of at least a part of a structure of a third bridge portion on the base substrate is located between orthographic projections of two first power connection lines which are adjacent in the second direction on the base substrate, and the third bridge portion is connected, through via holes, to the two first power connection lines which are adjacent to the third bridge portion.

In an example embodiment of the present disclosure, the fourth conductive layer further includes a second power connection line. The second power connection line and the first power connection are arranged correspondingly. An orthographic projection of the second power connection line on the base substrate is a ring shape. An orthographic projection of the first power connection line on the base substrate is located within an orthographic projection of a corresponding second power connection line on the base substrate. The display panel further includes: a common electrode layer at a side of the fourth conductive layer away from the base substrate, wherein the common electrode layer is used to form a second electrode of the light-emitting unit, and the second power connection line is connected to the common electrode layer through a via hole.

In an example embodiment of the present disclosure, a display region of the display panel further includes a compression region, and the compression region is located at a side of the normal display region in a first direction. A plurality of pixel units further include a second pixel unit. The second pixel unit is located in the compression region, the second pixel unit includes a plurality of pixel driving circuits distributed in the first direction, and pixel driving circuits in a same second pixel unit form a second pixel driving circuit group. The fourth conductive layer further includes: a third power connection line, wherein the third power connection line is used to provide a high-level power signal to the pixel driving circuits, the third power connection line and a second pixel driving circuit group are arranged correspondingly, the third power connection line includes a first side, an orthographic projection of the first side on the base substrate extends along a second direction and is located at a side of an orthographic projection of a corresponding second pixel driving circuit group on the base substrate in a first direction, and the first direction intersects the second direction. A distance in the first direction between the orthographic projection of the first power connection line on the base substrate and the orthographic projection of the first pixel driving circuit group on the base substrate is greater than a distance in the first direction between the orthographic projection of the first side on the base substrate and the orthographic projection of the second pixel driving circuit group on the base substrate.

In an example embodiment of the present disclosure, the fourth conductive layer further includes a second power connection line and a fourth power connection line. The second power connection line and the first power connection line are arranged correspondingly. An orthographic projection of the second power connection line on the base substrate is a ring shape. The orthographic projection of the first power connection line on the base substrate is located within the orthographic projection of a corresponding second power connection line on the base substrate. The fourth power connection line and the third power connection line are arranged correspondingly. The display panel further includes: a common electrode layer at a side of the fourth conductive layer away from the base substrate, wherein the common electrode layer is used to form a second electrode of the light-emitting unit, and the second power connection line and the fourth power connection line are connected to the common electrode layer through via holes. The display panel further includes an electrode layer between the fourth conductive layer and the common electrode layer, wherein the electrode layer includes a first electrode ring and a second electrode line. The first electrode ring is connected between the second power connection line and the common electrode layer, an orthographic projection of the first electrode ring on the base substrate is a ring shape, and the orthographic projection of the first power connection line on the base substrate is located within the orthographic projection of the first electrode ring on the base substrate. The second electrode line is connected between the fourth power connection line and the common electrode layer, the second electrode line includes a second side, and an orthographic projection of at least a part of a structure of the second side on the base substrate is located at a side of orthographic projection of the first side on the base substrate away from the orthographic projection of the second pixel driving circuit group on the base substrate. A distance in the first direction between the orthographic projection of the first side on the base substrate and the orthographic projection of the second side on the base substrate is smaller than a distance in the first direction between the orthographic projection of the first power connection line on the base substrate and the orthographic projection of the first electrode ring on the base substrate.

According to an aspect of the present disclosure, there is provided a display device, wherein the display device includes the display panel described above.

It should be understood that the foregoing general description and the following detailed description are exemplary and explanatory only, and do not limit the present disclosure.

BRIEF DESCRIPTION OF THE DRAWINGS

The accompanying drawings, which are incorporated in and constitute a part of the specification, illustrate embodiments consistent with the present disclosure and together with the specification, serve to explain the principles of the present disclosure. Obviously, the drawings in the following description are only some embodiments of the present disclosure. For those of ordinary skill in the art, other drawings can be obtained based on these drawings without exerting creative efforts.

FIG. 19 is a structural layout of the active layer and the first conductive layer in

FIG. 12;

DETAILED DESCRIPTION

Figure 1:
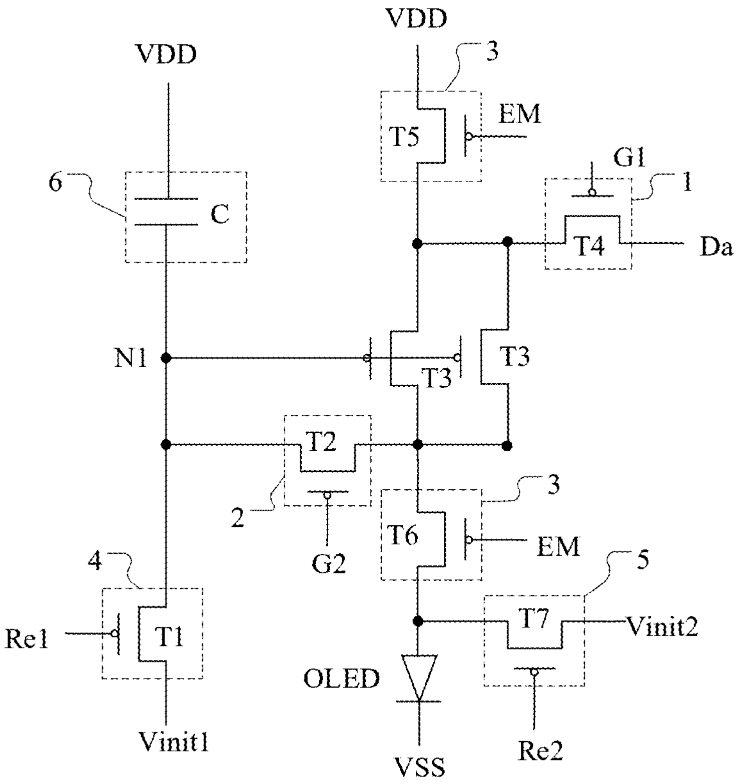
FIG. 1 is a schematic structural diagram of a pixel driving circuit according to an example embodiment of the present disclosure.

Example embodiments will now be described more fully with reference to the accompanying drawings. Example embodiments may, however, be embodied in various forms and should not be construed as being limited to the examples set forth herein; rather, these embodiments are provided so that the present disclosure will be thorough and complete and will fully convey the concepts of the example embodiments to those skilled in the art. The same reference numerals in the drawings indicate the same or similar structures, and thus their detailed descriptions will be omitted.

The words "one", "a/an", and "the/said" are used to indicate the presence of one or more elements/components/etc.; the terms "comprising/comprises/comprise" and "having/has/have" are used to indicate an open-ended inclusion, and means that there may be additional elements/components/etc. in addition to the listed elements/components/etc.

In related art, a pixel driving circuit usually includes a driving transistor, and the driving transistor provides a driving current to a light-emitting unit according to a data signal at a gate electrode of the driving transistor. However, Data Range (the voltage range of the data signal) is limited by a chip of a display panel, resulting in the pixel driving circuit being unable to output a large driving current.

In view of the above, an example embodiment provides a pixel driving circuit. The pixel driving circuit may include a plurality of driving transistors. A second electrode of each driving transistor is connected to a first electrode of the same light-emitting unit. Each driving transistor is used to input a driving current to the light-emitting unit according to a voltage at a gate electrode of the driving transistor.

The pixel driving circuit provided in this example embodiment provides a driving current to the same light-emitting unit through a plurality of driving transistors connected in parallel, so that a larger driving current can be provided to the light-emitting unit under the action of the same data signal. The pixel driving circuit can be applied to a display panel and a display device which have a large pixel unit layout area and requires a large driving current. For example, the pixel driving circuit can be applied to a spliced screen.

As shown in FIG. 1, it is a schematic structural diagram of a pixel driving circuit according to an example of the present disclosure. The pixel driving circuit includes a plurality of driving transistors T3. A second electrode of each driving transistor T3 is connected to a first electrode of the same light-emitting unit OLED. Each driving transistor T3 is used to input a driving current to the light-emitting unit OLED according to a voltage at a gate electrode of the driving transistor. As shown in FIG. 1, the gate electrode of each driving transistor T3 is connected to a first node N1, and a first electrode of each driving transistor T3 is connected to a first power terminal VDD.

In the example embodiment, the second electrodes of the driving transistors T3 are all connected to the first electrode of the same light-emitting unit OLED, and the "connection" may be understood as electrical connection, electrical coupling, etc., and the "connection" may be a direct connection or an indirect connection.

As shown in FIG. 1, the pixel driving circuit further includes: a data writing circuit 1, a compensation circuit 2, a light-emitting control circuit 3, a first reset circuit 4, a second reset circuit 5, and a storage circuit 6. The data writing circuit 1 is connected to a data signal terminal Da, the first electrode of each driving transistor T3 and a first gate driving signal terminal G1, and is configured to transmit a signal of the data signal terminal Da to the first electrode of each driving transistor T3 in response to a signal of the first gate driving signal terminal G1. The compensation circuit 2 is connected to the first node N1, the second electrode of each driving transistor T3 and a second gate driving signal terminal G2, and is configured to create connectivity between the first node N1 and the second electrode of each driving transistor T3 in response to a signal of the second gate driving signal terminal G1. The light-emitting control circuit 3 is connected to the first power terminal VDD, the first electrode of each driving transistor T3, an enable signal terminal EM, the second electrode of each driving transistor T3 and the first electrode of the light-emitting unit OLED, and is configured to create connectivity between the first power terminal VDD and the first electrode of each driving transistor T3 in response to a signal of the enable signal terminal EM, and is configured to create connectivity between the second electrode of each driving transistor T3 and the first electrode of the light-emitting unit OLED in response to the signal of the enable signal terminal EM. The first reset circuit 4 is connected to a first initialization signal terminal Vinit1, a first reset signal terminal Re1 and the first node N1, and is configured to transmit a signal of the first initialization signal terminal Vinit1 to the first node N1 in response to a signal of the first reset signal terminal Re1. The second reset circuit 5 is connected to a second initialization signal terminal Vinit2, a second reset signal terminal Re2, and the first electrode of the light-emitting unit OLED, and is configured to transmit a signal of the second initialization signal terminal Vinit2 to the first electrode of the light-emitting unit OLED in response to a signal of the second reset signal terminal Re2. The storage circuit 6 is connected between the first node Nl and the first power terminal VDD.

In an example embodiment, the first gate driving signal terminal G1 and the second gate driving signal terminal G2 may be the same signal control terminal, or may be different signal control terminals. For example, the turn-on time of the second gate driving signal terminal G2 is longer than the turn-on time of the first gate driving signal terminal G1, so that the data signal controlled under the first gate driving signal terminal G1 can be fully written into the gate electrode of the driving transistor. For another example, the first gate driving signal terminal G1 and the second gate driving signal terminal G2 are a same control signal terminal to save control signal lines. A situation where the first gate driving signal terminal G1 and the second gate driving signal terminal G2 are a same control signal terminal (that is, the compensation circuit 2 is controlled by the first gate driving signal terminal G1) is used as an example to describe the following embodiments.

As shown in FIG. 1, the data writing circuit 1 may include a fourth transistor T4. A first electrode of the fourth transistor T4 is connected to the data signal terminal Da, a second electrode of the fourth transistor T4 is connected to the first electrode of each driving transistor T3, and a gate electrode of the fourth transistor T4 is connected to the first gate driving signal terminal G1. The compensation circuit 2 may include a second transistor T2. A first electrode of the second transistor T2 is connected to the first node N1, a second electrode of the second transistor T2 is connected to the second electrode of each driving transistor T3, and a gate electrode of the second transistor T2 is connected to the first gate driving signal terminal G1. The light-emitting control circuit 3 may include a fifth transistor T5 and a sixth transistor T6. A first electrode of the fifth transistor T5 is connected to the first power terminal VDD, a second electrode of the fifth transistor T5 is connected to the first electrode of each driving transistor T3, and a gate electrode of the fifth transistor T5 is connected to the enable signal terminal EM. A first electrode of the sixth transistor T6 is connected to the second electrode of each driving transistor T3, a second electrode of the sixth transistor T6 is connected to the first electrode of the light-emitting unit OLED, and a gate electrode of the sixth transistor T6 is connected to the enable signal terminal EM. The first reset circuit 4 may include a first transistor T1. A first electrode of the first transistor T1 is connected to the first initialization signal terminal Vinit1, a second electrode of the first transistor T1 is connected to the first node N1, and a gate electrode of the first transistor T1 is connected to the first reset signal terminal Re1. The second reset circuit 5 may include a seventh transistor T7. A first electrode of the seventh transistor T7 is connected to the second initialization signal terminal Vinit2, a second electrode of the seventh transistor T7 is connected to the first electrode of the light-emitting unit OLED, and a gate electrode of the seventh transistor T7 is connected to the second reset signal terminal Re2. The storage circuit 6 may include a capacitor C. A first electrode of the capacitor C is connected to the first node N1, and a second electrode of the capacitor C is connected to the first power terminal VDD. The second electrode of the light-emitting unit OLED is connected to a second power terminal VSS.

The first transistor T1, the second transistor T2, the driving transistors T3, the fourth transistor T4, the fifth transistor T5, the sixth transistor T6 and the seventh transistor T7 may be P-type transistors. The first power terminal VDD may be a high-level power terminal, and the second power terminal VSS may be a low-level power terminal.

Figure 2:
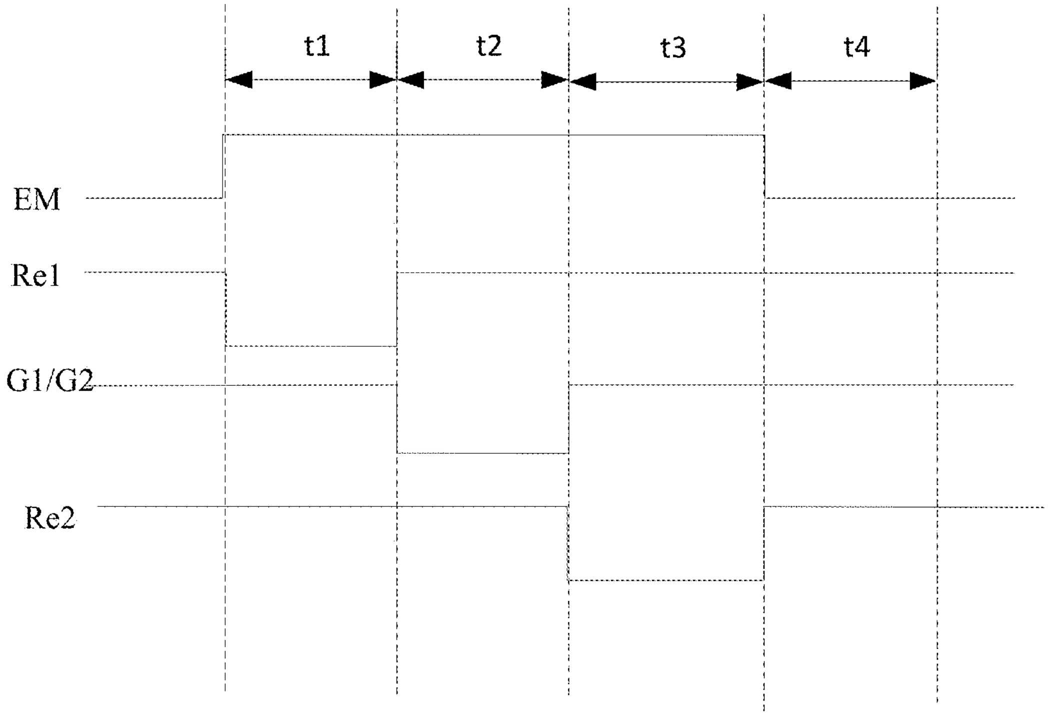
FIG. 2 is a timing diagram of respective control signals in a driving method of the pixel driving circuit shown in FIG. 1.

As shown in FIG. 2, it is a timing diagram of respective control signals in a driving method of the pixel driving circuit shown in FIG. 1. In this figure, G1 represents the timing of a signal at the first gate driving signal terminal G1, Re1 represents the timing of a Re1 signal at the first reset signal terminal R1, Re2 represents the timing of a signal at the second reset signal terminal Re2, and EM represents the timing of a signal at the enable signal terminal EM. The driving method of the pixel driving circuit may include a first reset stage t1, a data writing stage t2, a second reset stage t3, and a light-emitting stage t4. In the first reset stage t1: the first reset signal terminal Re1 outputs a low-level signal, the first transistor T1 is turned on, and the first initialization signal terminal Vinit1 inputs a first initialization signal to the first node N1. In the data writing stage t2: the first gate driving signal terminal G1 outputs a low-level signal, the fourth transistor T4 and the second transistor T2 are turned on, and at the same time the data signal terminal Da outputs a data signal to write a voltage of Vdata+Vth to the first node N1, where Vdata is the voltage of the data signal, and Vth is the threshold voltage of each driving transistor T3. In the second reset stage t3: the second reset signal terminal outputs a low-level signal, the seventh transistor is turned on, and the second initialization signal terminal Vinit2 inputs a second initialization signal to the second electrode of the sixth transistor T6. In the light-emitting stage t4: the enable signal terminal EM outputs a low-level signal, the sixth transistor T6 and the fifth transistor T5 are turned on, and the multiple driving transistors T3 drive the light-emitting unit to emit light under the action of the voltage Vdata+Vth of the first node N1. The output current of each driving transistor in the pixel driving circuit of the present disclosure is $I=(\mu WCox/2L)(Vdata+Vth-Vdd-Vth)^2$, where: μ is the carrier mobility; Cox is the gate capacitance per unit area, W is the width of the driving transistor channel, L is the length of the driving transistor channel, Vgs is the gate-source voltage difference of the driving transistor, and Vth is the threshold voltage of the driving transistor. The pixel driving circuit can avoid the influence of the driving transistor threshold on its output current. It should be understood that in other example embodiments, the pixel driving circuit may also have other driving methods. For example, the seventh transistor may be turned on during the data writing stage t2.

An example embodiment provides a display panel, which may include a base substrate, an active layer, a first conductive layer, a second conductive layer, a third conductive layer, and a fourth conductive layer that are stacked in sequence. An insulating layer may be provided between adjacent conductive layers.

Figure 3:
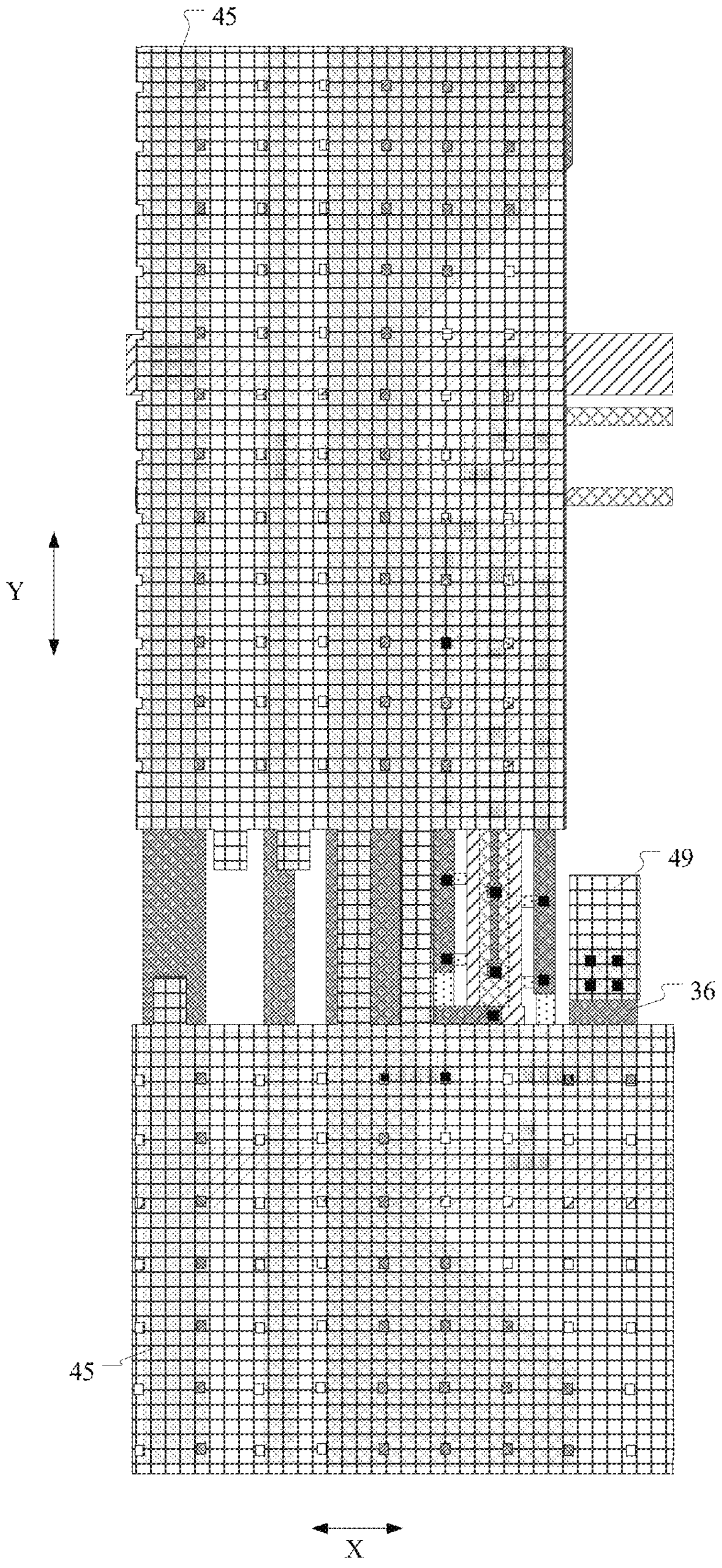
FIG. 3 is a structural layout of a display panel according to an example embodiment of the present disclosure.
Figure 4:
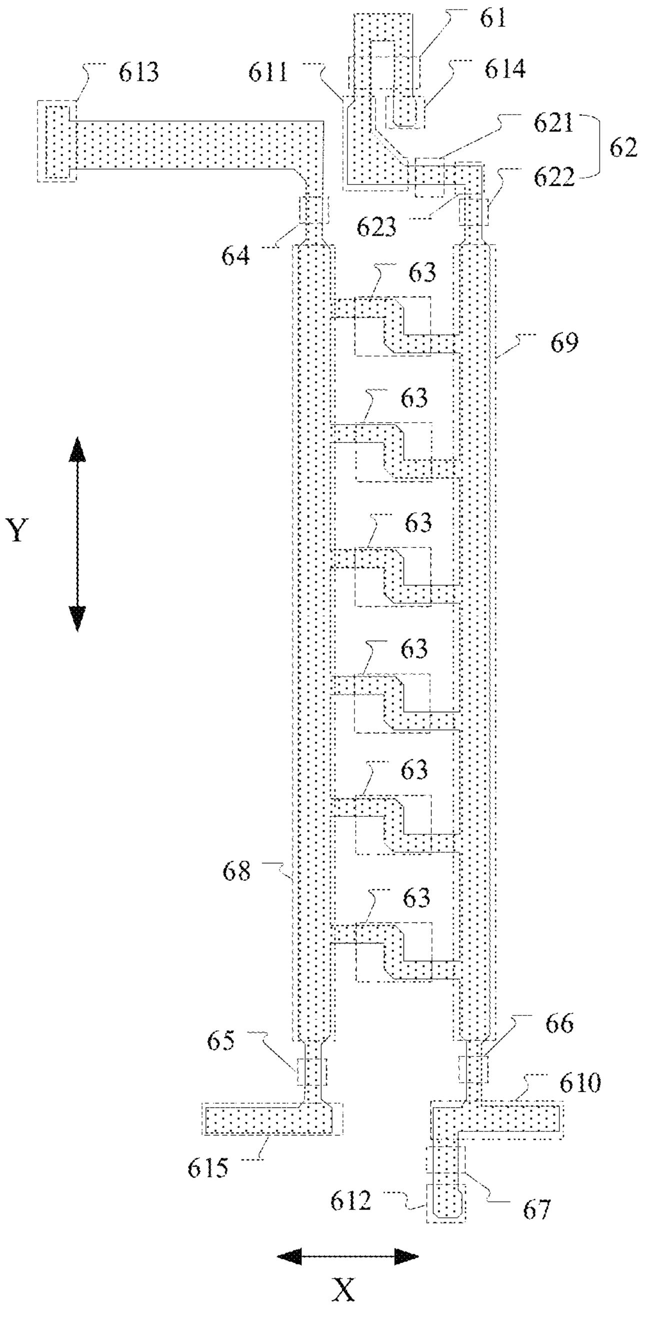
FIG. 4 is a structural layout of an active layer in FIG. 3.
Figure 5:
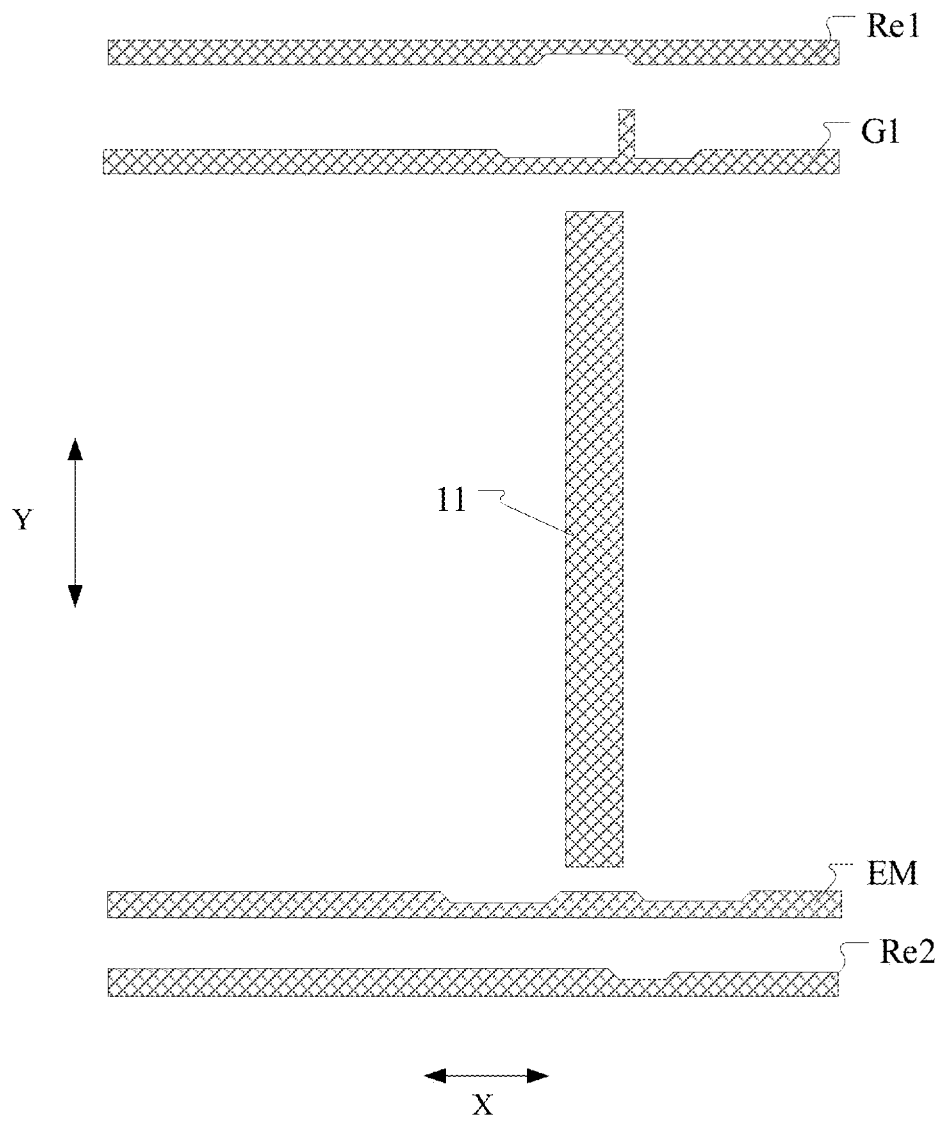
FIG. 5 is a structural layout of a first conductive layer in FIG. 3.
Figure 6:
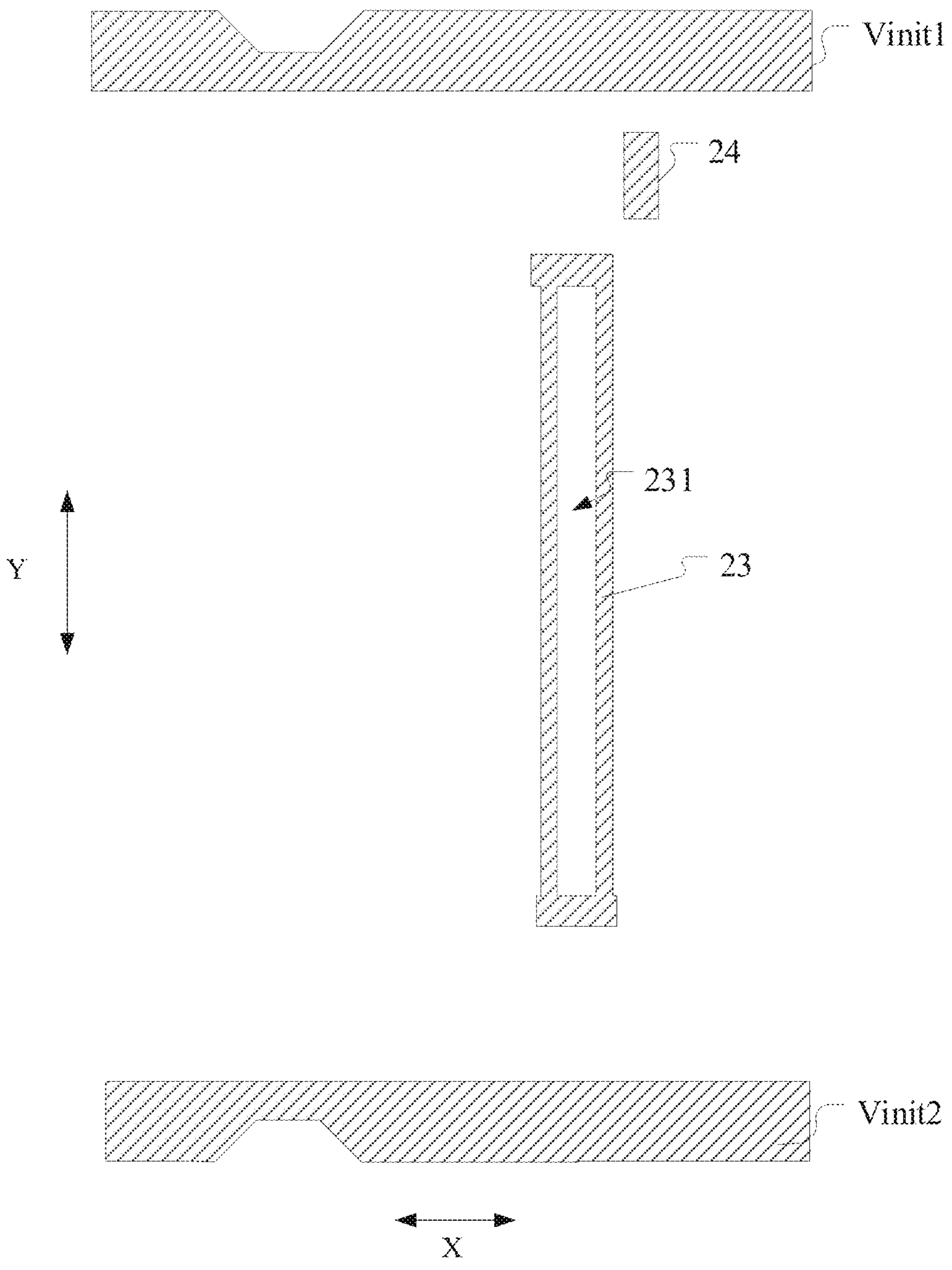
FIG. 6 is a structural layout of a second conductive layer in FIG. 3.
Figure 7:
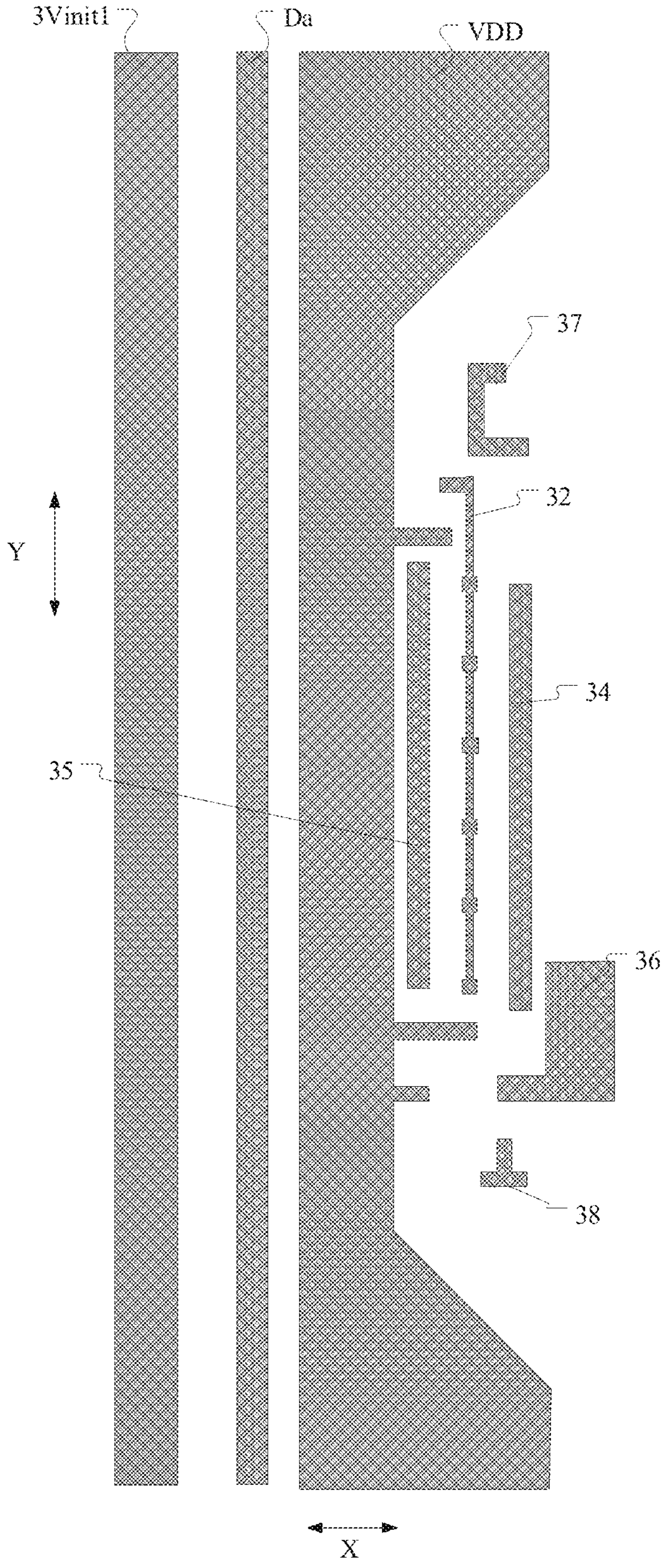
FIG. 7 is a structural layout of a third conductive layer in FIG. 3.
Figure 8:
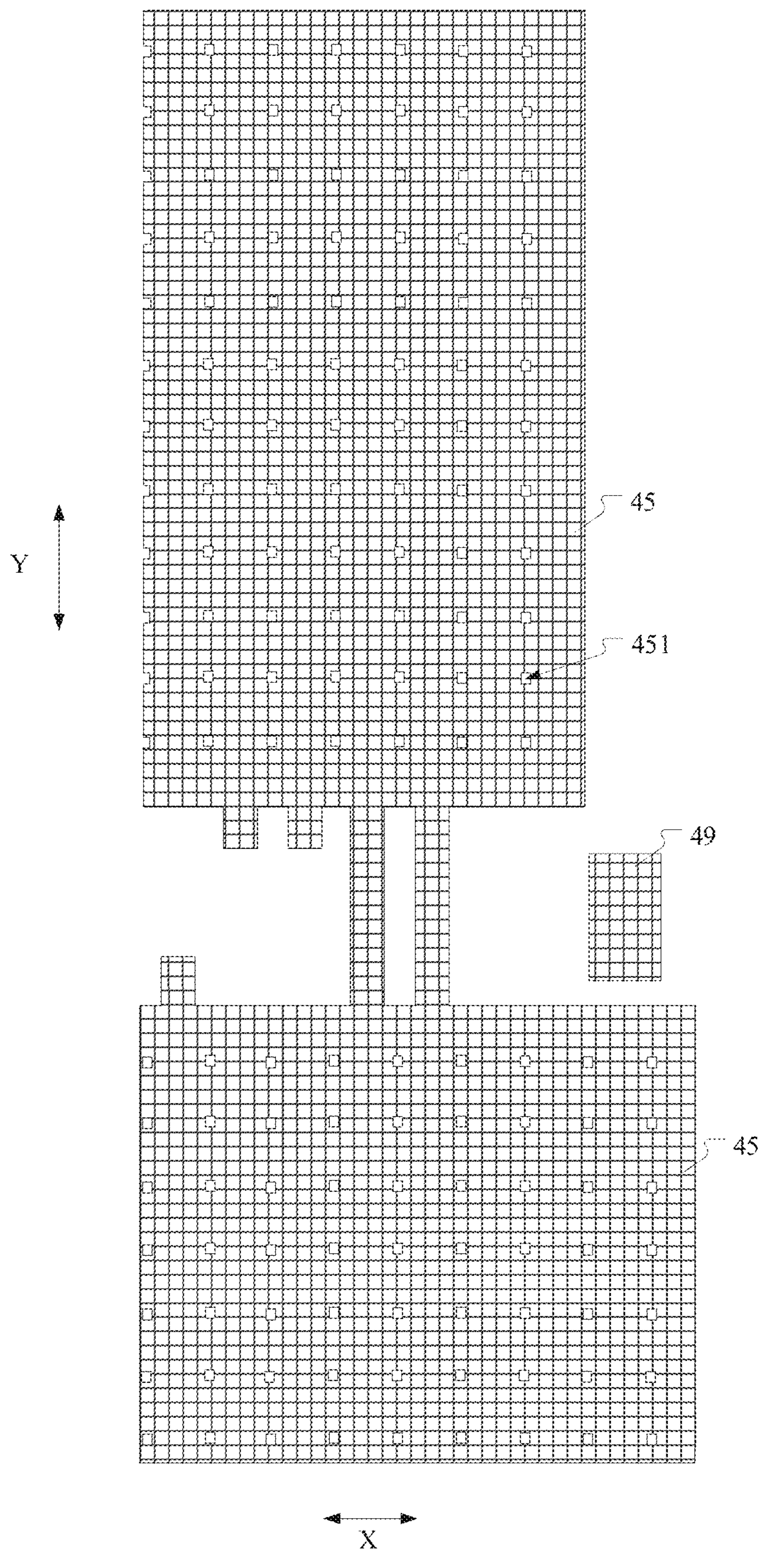
FIG. 8 is a structural layout of a fourth conductive layer in FIG. 3.
Figure 9:
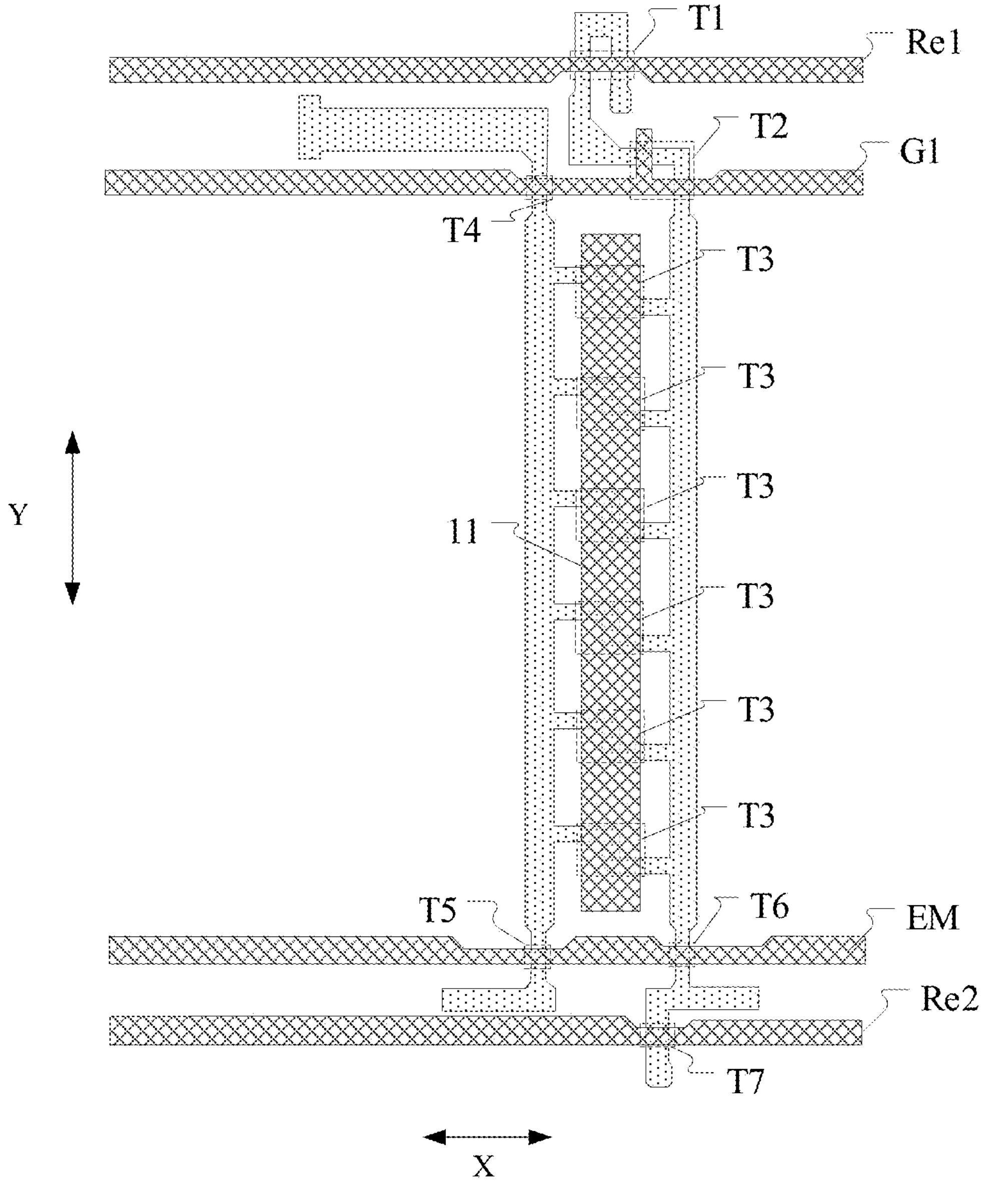
FIG. 9 is a structural layout of the active layer and the first conductive layer in FIG. 3.
Figure 10:
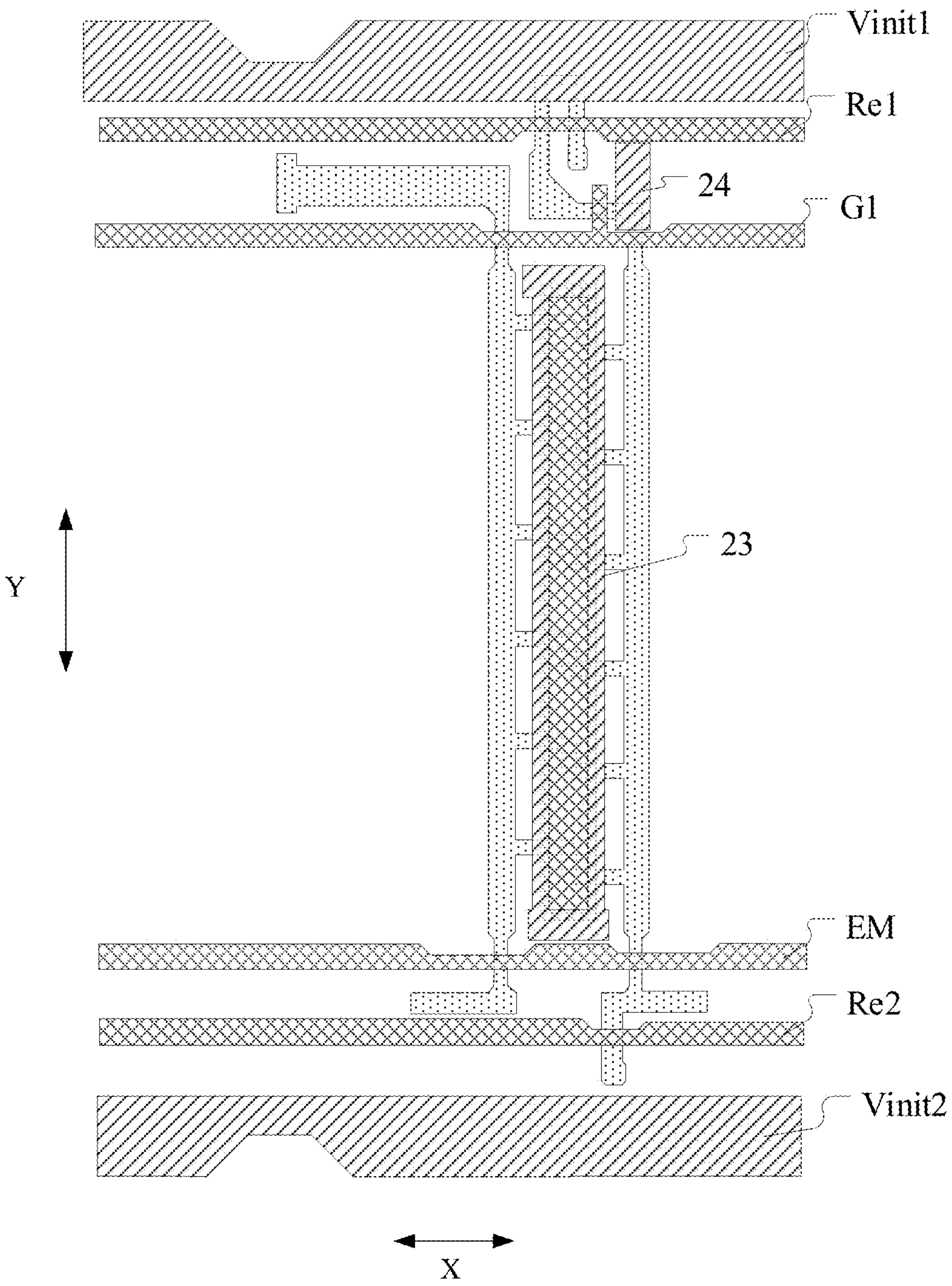
FIG. 10 is a structural layout of the active layer, the first conductive layer, and the second conductive layer in FIG. 3.
Figure 11:
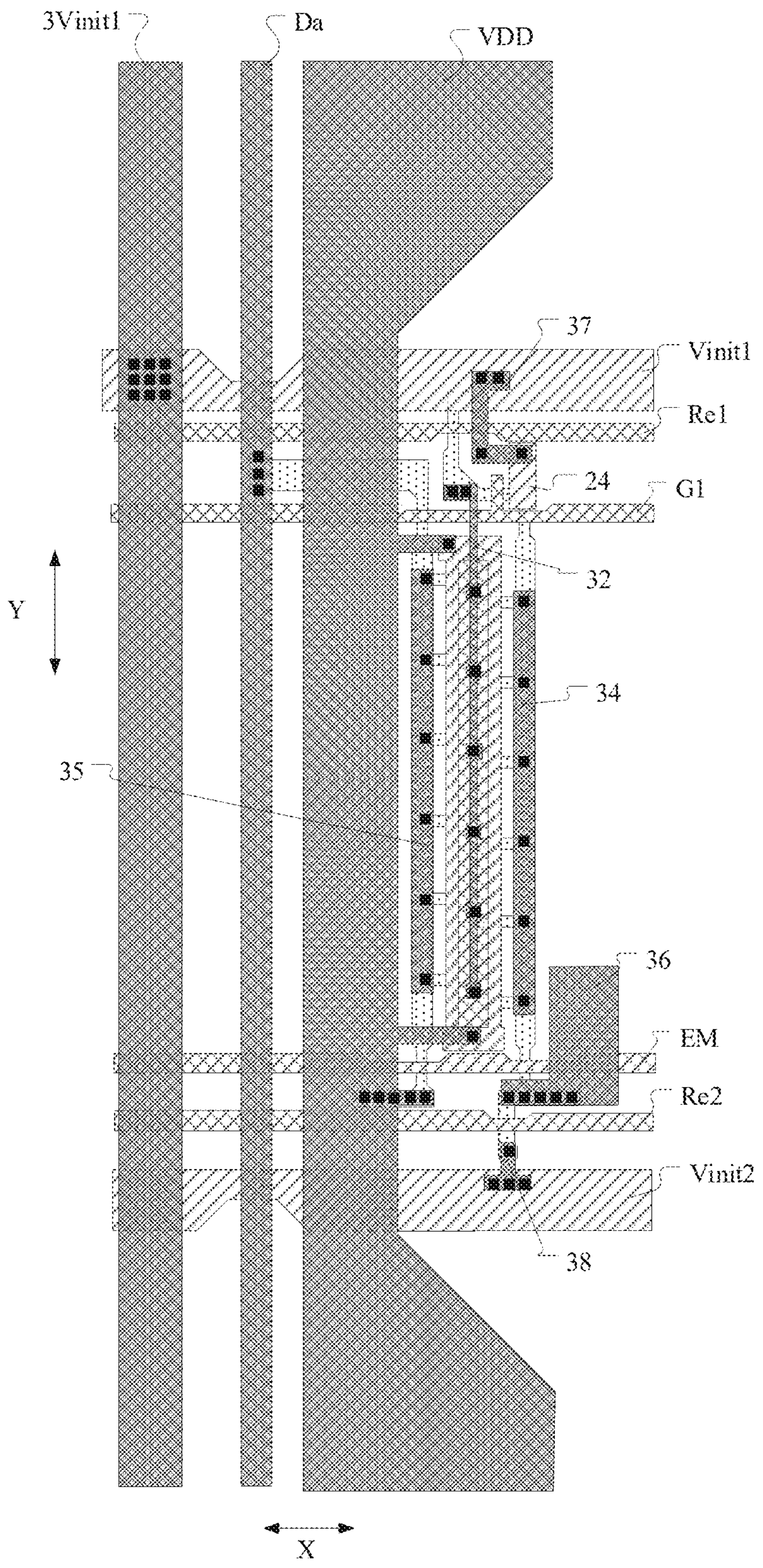
FIG. 11 is a structural layout of the active layer, the first conductive layer, the second conductive layer, and the third conductive layer in FIG. 3.

As shown in FIGS. 3 to 11, FIG. 3 is a structural layout of a display panel according to an example embodiment of the present disclosure. FIG. 4 is a structural layout of an active layer in FIG. 3. FIG. 5 is a structural layout of a first conductive layer in FIG. 3. FIG. 6 is a structural layout of a second conductive layer in FIG. 3. FIG. 7 is a structural layout of a third conductive layer in FIG. 3. FIG. 8 is a structural layout of a fourth conductive layer in FIG. 3. FIG. 9 is a structural layout of the active layer and the first conductive layer in FIG. 3. FIG. 10 is a structural layout of the active layer, the first conductive layer and the second conductive layer in FIG. 3. FIG. 11 is a structural layout of the active layer, the first conductive layer, the second conductive layer, and the third conductive layer. The display panel may include a plurality of pixel driving circuits. The only difference between the structure of the pixel driving circuit in the display panel shown in FIG. 3 and the structure of the pixel driving circuit shown in FIG. 1 is that the pixel driving circuit in the display panel shown in FIG. 3 includes six driving transistors connected in parallel.

As shown in FIGS. 3, 4 and 9, the active layer may include a first active portion 61, a second active portion 62, a plurality of third active portions 63, a fourth active portion 64, a fifth active portion 65, a sixth active portion 66, a seventh active portion 67, an eighth active portion 68, a ninth active portion 69, a tenth active portion 610, an eleventh active portion 611, a twelfth active portion 612, a thirteenth active portion 613, a fourteenth active portion 614, and a fifteenth active portion 615. The first active portion 61 is used to form a channel region of the first transistor T1. The second active portion 62 is used to form a channel region of the second transistor T2. The second transistor T2 is a dual-channel structure, the second active portion 62 includes a first active sub-portion 621 and a second active sub-portion 622. The first active sub-portion 621 is used to form a first channel of the second transistor, and the second active sub-portion 622 is used to form a second channel of the second transistor T2. The active layer also includes a third active sub-portion 623 and the third active sub-portion 623 is connected between the first active sub-portion 621 and the second active sub-portion 622. The third active portions 63 may be used to form channel regions of the driving transistors T3. The fourth active portion 64 may be used to form a channel region of the fourth transistor T4. The fifth active portion 65 may be used to form a channel region of the fifth transistor T5. The sixth active portion 66 may be used to form a channel region of the sixth transistor T6. The seventh active portion 67 may be used to form a channel region of the seventh transistor T7. Orthographic projections of the eighth active portion 68 and the ninth active portion 69 on the base substrate extend along a second direction Y. The eighth active portion 68 is connected between the fourth active portion 64 and the fifth active portion 65. The ninth active portion 69 is connected between the sixth active portion 66 and the second active portion 62. The plurality of third active portions 63 are connected in parallel between the eighth active portion 68 and the ninth active portion 69. The tenth active portion 610 is connected between the sixth active portion 66 and the seventh active portion 67. The eleventh active portion 611 is connected between the first active portion 61 and the second active portion 62. The twelfth active portion 612 is connected to an end of the seventh active portion 67 away from the sixth active portion 66. The thirteenth active portion 613 is connected to an end of the fourth active portion 64 away from the third active portion 63. The fourteenth active portion 614 is connected to an end of the first active portion 61 away from the second active portion 62. The fifteenth active portion 615 is connected to an end of the fifth active portion 65 away from the fourth active portion 64. The active layer may be formed of a polysilicon material, and accordingly, the first transistor T1, the second transistor T2, the driving transistors T3, the fourth transistor T4, the fifth transistor T5, the sixth transistor T6, and the seventh transistor T7 may be P-type low temperature polysilicon thin film transistors.

As shown in FIGS. 3, 5 and 9, the first conductive layer may include: a first conductive portion 11, a first gate line G1, an enable signal line EM, a first reset signal line Re1 and a second reset signal line Re2. An orthographic projection of the first gate line G1 on the base substrate, an orthographic projection of the enable signal line EM on the base substrate, an orthographic projection of the first reset signal line Re1 on the base substrate and an orthographic projection of the second reset signal line Re2 on the base substrate may all extend along a first direction X. The first direction X may intersect the second direction Y. For example, the first direction X may be a row direction, and the second direction Y may be a column direction. The first gate line G1 may be used to provide the first gate driving signal terminal. The enable signal line EM may be used to provide the enable signal terminal. The first reset signal line Re1 may be used to provide the first reset signal terminal. The second reset signal line Re2 may be used to provide the second reset signal terminal. The orthographic projection of the first gate line G1 on the base substrate covers orthographic projections of the second active portion 62 and the fourth active portion 64 on the base substrate, and a partial structure of the first gate line G1 is used to form the gate electrode of the second transistor T2 and the gate electrode of the fourth transistor, respectively. The orthographic projection of the enable signal line EM on the base substrate covers the orthographic projection of the fifth active portion 65 on the base substrate and the orthographic projection of the sixth active portion 66 on the base substrate, and a partial structure of the enable signal line EM may be used to form the gate electrodes of the fifth transistor T5 and the sixth transistor T6, respectively. The orthographic projection of the first reset signal line Re1 on the base substrate covers an orthographic projection of the first active portion 61 on the base substrate, and a partial structure of the first reset signal line Re1 is used to form the gate electrode of the first transistor T1. The orthographic projection of the second reset signal line Re2 on the base substrate may cover the orthographic projection of the seventh active portion 67 on the base substrate, and a partial structure of the second reset signal line Re2 may be used to form the gate electrode of the seventh transistor T7. The orthographic projection of the first conductive portion 11 on the base substrate covers the orthographic projections of all of the third active portions 63 on the base substrate, and the first conductive portion 11 may be used to form a common gate electrode of multiple driving transistors T3 and the first electrode of the capacitor C. In addition, the display panel may use the first conductive layer as a mask to perform a conductorization process on the active layer, that is, a region of the active layer covered by the first conductive layer may form a channel region of a transistor, and a region not covered by the first conductive layer forms a conductor structure.

As shown in FIGS. 3, 6 and 10, the second conductive layer may include: a first initialization signal line Vinit1, a second initialization signal line Vinit2, a third conductive portion 23, and a fourth conductive portion 24. An orthographic projection of the first initialization signal line Vinit1 on the base substrate and an orthographic projection of the second initialization signal line Vinit2 on the base substrate extend along the first direction X. The first initialization signal line Vinit1 is used to provide the first initialization signal terminal. The second initialization signal line Vinit2 is used to provide the second initialization signal terminal. An orthographic projection of the third conductive portion 23 on the base substrate at least partially overlaps with an orthographic projection of the first conductive portion 11 on the base substrate, and the third conductive portion 23 is used to form the second electrode of the capacitor C. An orthographic projection of the fourth conductive portion 24 on the base substrate at least partially overlaps with an orthographic projection of the third active sub-portion 623 on the base substrate.

As shown in FIGS. 3, 7 and 11, the third conductive layer may include a first power line VDD, a data line Da, a first initialization connection line 3Vinit1, a second bridge portion 32, a fourth bridge portion 34, a fifth bridge portion 35, a sixth bridge portion 36, a seventh bridge portion 37, and an eighth bridge portion 38. An orthographic projection of the first power line VDD on the base substrate, an orthographic projection of the data line Da on the base substrate, and an orthographic projection of the first initialization connection line 3 Vinit1 on the base substrate extend along the second direction Y. The first power line VDD is used to provide the first power terminal. The data line Da is used to provide the data signal terminal. The data line Da may be connected to the thirteenth active portion 613 through a via hole (black square) to be connected to the first electrode of the fourth transistor T4. The first power line VDD may be connected to the fifteenth active portion 615 through a via hole to be connected to the first electrode of the fifth transistor. The first initialization connection line 3 Vinit1 is connected, through a via hole, to a first initialization signal line Vinit1 whose orthographic projection on the base substrate intersects the orthographic projection of the first initialization connection line 3 Vinit1 on the base substrate so as to form a first initialization signal line of a grid structure, thereby reducing a voltage drop of a signal on the first initialization signal line. An orthographic projection of the second bridge portion 32 on the base substrate may extend along the second direction Y. The second bridge portion 32 may be connected to the first conductive portion 11 through a plurality of via holes distributed in the second direction Y, and the second bridge portion 32 may be connected to the eleventh active portion 611 through a via hole to connect the gate electrode of the driving transistor T3 and the second electrode of the first transistor T1 and the first electrode of the second transistor T2. An opening 231 may be formed in the third conductive portion 23. An orthographic projection of a via hole connected between the first conductive portion 11 and the second bridge portion 32 on the base substrate may be located within an orthographic projection of the opening 231 on the base substrate, so that the via hole connected between the first conductive portion 11 and the second bridge portion 32 is insulated from the third conductive portion 23. An orthographic projection of the fourth bridge portion 34 on the base substrate may extend along the second direction. The fourth bridge portion 34 may be connected to the ninth active portion 69 through a plurality of via holes distributed in the second direction to reduce a voltage difference of the second electrodes of the plurality of driving transistors T3. The fifth bridge portion 35 may be connected to the eighth active portion 68 through a plurality of via holes distributed in the second direction to reduce a voltage difference of the first electrodes of the plurality of driving transistors T3. The sixth bridge portion 36 may be connected to the tenth active portion 610 through a via hole to be connected to the second electrode of the sixth transistor T6. The seventh bridge portion 37 may be connected to the first initialization signal line Vinit1 and the fourteenth active portion through via holes respectively to connect the first initialization signal terminal and the first electrode of the first transistor. The seventh bridge portion 37 may also be connected to the fourth conductive portion 24 through a via hole. The fourth conductive portion 24 has a stable voltage under the action of the first initialization signal line Vinit1, and the fourth conductive portion 24 can stabilize the voltage of the third active sub-portion 623 to address the problem of leakage to the source and drain electrodes of the second transistor T2 caused by the voltage fluctuation of the third active sub-portion 623. The eighth bridge portion 38 may be connected to the twelfth active portion 612 and the second initialization signal line Vinit2 through via holes, respectively, to connect the first electrode of the seventh transistor T7 and the second initialization signal terminal.

FIGS. 3 and 8, the fourth conductive layer may include a ninth bridge portion 49. The ninth bridge portion 49 may be connected to the sixth bridge portion 36 through a via hole. The ninth bridge portion 49 may be used for connection with the first electrode of the light-emitting unit to connect the second electrode of the sixth transistor and the first electrode of the light-emitting unit.

Figure 12:
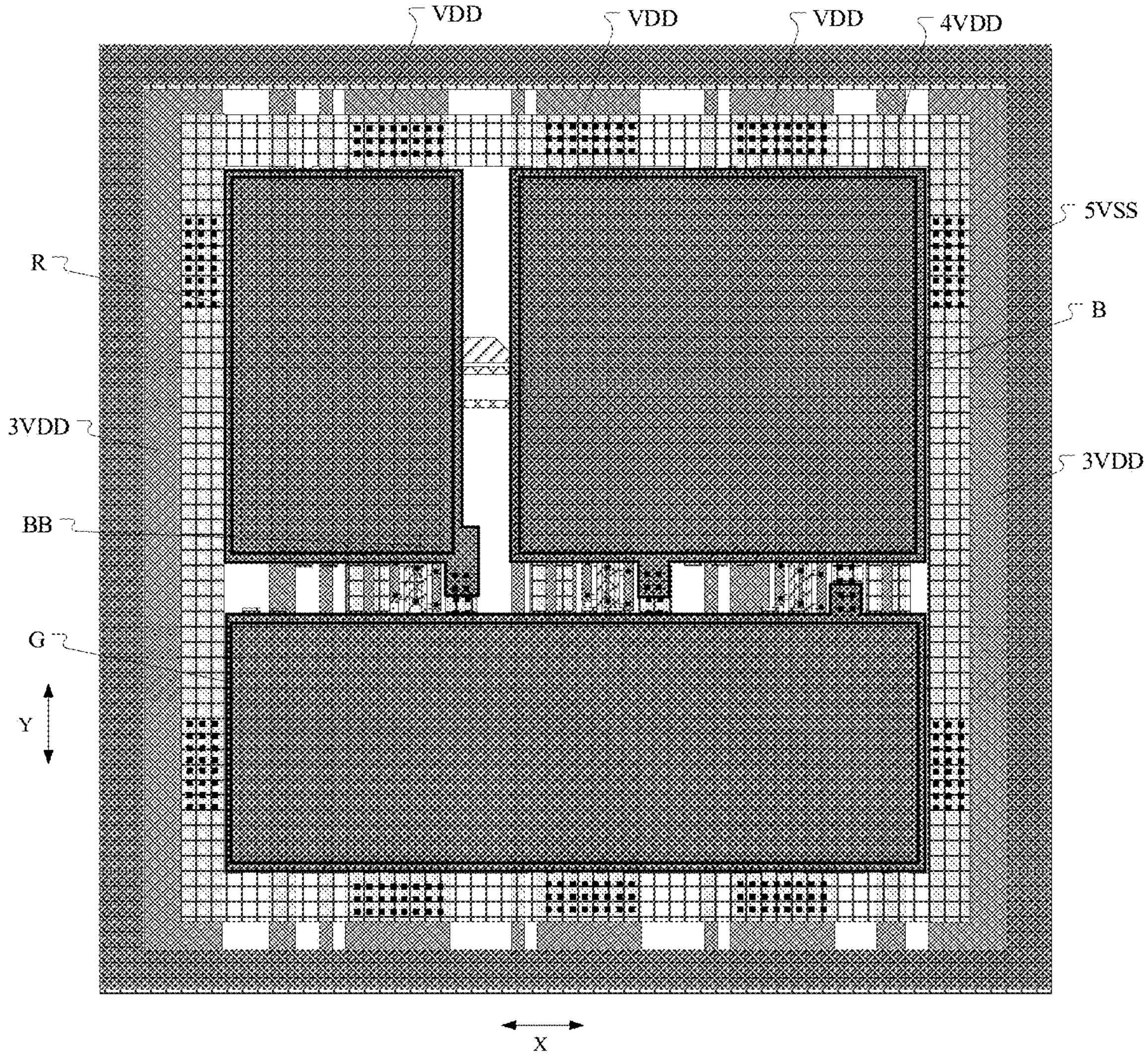
FIG. 12 is a structural layout of a display panel according to another example embodiment of the present disclosure.
Figure 13:
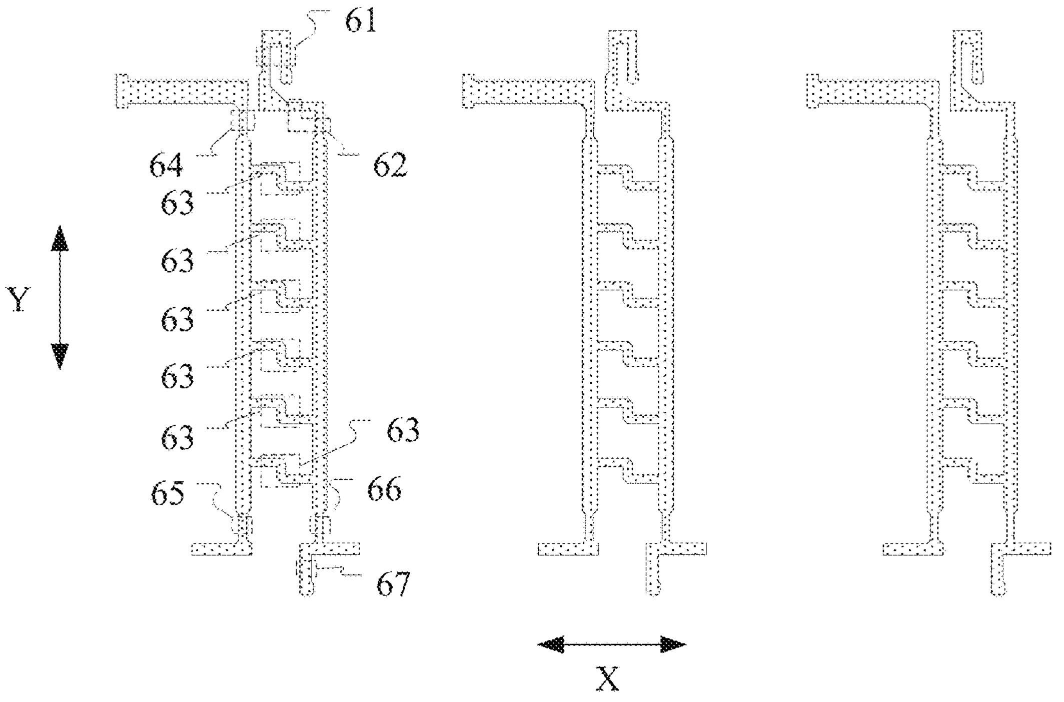
FIG. 13 is a structural layout of an active layer in FIG. 12.
Figure 14:
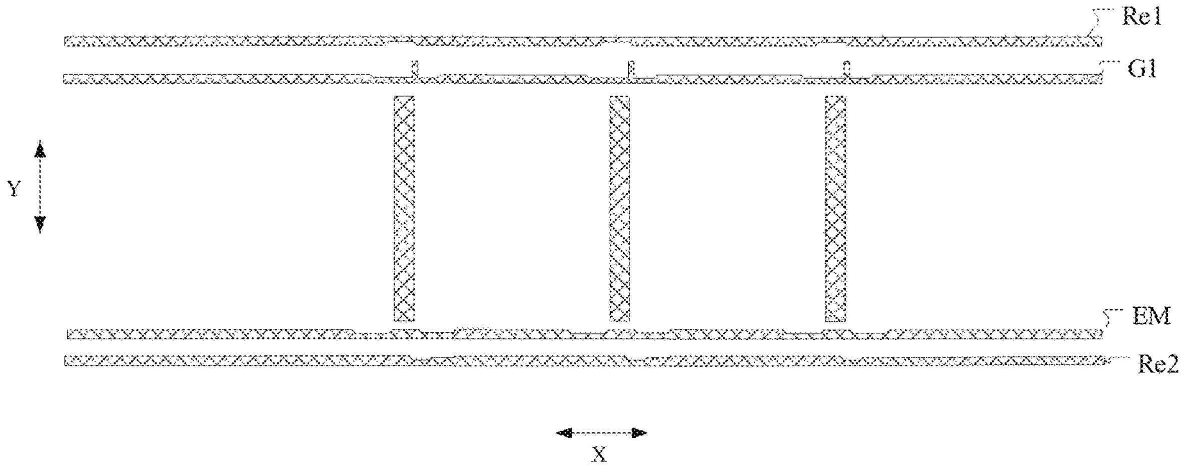
FIG. 14 is a structural layout of a first conductive layer in FIG. 12.
Figure 15:
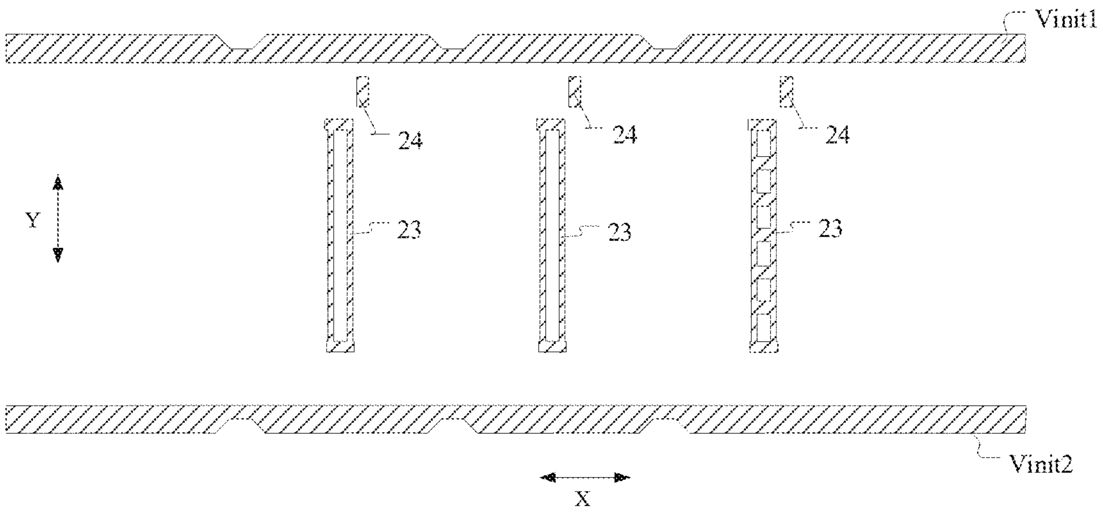
FIG. 15 is a structural layout of a second conductive layer in FIG. 12.
Figure 16:
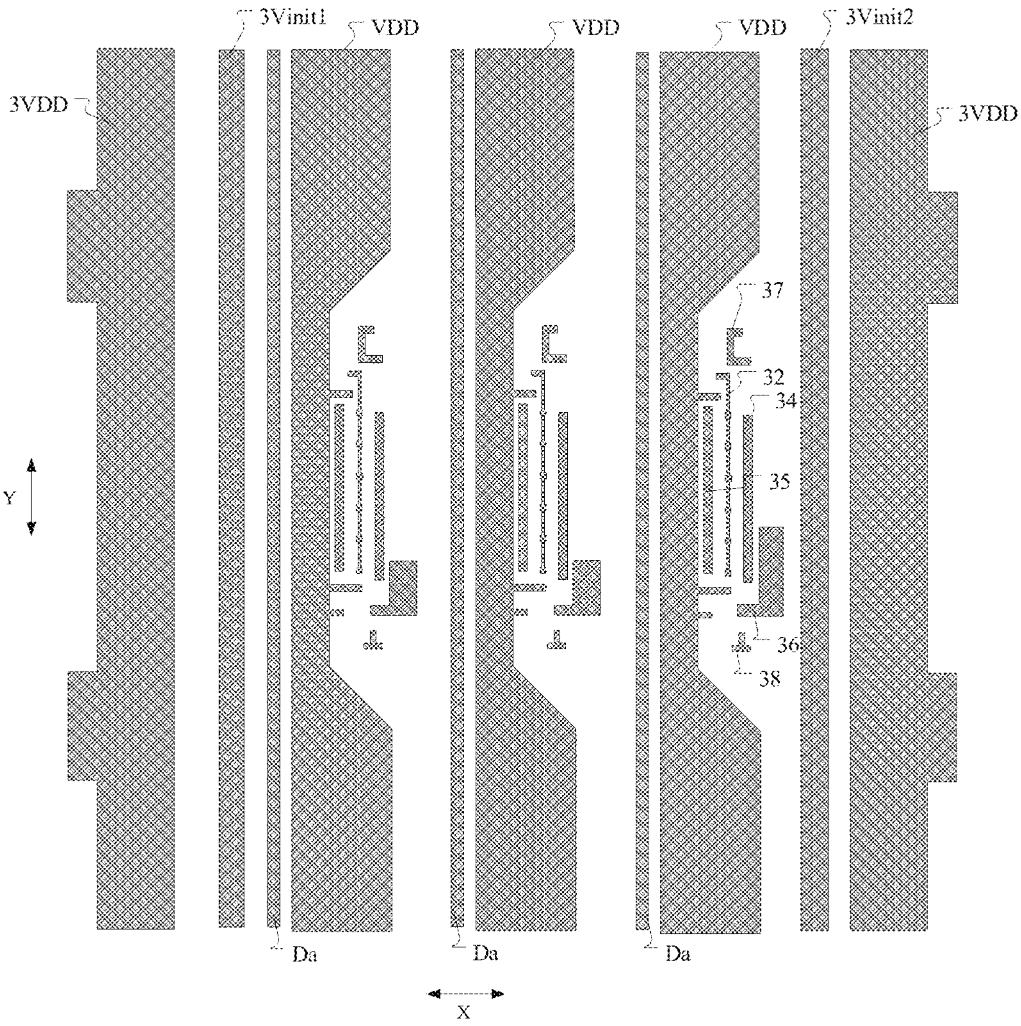
FIG. 16 is a structural layout of a third conductive layer in FIG. 12.
Figure 17:
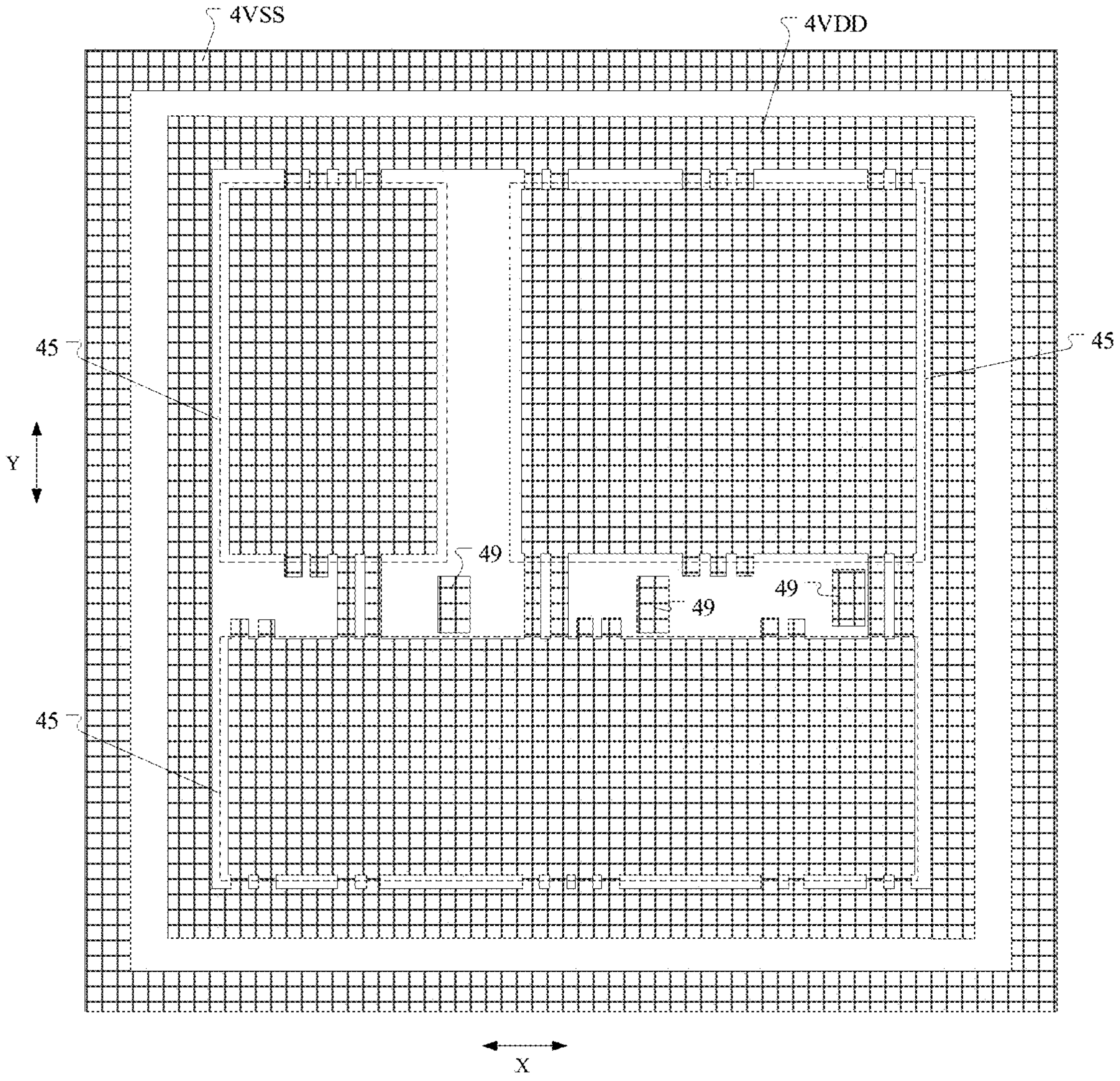
FIG. 17 is a structural layout of a fourth conductive layer in FIG. 12.
Figure 18:
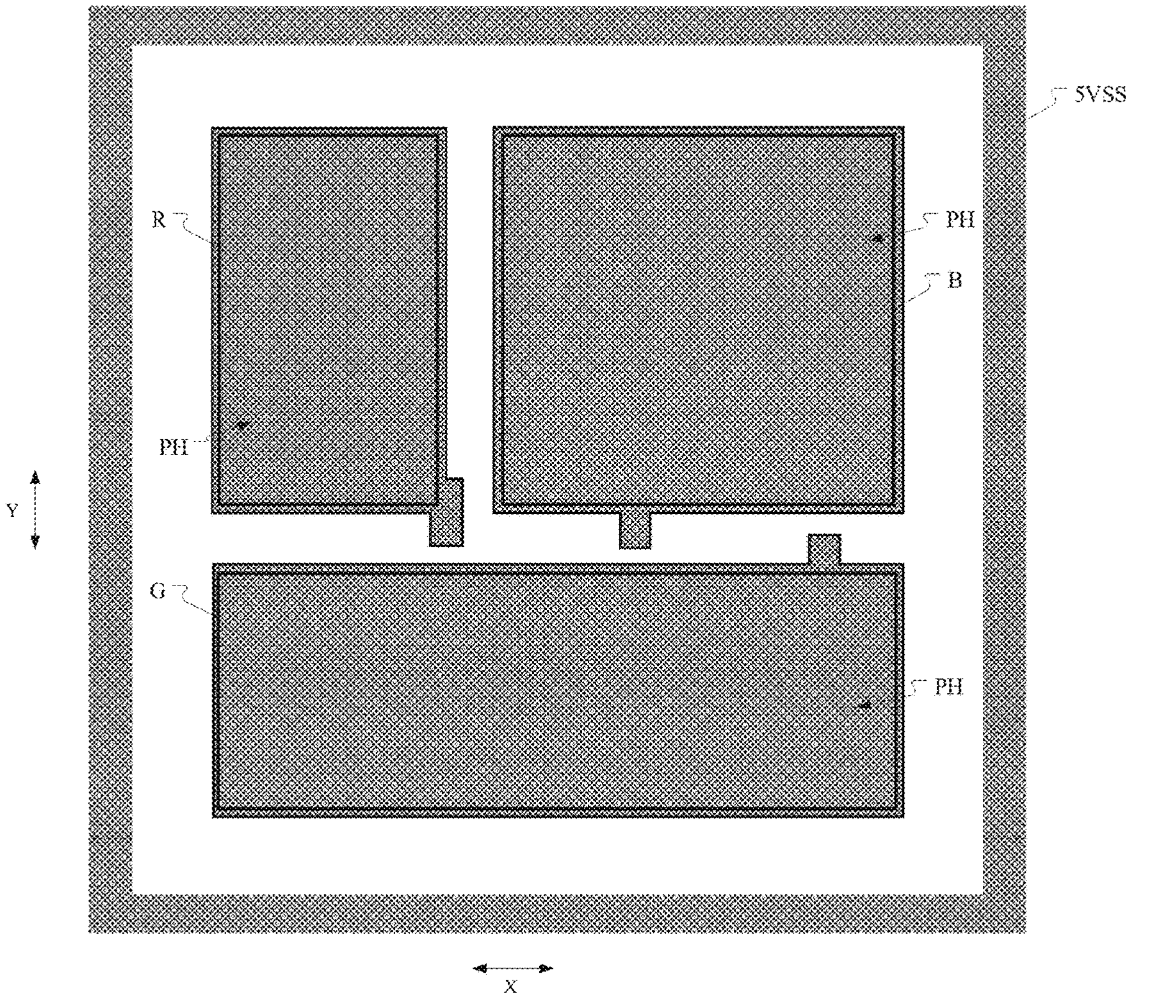
FIG. 18 is a structural plate of an electrode layer and a pixel definition layer in FIG. 12.
Figure 19:
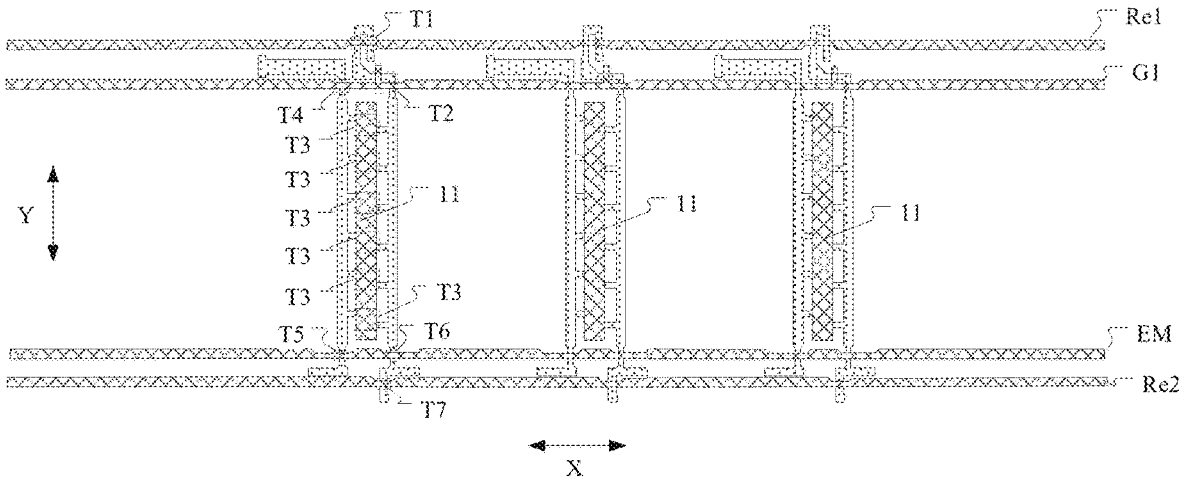
Figure 20:
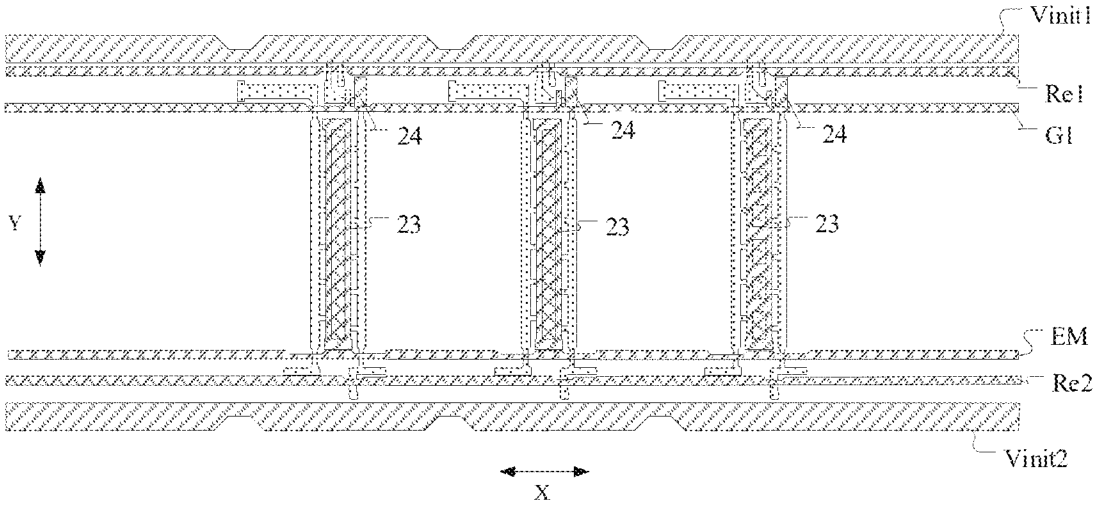
FIG. 20 is a structural layout of the active layer, the first conductive layer, and the second conductive layer in FIG. 12.
Figure 21:
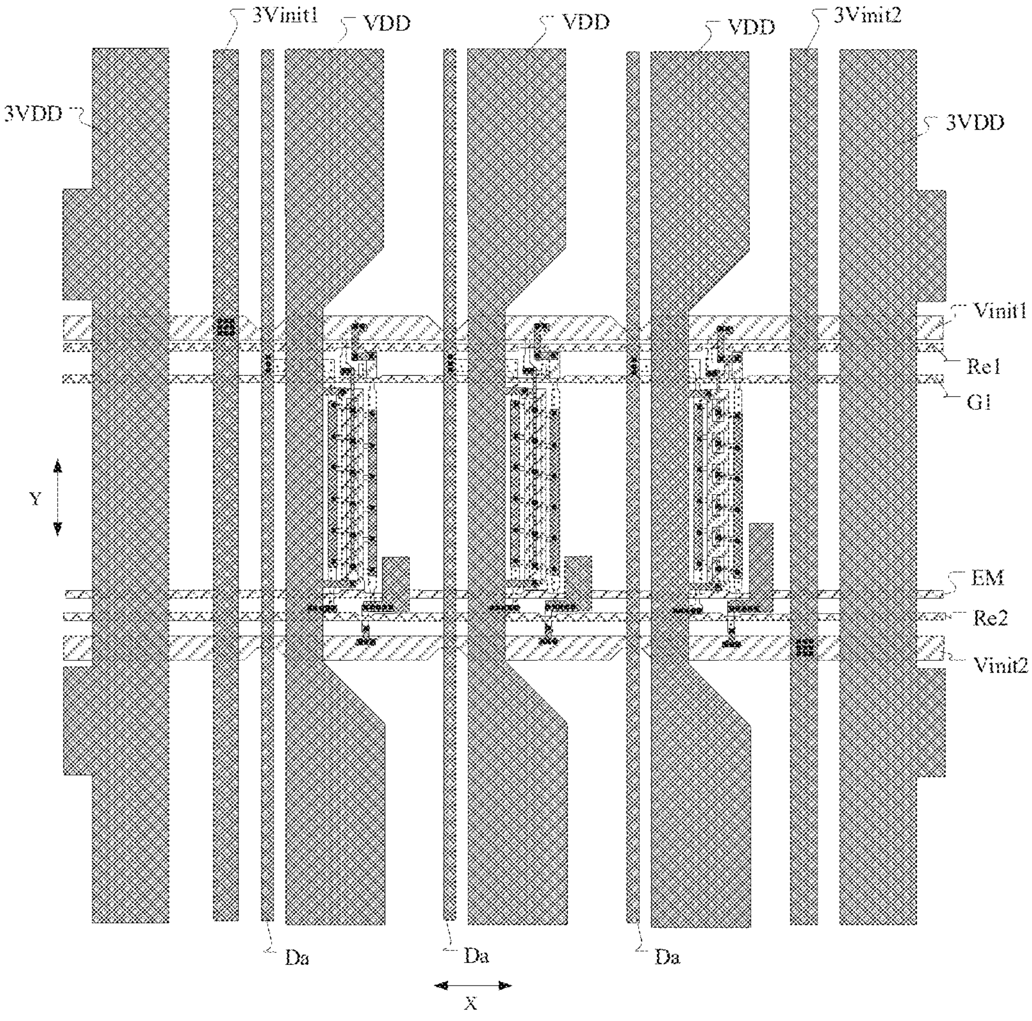
FIG. 21 is a structural layout of the active layer, the first conductive layer, the second conductive layer, and the third conductive layer in FIG. 12.
Figure 22:
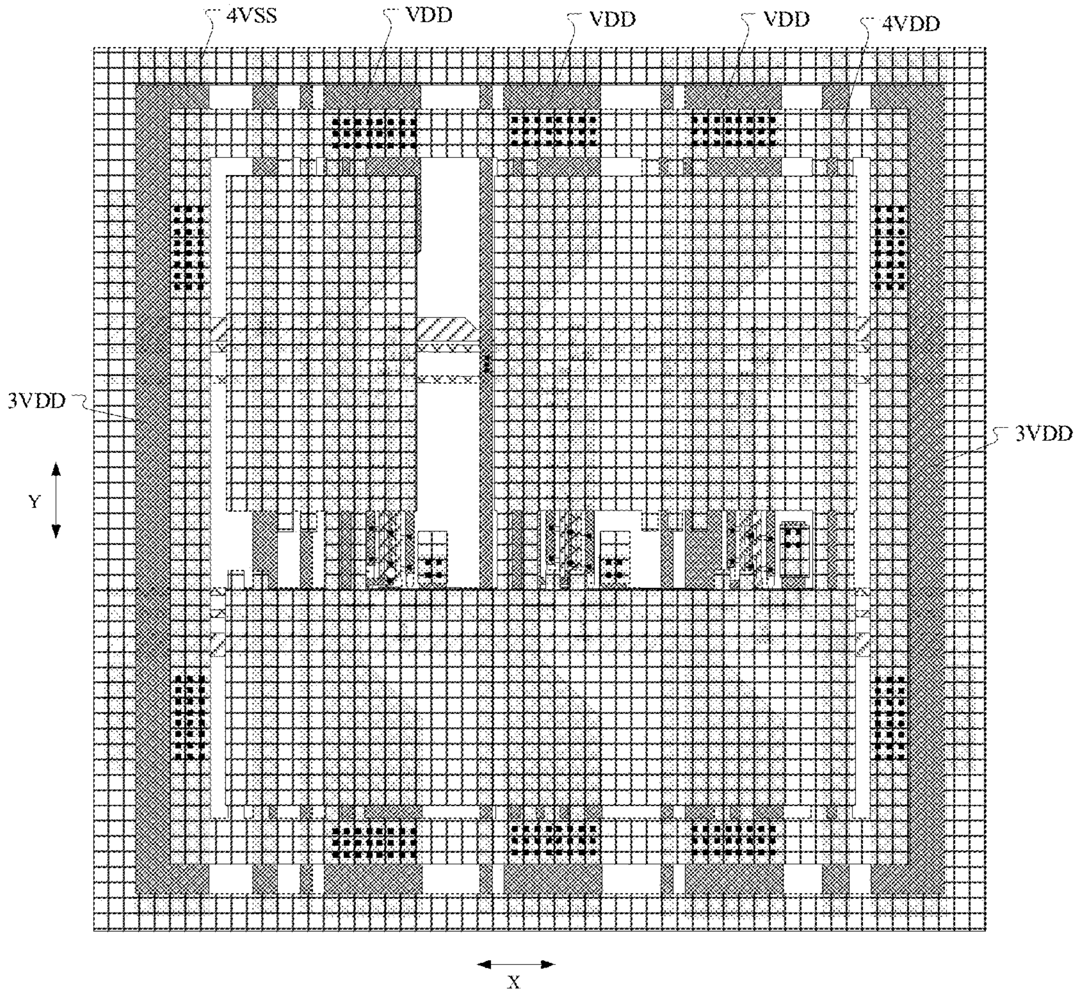
FIG. 22 is a structural layout of the active layer, the first conductive layer, the second conductive layer, the third conductive layer and the fourth conductive layer in FIG. 12.

As shown in FIGS. 12 to 22, FIG. 12 is a structural layout of a display panel according to another example embodiment of the present disclosure. FIG. 13 is a structural layout of an active layer in FIG. 12. FIG. 14 is a structural layout of a first conductive layer in FIG. 12. FIG. 15 is a structural layout of a second conductive layer in FIG. 12. FIG. 16 is a structural layout of a third conductive layer in FIG. 12. FIG. 17 is a structural layout of a fourth conductive layer in FIG. 12. FIG. 18 is a structural board of an electrode layer and a pixel definition layer in FIG. 12. FIG. 19 is a structural layout of the active layer and the first conductive layer in FIG. 12. FIG. 20 is a structural layout of the active layer, the first conductive layer, and the second conductive layer in FIG. 12. FIG. 21 is a structural layout of the active layer, the first conductive layer, the second conductive layer and the third conductive layer in FIG. 12. FIG. 22 is a structural layout of the active layer, the first conductive layer, the second conductive layer, the third conductive layer and the fourth conductive layer in FIG. 12.

As shown in FIGS. 12 to 22, the display panel may include a plurality of pixel units, and the plurality of pixel units may be distributed in an array in the first direction X and the second direction Y. FIG. 12 shows the layout structure of one pixel unit. Each pixel unit may include a plurality of pixel driving circuits distributed in the first direction X. In this example embodiment, each pixel unit may include three pixel driving circuits distributed in the first direction X. The pixel driving circuit in FIG. 12 may include all structural features of the pixel driving circuit shown in FIG. 3.

As shown in FIGS. 12, 15 and 20, a third conductive portion 23 in a pixel driving circuit corresponding to a green light-emitting unit is different from third conductive portions 23 in pixel driving circuits corresponding to a red light-emitting unit and a blue light-emitting unit. In the pixel driving circuit corresponding to the green light-emitting unit, an overlapping area of the third conductive portion 23 and the first conductive portion 11 is relatively large, which can increase the capacitance of the capacitor C in the pixel driving circuit corresponding to the green light-emitting unit, thereby improving the image quality of the green light-emitting unit. It should be understood that in other example embodiments, the capacitors in the pixel driving circuits corresponding to the red light-emitting unit, the blue light-emitting unit and the green light-emitting unit may also be set differentially from the perspective of image quality requirements of the light-emitting units of other colors. The differential setting can be as shown in FIG. 20, by adding a transverse connection block on the third conductive portion(s) 23 to increase the capacitance between the third conductive portion(s) 23 and the first conductive portion 11.

As shown in FIGS. 12, 16 and 21, three pixel driving circuits in the same pixel unit form a pixel driving circuit group. For a column of pixel driving circuit groups, a first initialization connection line 3 Vinit1 is provided correspondingly. The first initialization connection line 3 Vinit1 is connected, through a via hole, to a first initialization signal line Vinit1 whose orthographic projection on the base substrate intersects the orthographic projection of the first initialization connection line 3Vinitl on the base substrate. The third conductive layer may further include a second initialization connection line 3 Vinit2. For a column of pixel driving circuit groups, a second initialization connection line 3 Vinit2 is provided correspondingly. The second initialization connection line 3 Vinit2 is connected, through a via hole, to a second initialization signal line whose orthographic projection on the base substrate intersects the orthographic projection of the second initialization connection line 3 Vinit2 on the base substrate. The orthographic projection of a pixel driving circuit group on the base substrate is located between the orthographic projections of corresponding first initialization connection line 3 Vinit1 and corresponding second initialization connection line 3 Vinit2 on the base substrate.

As shown in FIGS. 12, 17 and 22, the fourth conductive layer may further include a first power connection line 4VDD. The orthographic projection of the first power connection line 4VDD on the base substrate is a ring-like shape. The first power supply connection line 4VDD and a pixel driving circuit group are arranged correspondingly. The orthographic projection of a first pixel driving circuit group on the base substrate is located within the orthographic projection of a first power connection line 4VDD (corresponding to the first pixel driving circuit group) on the base substrate. The first power connection line 4VDD may be connected, through via holes, to three first power lines VDD corresponding to the pixel driving circuit group. In this example embodiment, the ring-like shape refers to an image formed by lines connected end to end, and the ring shape may be a rectangle, a circle, a triangle, a polygon, etc.

As shown in FIGS. 12, 16 and 21, the third conductive layer further includes a power bridge line 3VDD. The orthographic projection of the power bridge line 3VDD on the base substrate extends along the second direction Y. The orthographic projection of at least part of the structure of the power bridge line 3VDD on the base substrate is located between orthographic projections of two adjacent first power connection lines 4VDD in the first direction X on the base substrate, and the power bridge line 3VDD is connected to the two adjacent first power connection lines 4 VDD through via holes, respectively. That is, the orthographic projection of at least part of the structure of a first power connection line 4VDD on the base substrate is located between the orthographic projections of two adjacent power bridge lines 3VDD in the first direction on the base substrate, and the power bridge line is connected to the first power connection lines through via holes, respectively. The power bridge line 3VDD can connect the first power connection lines 4 VDD distributed in the first direction X. The power bridge line 3VDD and the first power connection lines 4 VDD can cause the first power line VDD to form a grid structure to reduce the voltage drop of the power signal on the first power line.

As shown in FIGS. 8, 12, 17 and 22, the fourth conductive layer may further include a plurality of fifth conductive portions 45. The fifth conductive portions 45 are connected to the first power connection line 4VDD. The fifth conductive portions 45 may further reduce the voltage drop on the first power line.

As shown in FIG. 12 and FIG. 18, the electrode layer may include a plurality of electrode portions: a first electrode portion G, a second electrode portion B, and a third electrode portion R. Each of the electrode portions may be connected to a ninth bridge portion 49 through a via hole to connect the second electrode of the sixth transistor. A plurality of pixel openings PH are formed in the pixel definition layer. The pixel openings PH are arranged corresponding to the electrode portions. The orthographic projection of a pixel opening PH on the base substrate coincides with the orthographic projection of an electrode portion on the base substrate. The first electrode portion G may be used to form an electrode portion of a green light-emitting unit in the display panel. The second electrode portion B may be used to form an electrode portion of a blue light-emitting unit in the display panel. The third electrode portion R may be used to form an electrode portion of a red light-emitting unit. The electrode portions may also be arranged corresponding to the fifth conductive portions 45. The orthographic projection of an electrode portion on the base substrate at least partially overlaps with the orthographic projection of a corresponding fifth conductive portion 45 on the base substrate. The overlapping area between the orthographic projection of the electrode portion on the base substrate and the orthographic projection of the corresponding fifth conductive portion 45 on the base substrate is S1, the area of the orthographic projection of the electrode portion on the base substrate is S2, S1/S2 is greater than or equal to 80%. For example, S1/S2 may be 80%, 90%, or 100%. This arrangement can improve the flatness of the electrode portion. As shown in FIG. 8, a plurality of openings 451 may be formed in a fifth conductive portion 45. The openings 451 can release moisture in a planarization layer between the fourth conductive layer and the third conductive layer.

As shown in FIGS. 12, 17, and 22, the fourth conductive layer may further include a second power connection line 4VSS. The second power connection line 4VSS and the first power connection line 4VDD are arranged correspondingly. The orthographic projection of the second power connection line 4VSS on the base substrate is a ring shape. The orthographic projection of the first power connection line 4VDD on the base substrate is located within the orthographic projection of a corresponding second power connection line 4VSS on the base substrate. The electrode layer may further include a first electrode ring 5VSS. The orthographic projection of the first electrode ring 5VSS on the base substrate is a ring shape. The first electrode ring 5VSS and the second power connection line 4VSS are arranged correspondingly, and the first electrode ring 5VSS is connected to the corresponding second power connection line 4VSS. The display panel may further include a common electrode layer. The common electrode layer is at a side of the electrode layer away from the base substrate. The common electrode layer may be used to form the second electrode of the light-emitting unit. The second power connection line 4VSS may be connected to the common electrode layer through the first electrode ring 5VSS. The second power connection line 4VSS and the first electrode ring 5VSS can reduce a voltage drop of a power signal on the common electrode layer.

Figure 23:
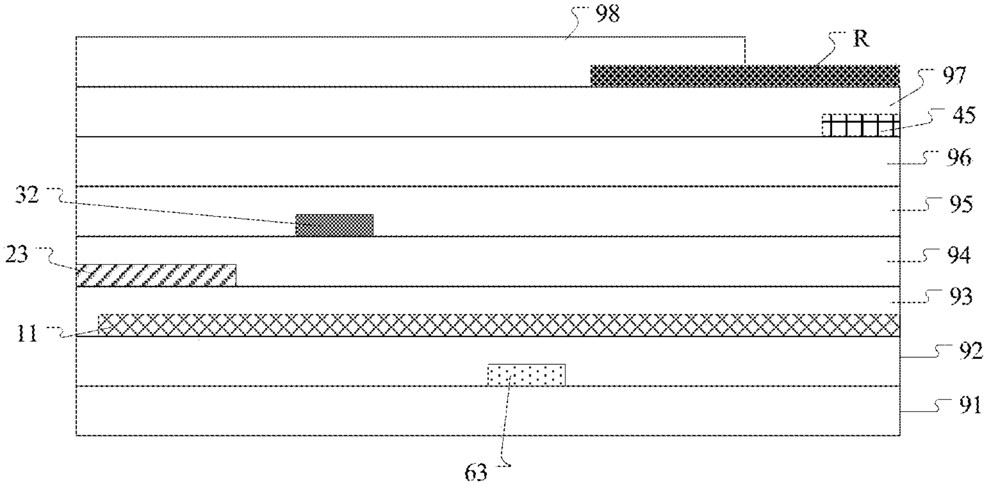
FIG. 23 is a partial cross-sectional view of the display panel shown in FIG. 12 taken along a dotted line BB.

As shown in FIG. 23, it is a partial cross-sectional view of the display panel shown in FIG. 12 taken along a dotted line BB. The display panel may further include a first insulating layer 92, a second insulating layer 93, a dielectric layer 94, a passivation layer 95, a first planarization layer 96, a second planarization layer 97, and a pixel definition layer 98. The base substrate 91, the active layer, the first insulating layer 92, the first conductive layer, the second insulating layer 93, the second conductive layer, the dielectric layer 94, the third conductive layer, the passivation layer 95. the first planarization layer 96, the fourth conductive layer, the second planarization layer 97, the electrode layer, and the pixel definition layer 98 are stacked in sequence. The first insulating layer 92 and the second insulating layer 93 may include one or more layers of silicon oxide and silicon nitride layers. The dielectric layer 94 may include a silicon nitride layer. The material of the first planarization layer 96 and the second planarization layer 97 may be an organic material, such as polyimide (PI), polyethylene terephthalate (PET), polyethylene naphthalate (PEN), silicon-glass bonding structure (SOG) or other materials. The passivation layer 95 may be a silicon oxide layer. The base substrate 91 may include a glass substrate, a barrier layer, and a polyimide layer that are stacked in sequence. The barrier layer may be an inorganic material. The material of the first conductive layer and the second conductive layer may be one of molybdenum, aluminum, copper, titanium, niobium or an alloy, or a molybdenum/titanium alloy or stacked layers of molybdenum/titanium. The material of the third conductive layer and the fourth conductive layer may include a metal material, for example, the material may be one of molybdenum, aluminum, copper, titanium, niobium or an alloy, or a molybdenum/titanium alloy or stacked layers of molybdenum/titanium, or the material may be stacked layers of titanium/aluminum/titanium. The electrode layer may include an indium tin oxide layer or a silver layer. The square resistance of any one of the first conductive layer and the second conductive layer may be greater than the square resistance of any one of the third conductive layer and the fourth conductive layer.

Figure 24:
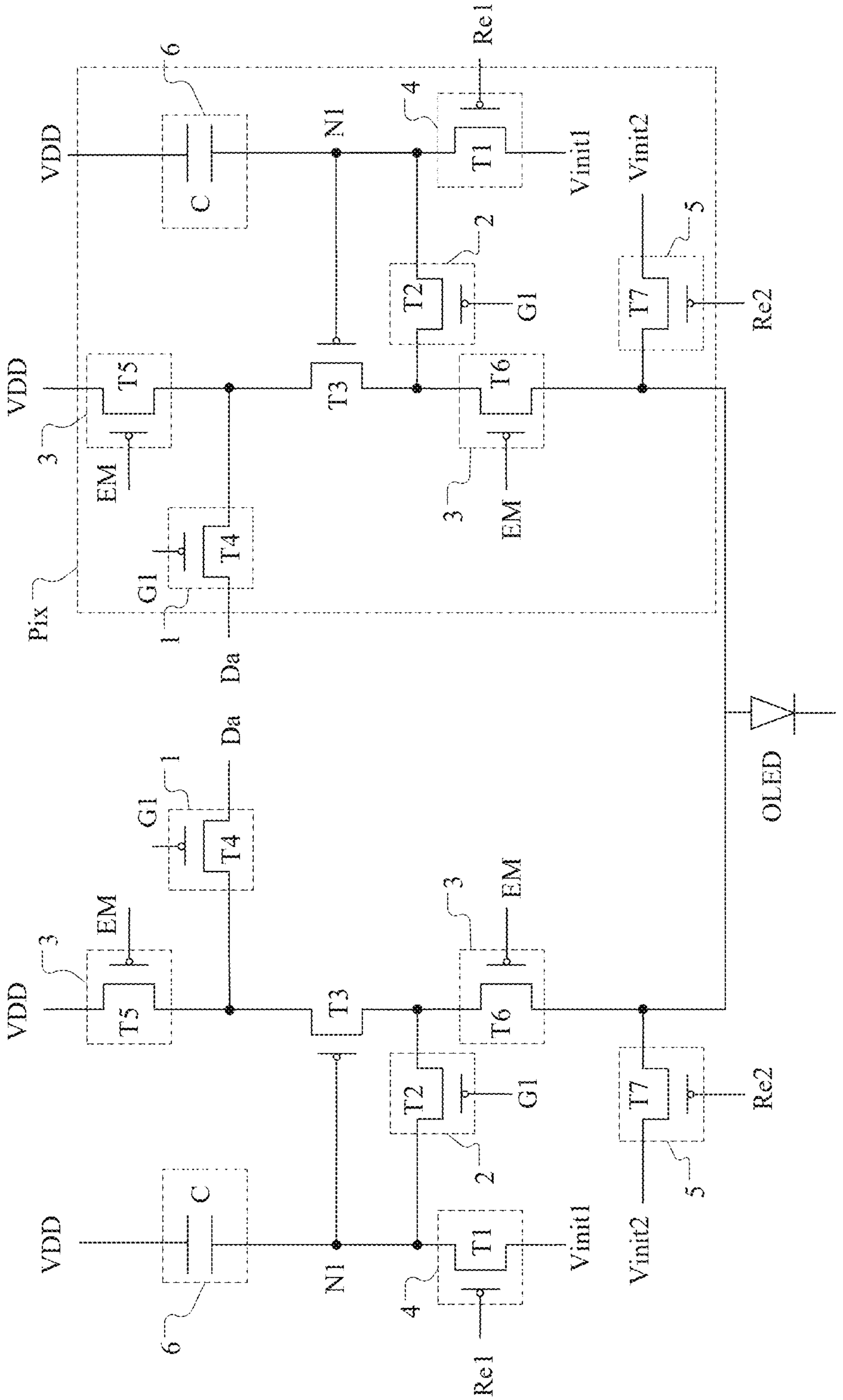
FIG. 24 is a schematic structural diagram of a pixel driving circuit according to another example embodiment of the present disclosure.

It should be understood that in other example embodiments, there may be other ways to realize the parallel connection of the driving transistors in the pixel driving circuit. As shown in FIG. 24, it is a schematic structural diagram of a pixel driving circuit according to another example of the present disclosure. The pixel driving circuit may include a plurality of pixel driving sub-circuits pix, each of the pixel driving sub-circuits pix includes at least one of the driving transistors T3, and each of the pixel driving sub-circuits is connected to the same light-emitting unit OLED. A pixel driving sub-circuit is used to provide a driving current to the light-emitting unit OLED.

As shown in FIG. 24, a pixel driving sub-circuit also includes: a data writing circuit 1, a compensation circuit 2, a light-emitting control circuit 3, a first reset circuit 4, a second reset circuit 5, and a storage circuit 6. The data writing circuit 1 is connected to a data signal terminal D, a first electrode of a driving transistor T3 and a first gate driving signal terminal G1, and is configured to transmit a signal of the data signal terminal Da to the first electrode of the driving transistor T3 in response to a signal of the first gate driving signal terminal. The compensation circuit 2 is connected to a gate electrode of the driving transistor T3, a second electrode of the driving transistor T3, and the first gate driving signal terminal G1, and is configured to create connectivity between the gate electrode of the driving transistor T3 and the second electrode of the driving transistor T3 in response to the signal of the first gate driving signal terminal G1. The light-emitting control circuit 3 is connected to a first power terminal VDD, the first electrode of the driving transistor T3, an enable signal terminal EM, the second electrode of the driving transistor T3 and a first electrode of the light-emitting unit OLED, and is configured to create connectivity between the first power terminal VDD and the first electrode of the driving transistor T3 in response to a signal of the enable signal terminal EM, and is configured to create connectivity between the second electrode of the driving transistor T3 and the first electrode of the light-emitting unit OLED in response to the signal of the enable signal terminal EM. The first reset circuit 4 is connected to a first initialization signal terminal Vinit1, a first reset signal terminal Re1 and the gate electrode of the driving transistor T3, and is configured to transmit a signal of the first initialization signal terminal Vinit1 to the gate electrode of the driving transistor T3 in response to a signal of the first reset signal terminal Re1. The second reset circuit 5 is connected to a second initialization signal terminal Vinit2, a second reset signal terminal Re2 and the first electrode of the light-emitting unit OLED, and is configured to transmit a signal of the second initialization signal terminal Vinit2 to the first electrode of the light-emitting unit OLED in response to a signal of the second reset signal terminal Re2. The storage circuit 6 is connected between the gate electrode of the driving transistor T3 and the first power terminal VDD.

As shown in FIG. 24, the data writing circuit 1 includes a fourth transistor T4. A first electrode of the fourth transistor T4 is connected to the data signal terminal Da, a second electrode of the fourth transistor T4 is connected to the first electrode of the driving transistor T3, a gate electrode of the fourth transistor T4 is connected to the first gate driving signal terminal G1. The compensation circuit 2 includes a second transistor T2. A first electrode of the second transistor T2 is connected to the gate electrode of the driving transistor T3, a second electrode of the second transistor T2 is connected to the second electrode of the driving transistor T3, and a gate electrode of the second transistor T2 is connected to the first gate driving signal terminal G1. The light-emitting control circuit 3 includes a fifth transistor T5 and a sixth transistor T6. A first electrode of the fifth transistor T5 is connected to the first power terminal VDD, a second electrode of the fifth transistor T5 is connected to the first electrode of the driving transistor T3, and a gate electrode of the fifth transistor T5 is connected to the enable signal terminal EM. A first electrode of the sixth transistor T6 is connected to the second electrode of the driving transistor T3, a second electrode of the sixth transistor T6 is connected to the first electrode of the light-emitting unit OLED, and a gate electrode of the sixth transistor T6 is connected to the enable signal terminal EM. The first reset circuit 4 includes a first transistor T1. A first electrode of the first transistor T1 is connected to the first initialization signal terminal Vinit1, a second electrode of the first transistor T1 is connected to the gate electrode of the driving transistor T3, and a gate electrode of the first transistor T1 is connected to the first reset signal terminal Re1. The second reset circuit 5 includes a seventh transistor T7. A first electrode of the seventh transistor T7 is connected to the second initialization signal terminal Vinit2, a second electrode of the seventh transistor T7 is connected to the first electrode of the light-emitting unit OLED, and a gate electrode of the seventh transistor T7 is connected to the second reset signal terminal Re2. The storage circuit 6 includes a capacitor C. A first electrode of the capacitor C is connected to the gate electrode of the driving transistor T3, and a second electrode of the capacitor C is connected to the first power terminal VDD.

In the example embodiment, the timing of respective control signals in the pixel driving circuit shown in FIG. 24 may be as shown in FIG. 2, where G1 represents the timing of the signal of the first gate driving signal terminal G1, Re1 represents the timing of the signal of the first reset signal terminal Re1, Re2 represents the timing of the signal of the second reset signal terminal Re2, and EM represents the timing of the signal of the enable signal terminal EM. The driving method of the pixel driving circuit may also include a first reset stage t1, a data writing stage t2, a second reset stage t3, and a light-emitting stage t4. In the first reset stage t1: the first reset signal terminal Re1 outputs a low-level signal, the first transistor T1 in each pixel driving sub-circuit is turned on, and the first initialization signal terminal Vinit1 inputs the first initialization signal to the gate electrode of the driving transistor in each pixel driving sub-circuit. In the data writing stage t2: the first gate driving signal terminal G1 outputs a low-level signal, the fourth transistor T4 and the second transistor T2 in each pixel driving sub-circuit are turned on, and at the same time the data signal terminal Da outputs the data signal to write a voltage of Vdata+Vth to the gate electrode of the driving transistor in each pixel driving sub-circuit, where Vdata is the voltage of the data signal, and Vth is the threshold voltage of the driving transistor T3. In the second reset stage t3: the second reset signal terminal outputs a low-level signal, the seventh transistor in each pixel driving sub-circuit is turned on, and the second initialization signal terminal Vinit2 inputs a second initialization signal to the second electrode of the sixth transistor T6 in each pixel driving sub-circuit. In the light-emitting stage t4: the enable signal terminal EM outputs a low-level signal, the sixth transistor T6 and the fifth transistor T5 in each pixel driving sub-circuit are turned on, and a plurality of driving transistors T3 drive the light-emitting unit to emit light under the voltage Vdata+Vth at their gate electrodes. It should be understood that in other example embodiments, the pixel driving circuit may also have other driving methods, for example, the seventh transistor may be turned on in the data writing stage t2.

In other example embodiments, a single pixel driving sub-circuit may also include a plurality of driving transistors connected in parallel.

An example embodiment further provides another display panel. The display panel may include a base substrate, an active layer, a first conductive layer, a second conductive layer, a third conductive layer, and a fourth conductive layer that are stacked in sequence. An insulating layer may be provided between adjacent conductive layers described above.

Figure 25:
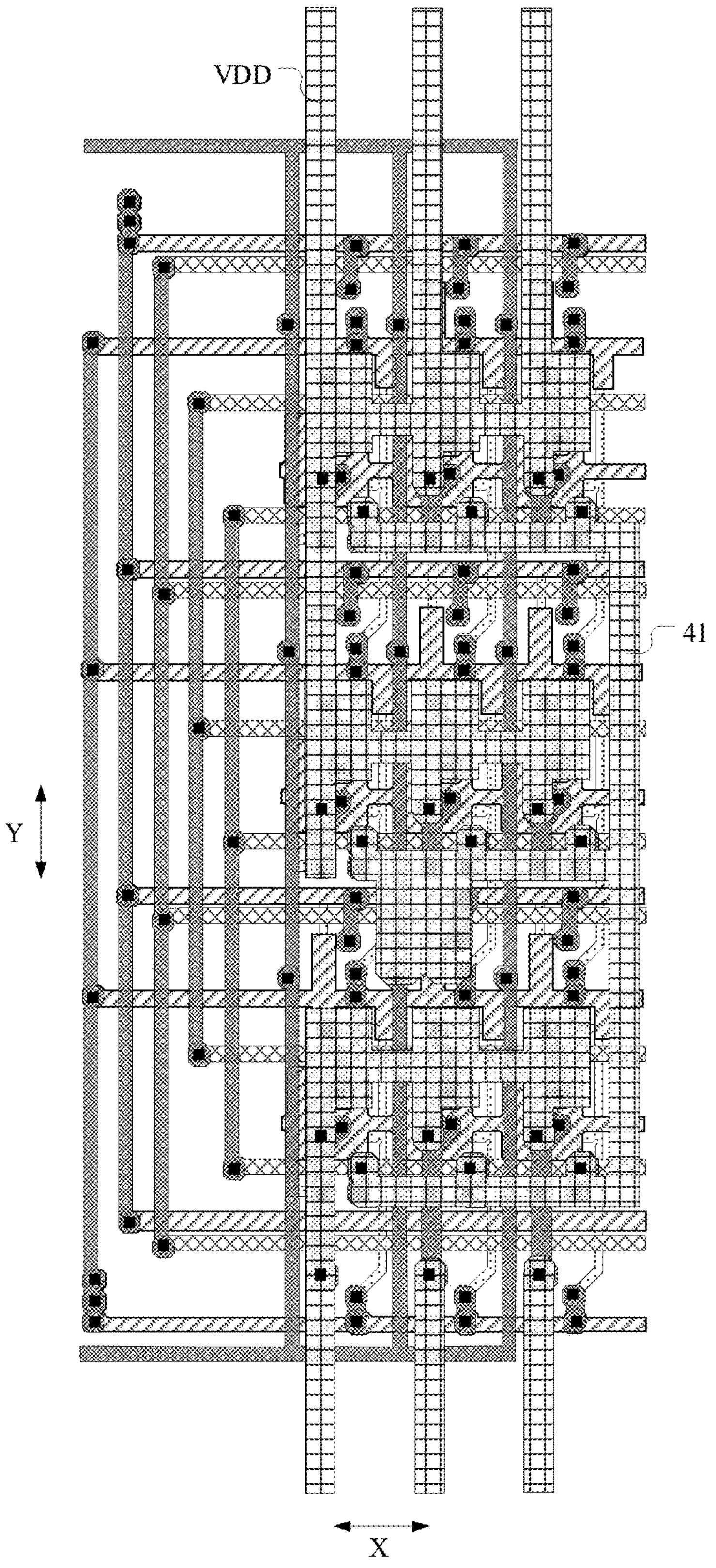
FIG. 25 is a structural layout of a display panel according to an example embodiment of the present disclosure.
Figure 26:
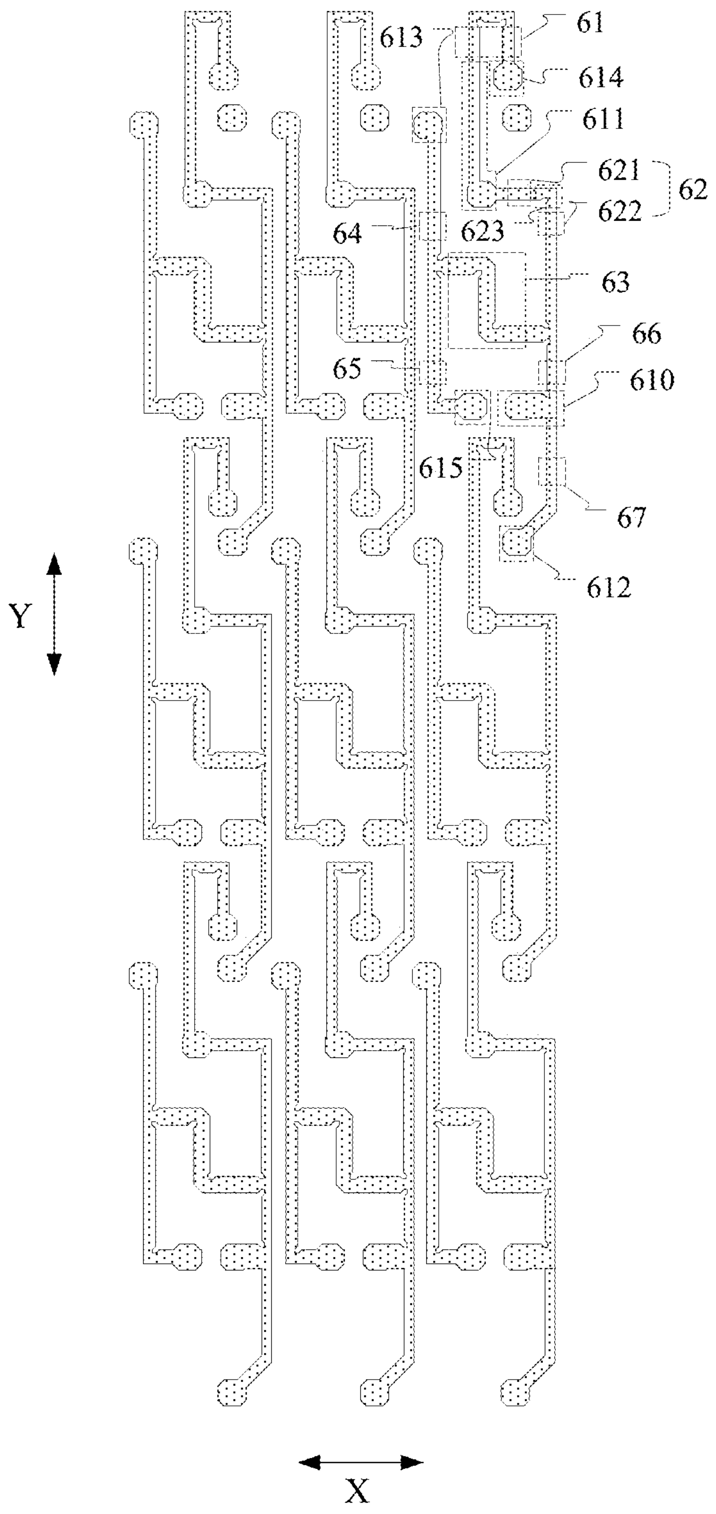
FIG. 26 is a structural layout of an active layer in FIG. 25.
Figure 27:
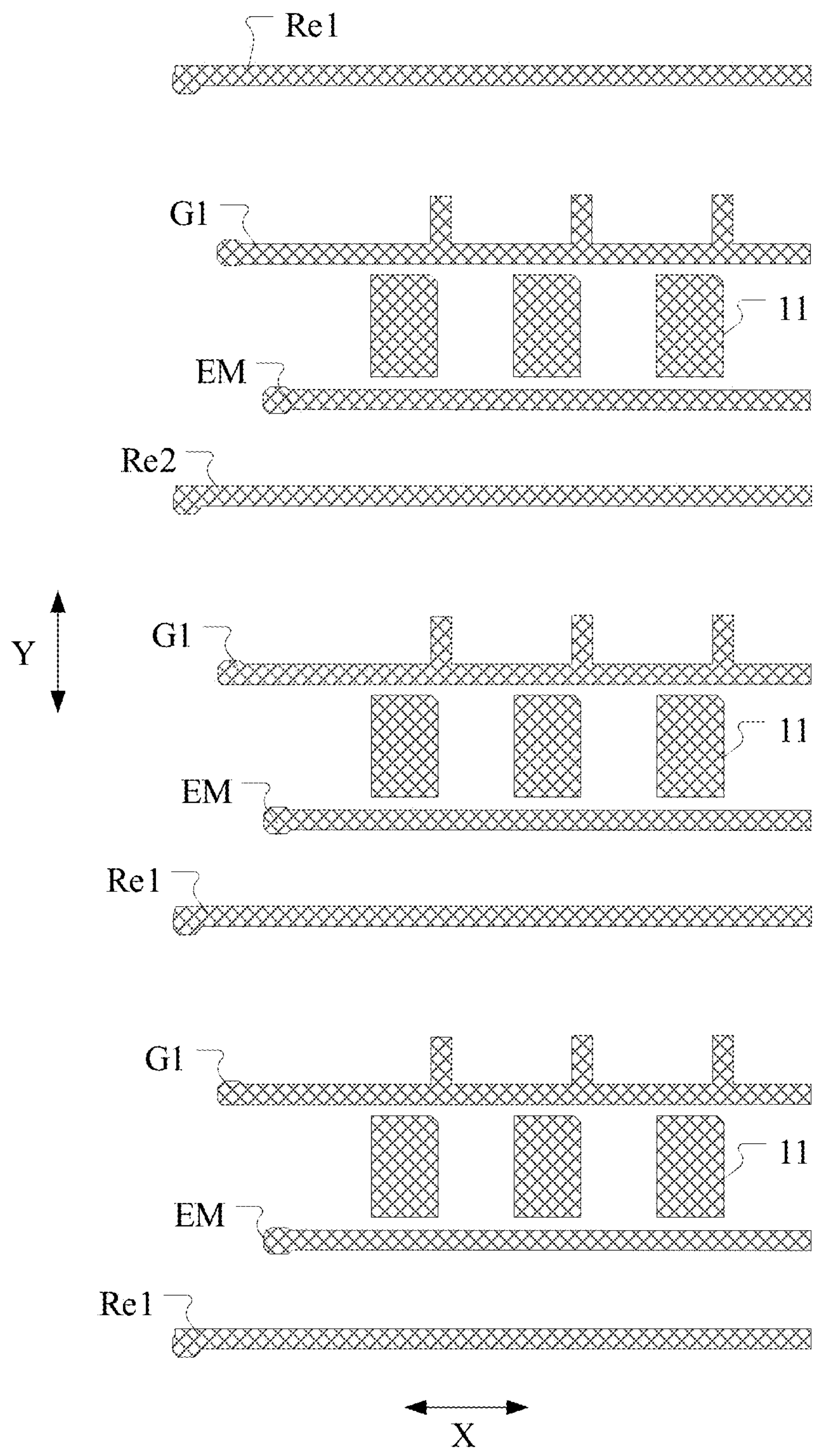
FIG. 27 is a structural layout of a first conductive layer in FIG. 25.
Figure 28:
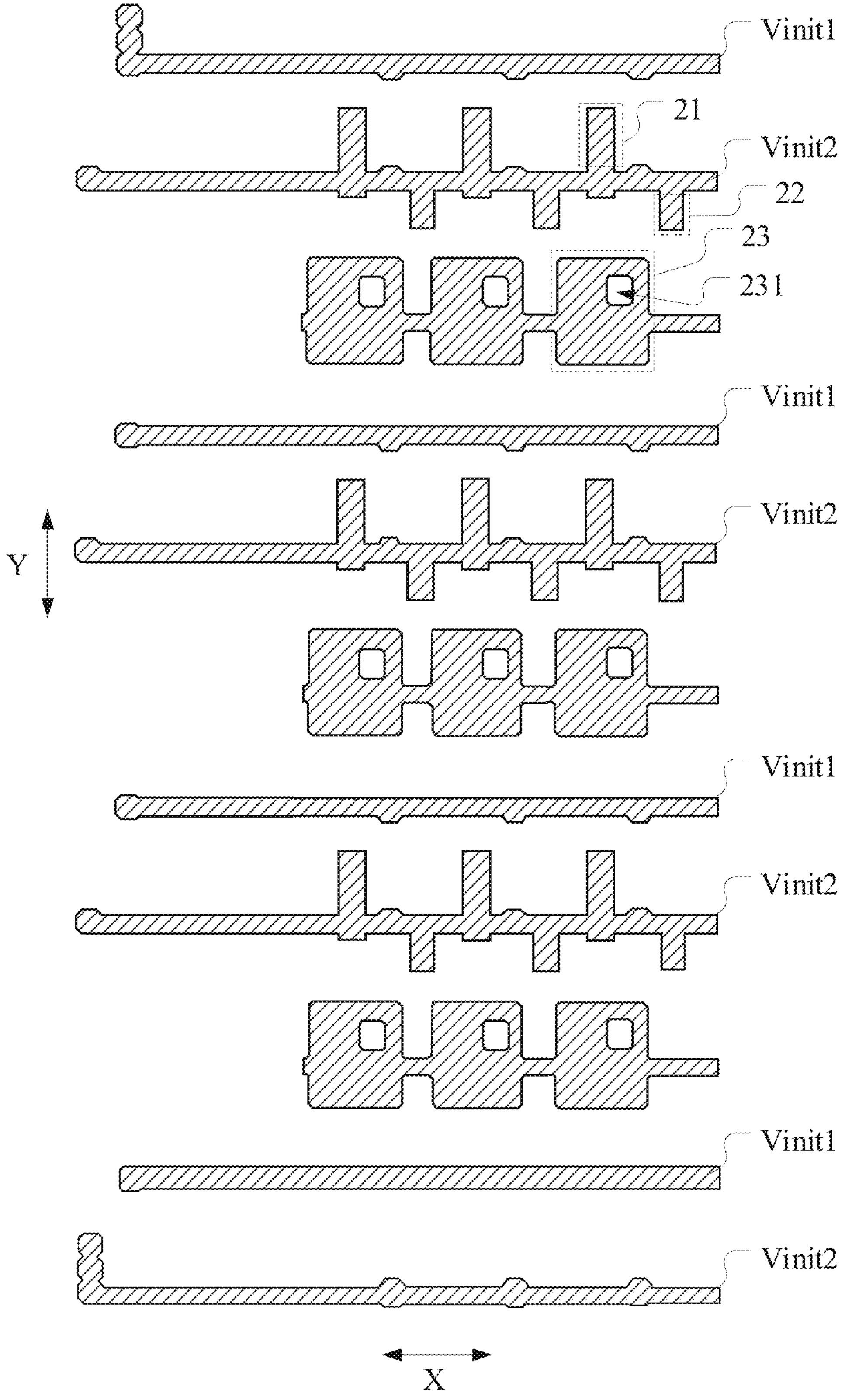
FIG. 28 is a structural layout of a second conductive layer in FIG. 25.
Figure 29:
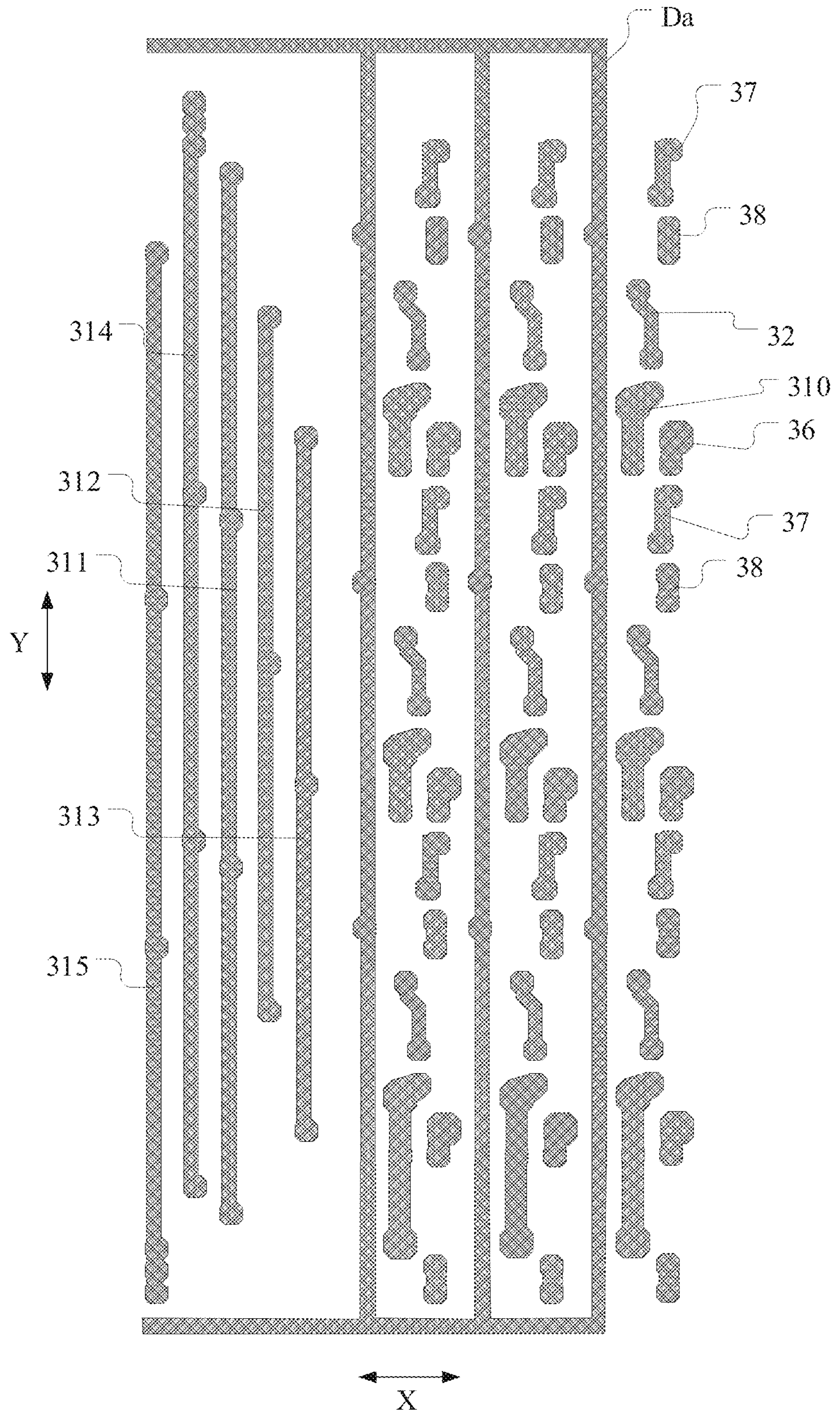
FIG. 29 is a structural layout of a third conductive layer in FIG. 25.
Figure 30:
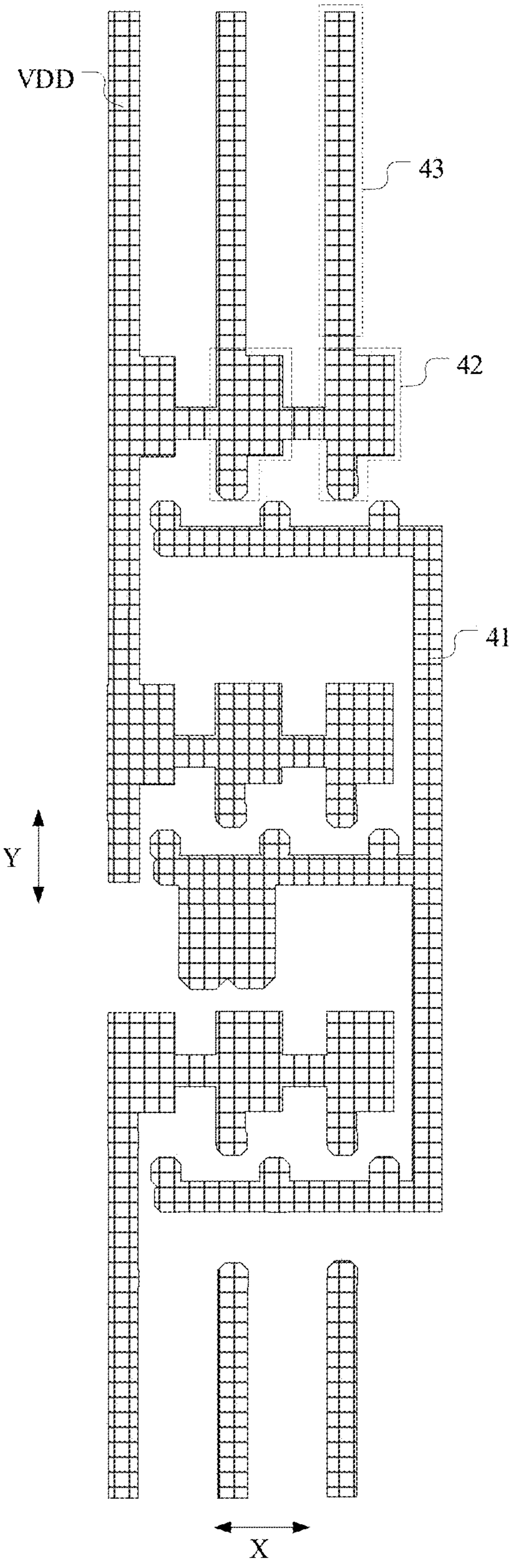
FIG. 30 is a structural layout of a fourth conductive layer in FIG. 25.
Figure 31:
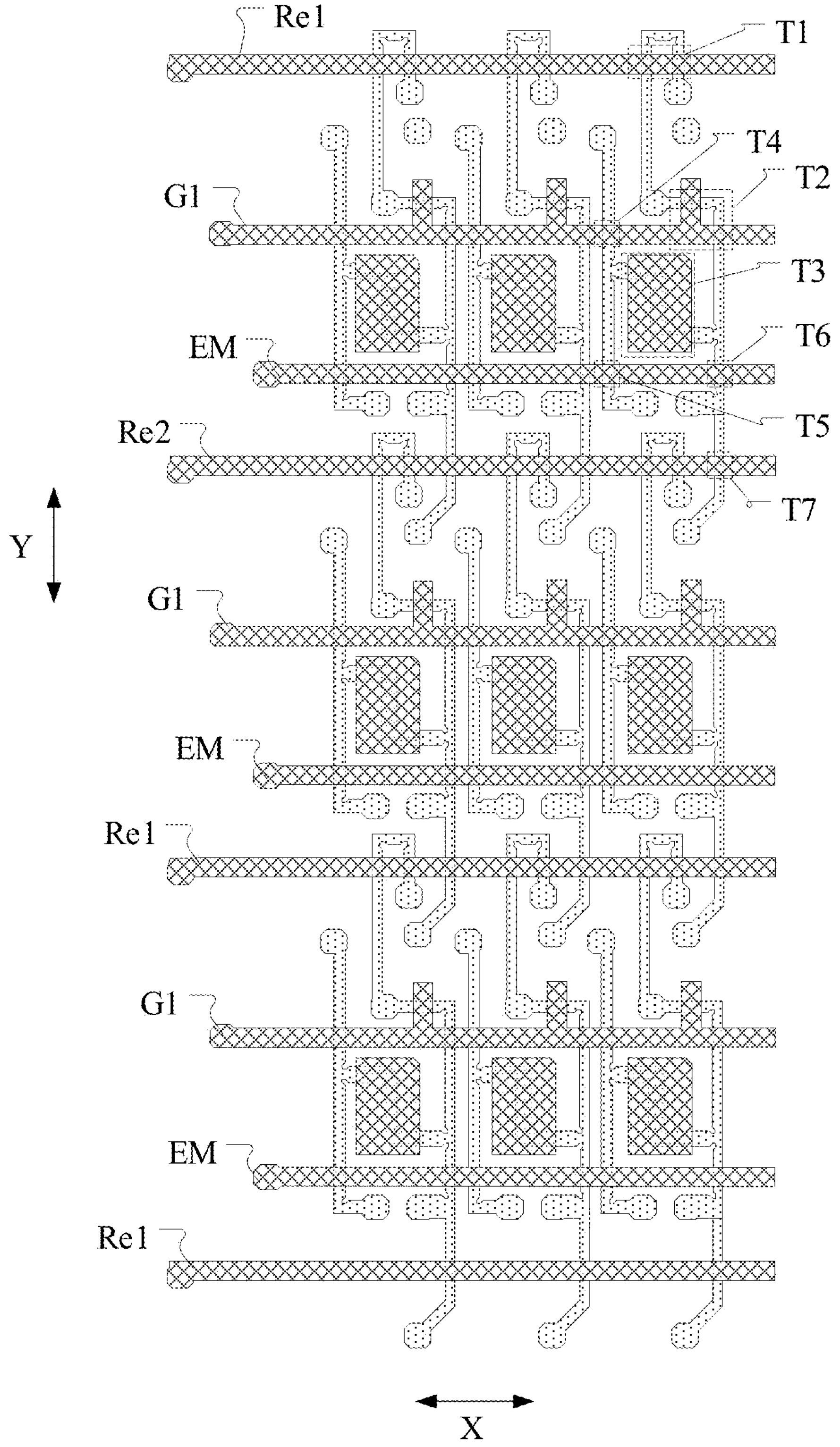
FIG. 31 is a structural layout of the active layer and the first conductive layer in FIG. 25.
Figure 32:
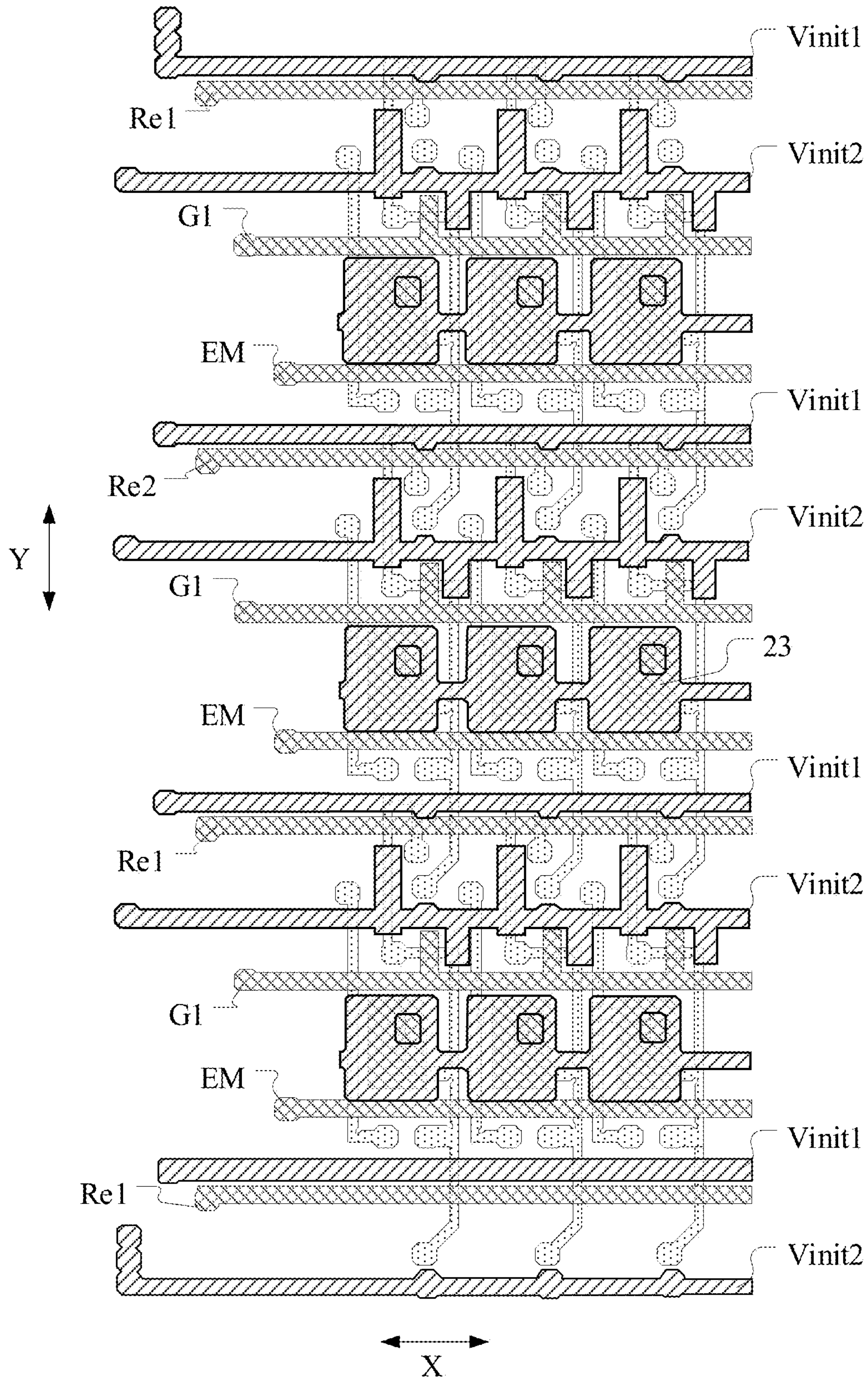
FIG. 32 is a structural layout of the active layer, the first conductive layer, and the second conductive layer in FIG. 25.
Figure 33:
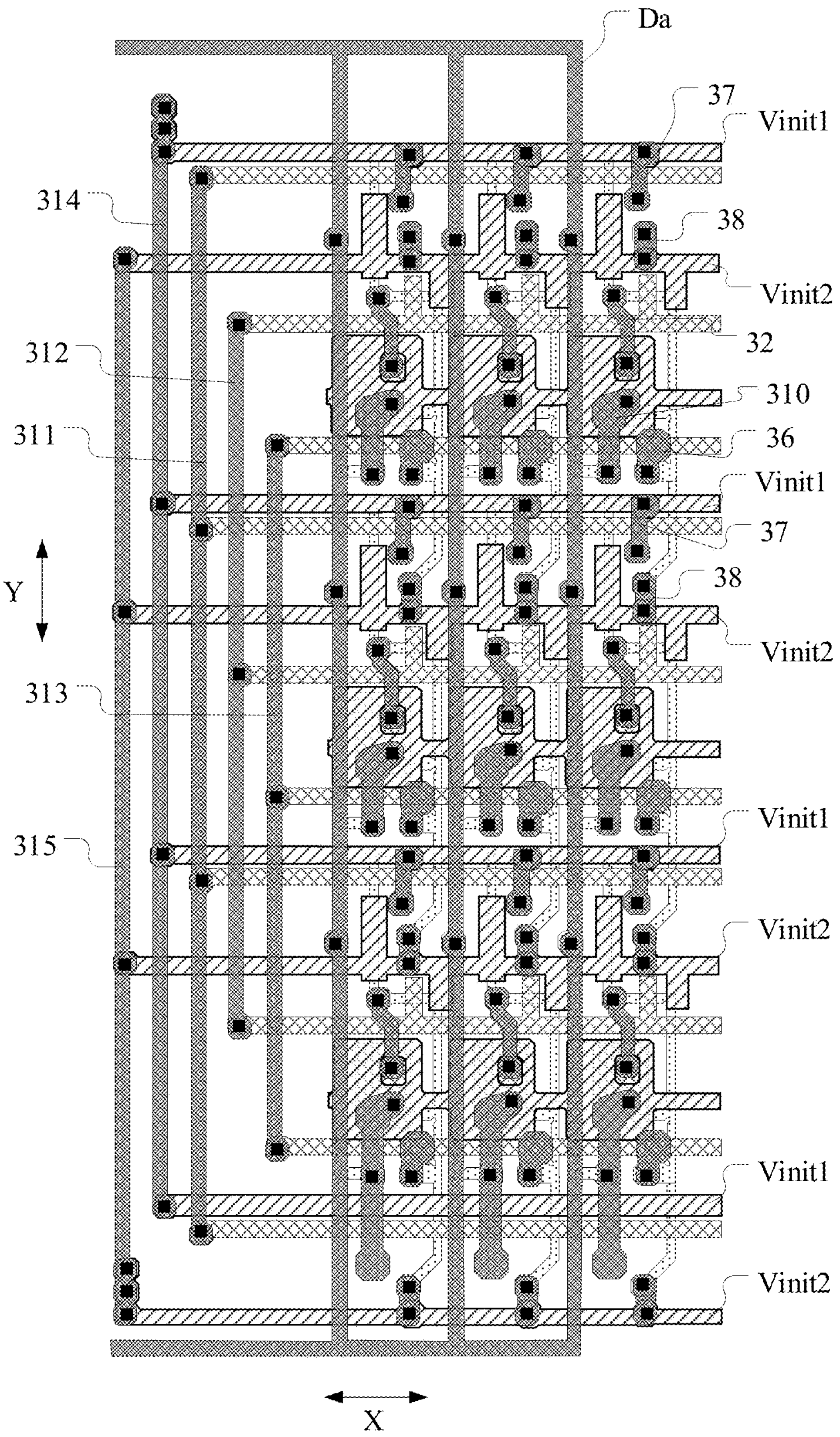
FIG. 33 is a structural layout of the active layer, the first conductive layer, the second conductive layer, and the third conductive layer in FIG. 25.

As shown in FIGS. 25 to 33, FIG. 25 is a structural layout of a display panel according to an example embodiment of the present disclosure. FIG. 26 is a structural layout of an active layer in FIG. 25. FIG. 27 is a structural layout a first conductive layer in FIG. 25. FIG. 28 is a structural layout of a second conductive layer in FIG. 25. FIG. 29 is a structural layout of a third conductive layer in FIG. 25. FIG. 30 is a structural layout of a fourth conductive layer in FIG. 25. FIG. 31 is a structural layout of the active layer and the first conductive layer in FIG. 25. FIG. 32 is a structural layout of the active layer, the first conductive layer and the second conductive layer in FIG. 25. FIG. 33 is a structural layout of the active layer, the first conductive layer, the second conductive layer, and the third conductive layer in FIG. 25. The display panel may include a plurality of pixel driving circuits. The only difference between the structure of the pixel driving circuit in the display panel shown in FIG. 25 and the structure of the pixel driving circuit shown in FIG. 24 is that the pixel driving circuit in the display panel shown in FIG. 25 includes nine pixel driving sub-circuits distributed in a 3×3 array.

As shown in FIGS. 25, 26 and 31, the active layer may include a first active portion 61, a second active portion 62, a plurality of third active portions 63, a fourth active portion 64, a fifth active portion 65, a sixth active portion 66, a seventh active portion 67, a tenth active portion 610, an eleventh active portion 611, a twelfth active portion 612, a thirteenth active portion 613, a fourteenth active portion 614, and a fifteenth active portion 615. The first active portion 61 is used to form a channel region of the first transistor T1. The second active portion 62 is used to form a channel region of the second transistor T2. The second transistor T2 is a dual-channel structure, and the second active portion 62 includes a first active sub-portion 621 and a second active sub-portion 622. The first active sub-portion 621 is used to form a first channel of the second transistor, and the second active sub-portion 622 is used to form a second channel of the second transistor T2. The active layer further includes a third active sub-portion 623. The third active sub-portion 623 is connected between the first active sub-portion 621 and the second active sub-portion 622. A third active portion 63 may be used to form a channel region of a driving transistor T3. The fourth active portion 64 may be used to form a channel region of the fourth transistor T4. The fifth active portion 65 may be used to form a channel region of the fifth transistor T5. The sixth active portion 66 may be used to form a channel region of the sixth transistor T6. The seventh active portion 67 may be used to form a channel region of the seventh transistor T7. The tenth active portion 610 is connected between the sixth active portion 66 and the seventh active portion 67. The eleventh active portion 611 is connected between the first active portion 61 and the second active portion 62. The twelfth active portion 612 is connected to an end of the seventh active portion 67 away from the sixth active portion 66. The thirteenth active portion 613 is connected to an end of the fourth active portion 64 away from the third active portion 63. The fourteenth active portion 614 is connected to an end of the first active portion 61 away from the second active portion 62. The fifteenth active portion 615 is connected to an end of the fifth active portion 65 away from the fourth active portion 64. The active layer may be formed of a polysilicon material, and accordingly, the first transistor T1, the second transistor T2, the driving transistors T3, the fourth transistor T4, the fifth transistor T5, the sixth transistor T6, and the seventh transistor T7 may be P-type low temperature polysilicon thin film transistors.

As shown in FIGS. 25, 27 and 31, the first conductive layer may include: a plurality of first conductive portions 11, a first gate line G1, an enable signal line EM, a first reset signal line Re1, and a second reset signal line Re2. The orthographic projection of the first gate line G1 on the base substrate, the orthographic projection of the enable signal line EM on the base substrate, the orthographic projection of the first reset signal line Re1 on the base substrate, and the orthographic projection of the second reset signal line Re2 on the base substrate may all extend along a first direction X. The first direction X intersects a second direction Y. For example, the first direction X may be a row direction, and the second direction Y may be a column direction. The first gate line G1 may be used to provide the first gate driving signal terminal. The enable signal line EM may be used to provide the enable signal terminal. The first reset signal line Re1 may be used to provide the first reset signal terminal. The second reset signal line Re2 may be used to provide the second reset signal terminal. The orthographic projection of the first gate line G1 on the base substrate covers the orthographic projections of the second active portion 62 and the fourth active portion 64 on the base substrate, and a partial structure of the first gate line G1 is used to form the gate electrode of the second transistor T2 and the gate electrode of the fourth transistor, respectively. The orthographic projection of the enable signal line EM on the base substrate covers the orthographic projection of the fifth active portion 65 on the base substrate and the orthographic projection of the sixth active portion 66 on the base substrate, and a partial structure of the enable signal line EM may be used to form the gate electrodes of the fifth transistor T5 and the sixth transistor T6, respectively. The orthographic projection of the first reset signal line Re1 on the base substrate covers the orthographic projection of the first active portion 61 on the base substrate, and a partial structure of the first reset signal line Re1 is used to form the gate electrode of the first transistor T1. The orthographic projection of the second reset signal line Re2 on the base substrate may cover the orthographic projection of the seventh active portion 67 on the base substrate, and a partial structure of the second reset signal line Re2 may be used to form the gate electrode of the seventh transistor T7. A first conductive portion 11 is arranged corresponding to a pixel driving sub-circuit, and the orthographic projection of the first conductive portion 11 on the base substrate covers the orthographic projection of a third active portion 63 in the corresponding pixel driving sub-circuit on the base substrate. The first conductive portions 11 may be used to form the gate electrodes of a plurality of driving transistors T3 and the first electrode of the capacitor C. As shown in FIG. 31, a first reset signal line Re1 for pixel driving circuits of the current row may be reused as a second reset signal line Re2 for pixel driving circuits of an adjacent previous row. This arrangement can improve the integration of the pixel driving circuits to reduce the layout area of the pixel driving circuits. In addition, the display panel may use the first conductive layer as a mask to perform a conductorization process on the active layer, that is, a region of the active layer covered by the first conductive layer may form a channel region of a transistor, and a region of the active layer not covered by the first conductive layer forms a conductor structure.

As shown in FIGS. 25, 28 and 32, the second conductive layer may include: a first initialization signal line Vinit1, a second initialization signal line Vinit2, and a third conductive portion 23. The orthographic projection of the first initialization signal line Vinit1 on the base substrate and the orthographic projection of the second initialization signal line Vinit2 on the base substrate extend along the first direction X. The first initialization signal line Vinit1 is used to provide the first initialization signal terminal. The second initialization signal line Vinit2 is used to provide the second initialization signal terminal. The orthographic projection of a second initialization signal line Vinit2 for pixel driving sub-circuits in a previous row on the base substrate is between the orthographic projection of a first reset signal line Re1 for pixel driving sub-circuits in the current row on the base substrate and the orthographic projection of a first gate line G1 for the pixel driving sub-circuits in the current row on the base substrate. The orthographic projection of the third conductive portion 23 on the base substrate at least partially overlaps with the orthographic projections of the first conductive portions 11 on the base substrate. The third conductive portion 23 is used to form the second electrode of the capacitor C. The second conductive layer may also include: a first protrusion 21 and a second protrusion 22. The first protrusion 21 is connected to the second initialization signal line Vinit2. The orthographic projection of the first protrusion 21 on the base substrate extends along the second direction Y, and the orthographic projection of the first protrusion 21 on the base substrate at least partially overlaps with the orthographic projection of the eleventh active portion 11 on the base substrate. The first protrusion 21 can stabilize the voltage of the eleventh active portion 611, thereby reducing the voltage fluctuation of the gate electrode of the driving transistor. The second protrusion 22 is connected to the second initialization signal line Vinit2. The orthographic projection of the second protrusion 22 on the base substrate extends along the second direction Y, and the orthographic projection of the second protrusion 22 on the base substrate at least partially overlaps with the orthographic projection of the third active sub-portion 623 on the base substrate. The second protrusion 22 can stabilize the voltage of the third active sub-portion 623, thereby addressing the problem of leakage to the source and drain electrodes of the second transistor T2 due to voltage fluctuations of the third active sub-portion 623.

As shown in FIGS. 25, 29 and 33, the third conductive layer may include a data line Da, a second bridge portion 32, a sixth bridge portion 36, a seventh bridge portion 37, an eighth bridge portion 38, and a tenth bridge portion 310. The orthographic projection of the data line Da on the base substrate extends along the second direction Y, and the data line Da is used to provide the data signal terminal. The data line Da may be connected to the thirteenth active portion 613 through a via hole (black square) to be connected to the first electrode of the fourth transistor T4. The second bridge portion 32 may be connected to the first conductive portion 11 and the eleventh active portion 611 through via holes respectively, so as to connect the gate electrode of the driving transistor T3 and the second electrode of the first transistor T1 and the first electrode of the second transistor T2. An opening 231 may be formed in the third conductive portion 23. The orthographic projection of a via hole connected between the first conductive portion 11 and the second bridge portion 32 on the base substrate may be located within the orthographic projection of the opening 231 on the base substrate, so that the via hole connected between the first conductive portion 11 and the second bridge portion 32 are insulated from the third conductive portion 23. The sixth bridge portion 36 may be connected to the tenth active portion 610 through a via hole to be connected with the second electrode of the sixth transistor T6. The seventh bridge portion 37 may be connected to the first initialization signal line Vinit1 and the fourteenth active portion through via holes respectively, so as to connect the first electrode of the first transistor and the first initialization signal terminal. The eighth bridge portion 38 may be connected to the twelfth active portion 612 and the second initialization signal line Vinit2 through via holes, respectively, to connect the first electrode of the seventh transistor T7 and the second initialization signal terminal. The tenth bridge portion 310 may be connected to the third conductive portion 23 and the fifteenth active portion 615 through via holes, respectively, to connect the second electrode of the capacitor and the first electrode of the fifth transistor.

As shown in FIGS. 25 and 30, the fourth conductive layer may include a first bridge portion 41 and a first power line sub-portion VDD. The first bridge portion 41 may be connected to all sixth bridge portions 36 in a same pixel driving circuit through via holes. The first bridge portion 41 may be used for connection with the first electrode of the light-emitting unit, so as to connect the second electrode of the sixth transistor and the first electrode of the light-emitting unit. The first power line sub-portion VDD includes a part whose orthographic projection on the base substrate extends along the second direction Y and a part whose orthographic projection on the base substrate extends along the first direction X. The first power line sub-portion VDD may be used to provide the first power terminal. The first power line sub-portion VDD may be connected to the tenth bridge portion 310 through a via hole to connect the first power terminal and the first electrode of the fifth transistor and the second electrode of the capacitor. The first power line sub-portion VDD includes a second conductive portion 42. The second conductive portion 42 may be arranged corresponding to a pixel driving sub-circuit. The orthographic projection of the second conductive portion 42 on the base substrate at least partially overlaps with the orthographic projection of a second bridge portion 32 in a corresponding pixel driving sub-circuit on the base substrate, and the second conductive portion 42 is connected to a tenth bridge portion 310 in the corresponding pixel driving sub-circuit through a via hole. The second conductive portion 42 can shield the noise interference of other signals on the second bridge portion 32, so as to improve the stability of the gate voltage of the driving transistor. In the same pixel driving circuit, second conductive portions 42 distributed in the first direction X may be connected, and the connected second conductive portions 42 can reduce the voltage of the first power line sub-portion VDD, thereby reducing the voltage drop of the power signal on the first power line sub-portion VDD.

Figure 34:
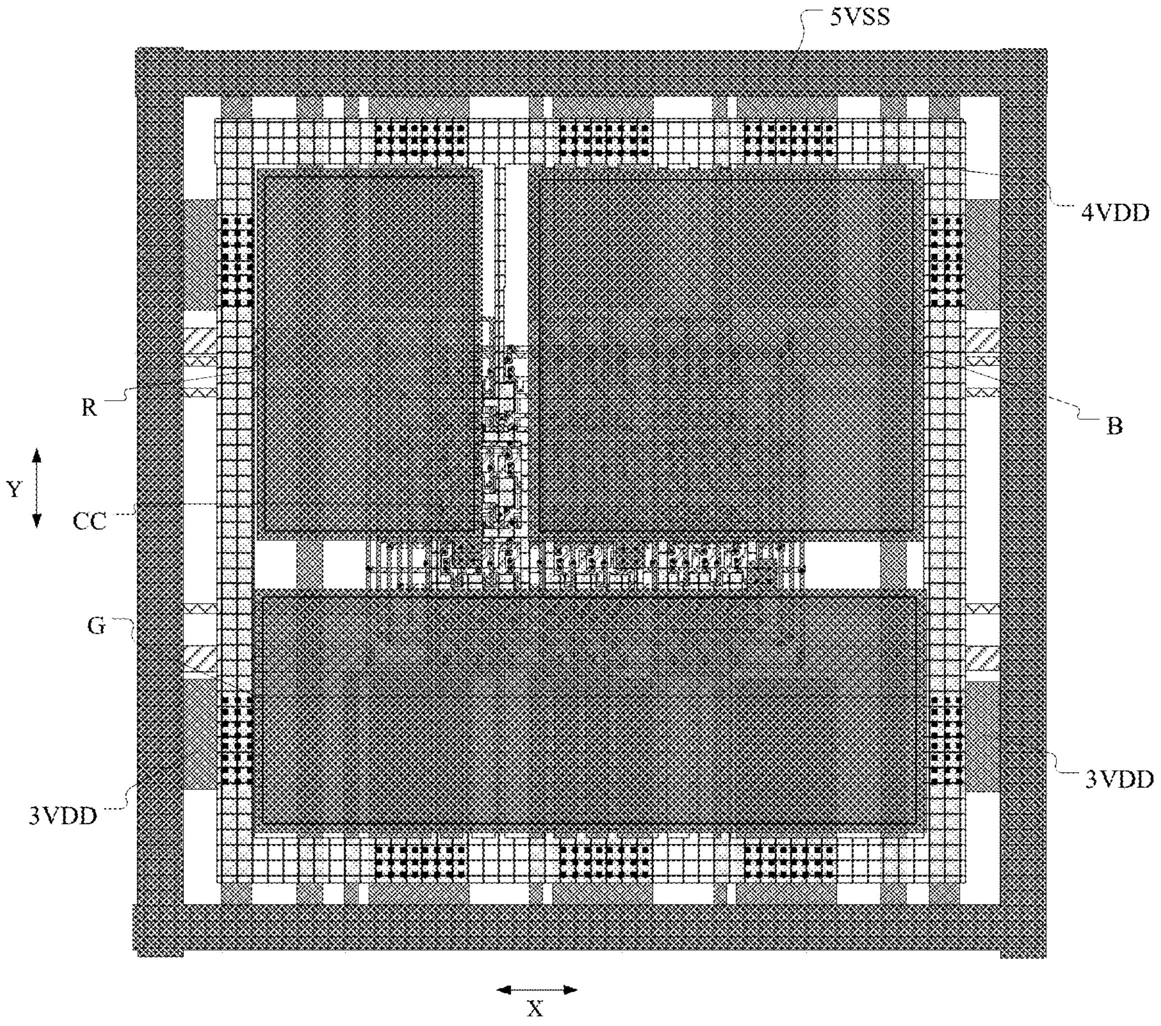
FIG. 34 is a structural layout of a display panel according to another example embodiment of the present disclosure.
Figure 35:
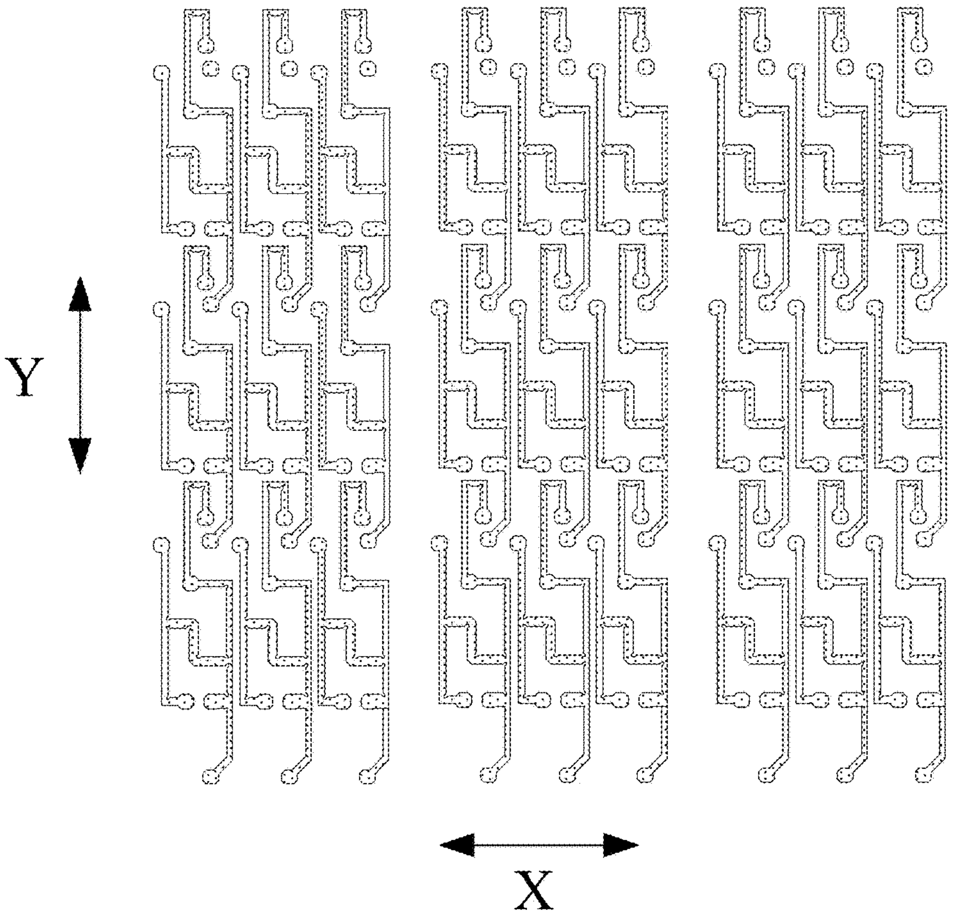
FIG. 35 is a structural layout of an active layer in FIG. 34.
Figure 36:
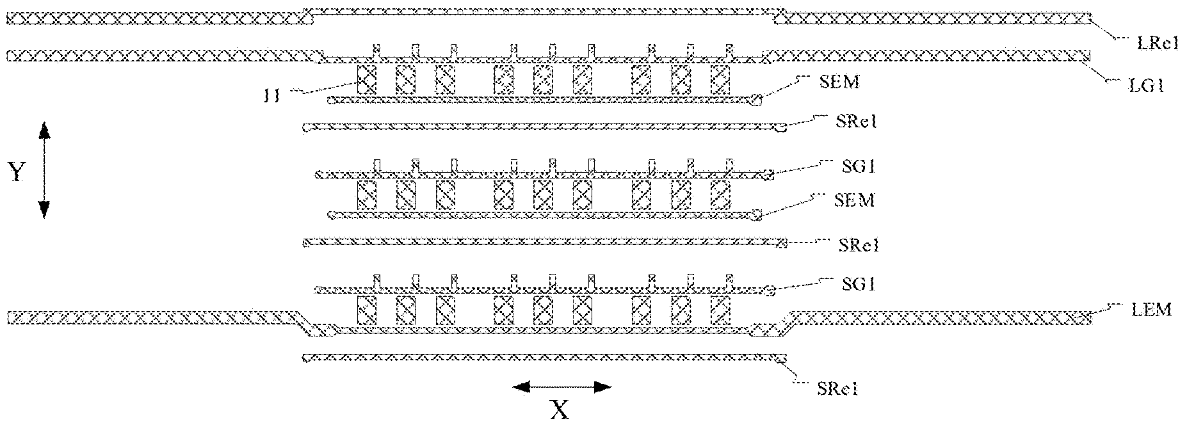
FIG. 36 is a structural layout of a first conductive layer in FIG. 34.
Figure 37:
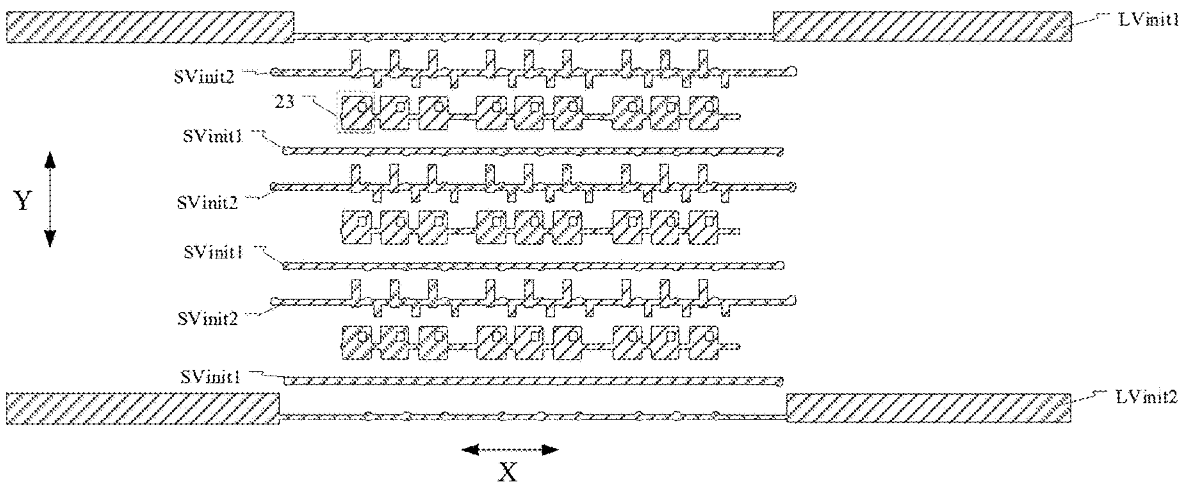
FIG. 37 is a structural layout of a second conductive layer in FIG. 34.
Figure 38:
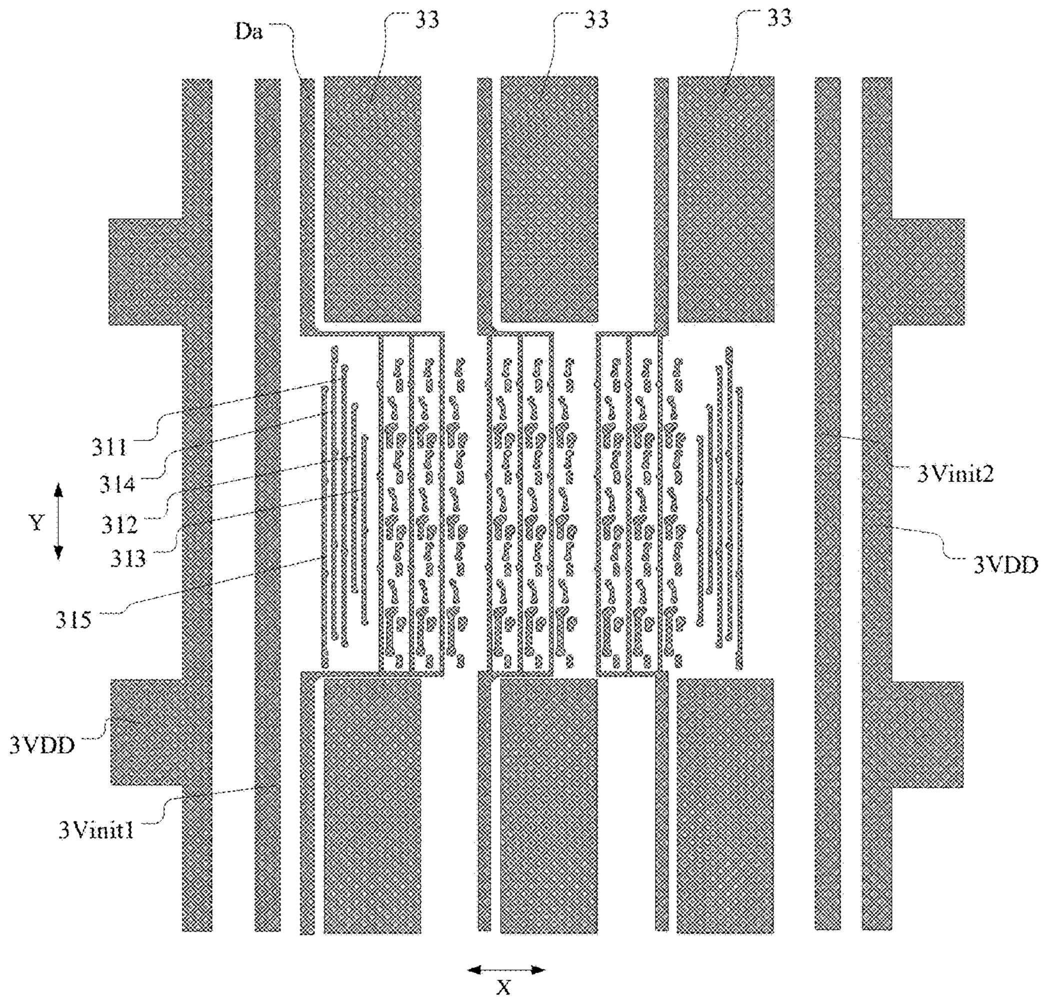
FIG. 38 is a structural layout of a third conductive layer in FIG. 34.
Figure 39:
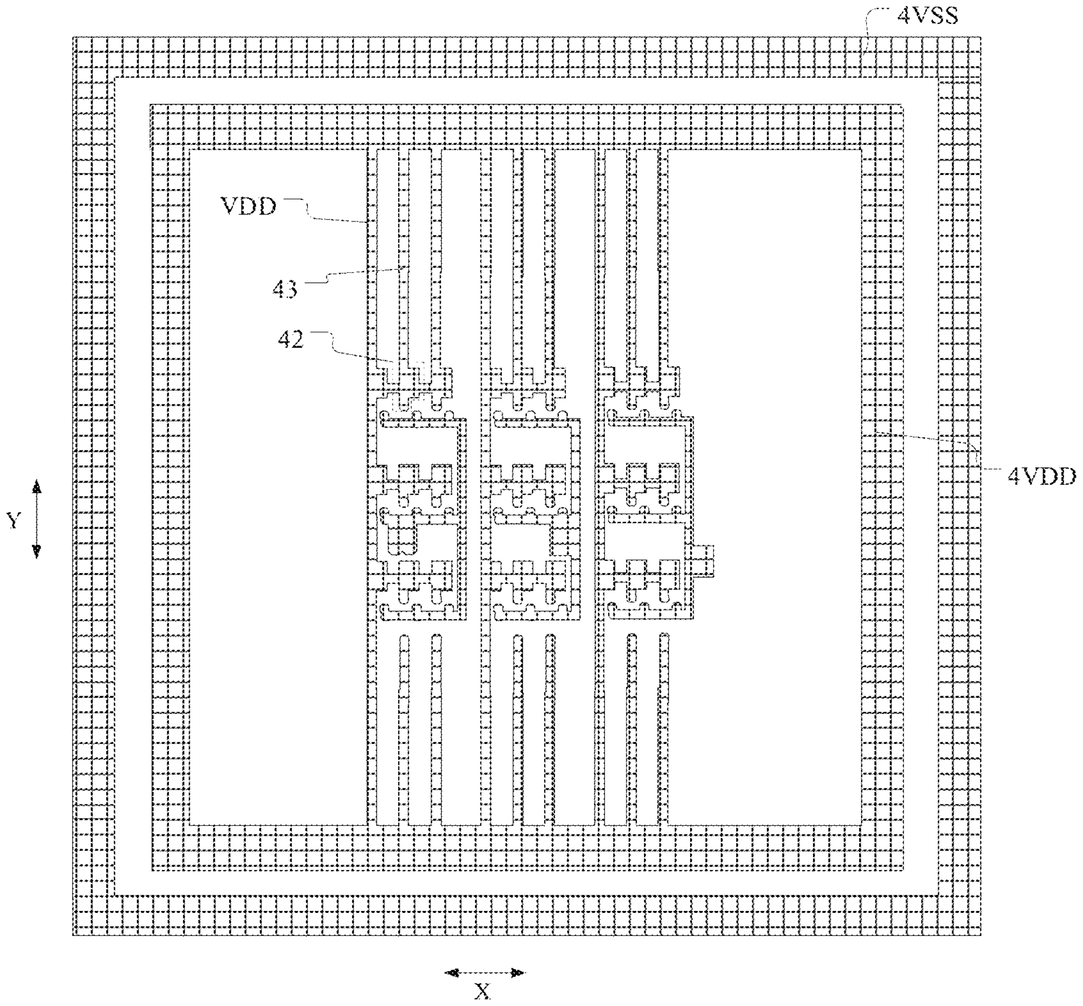
FIG. 39 is a structural layout of a fourth conductive layer in FIG. 34.
Figure 40:
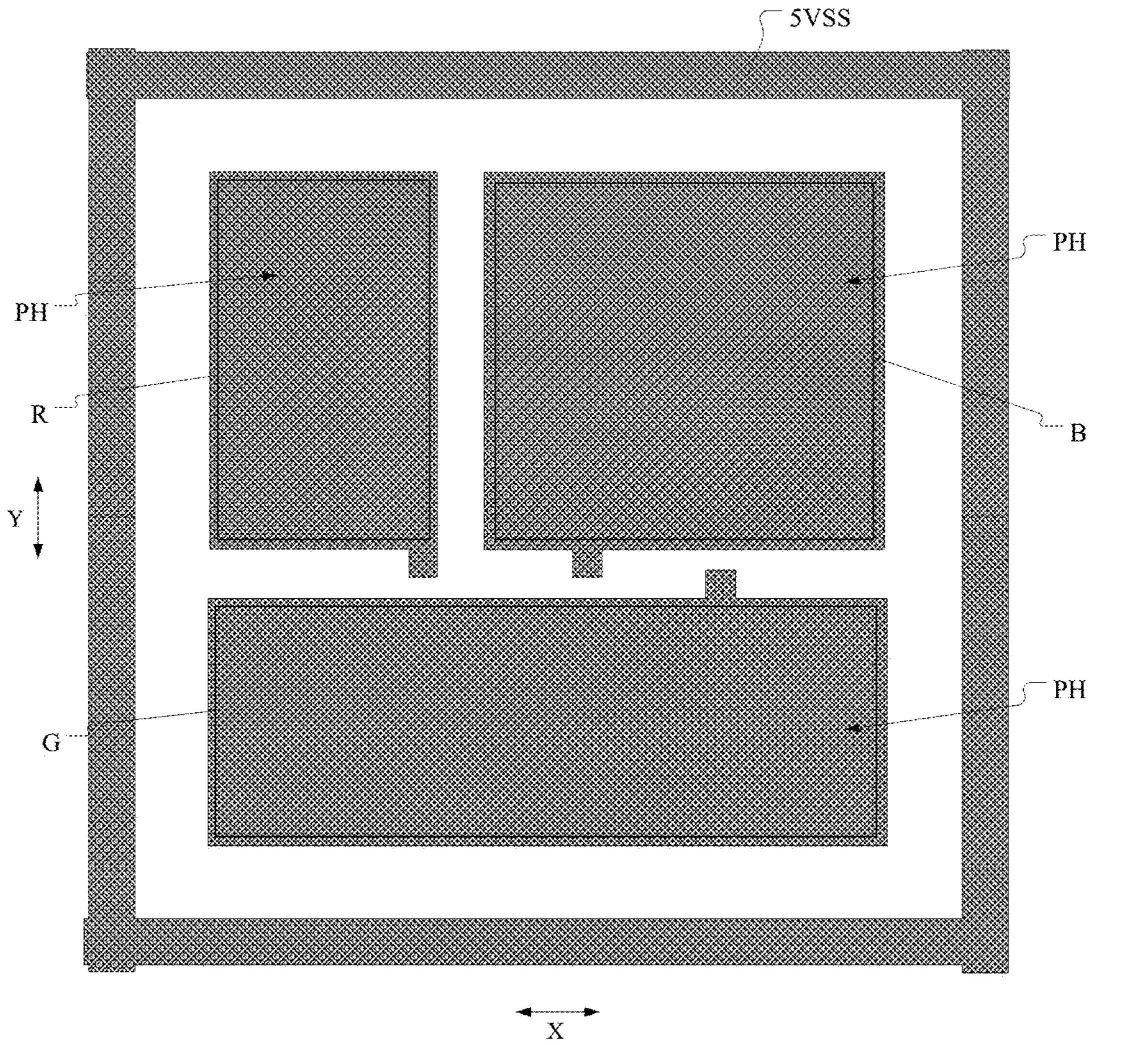
FIG. 40 is a structural layout of an electrode layer and a pixel definition layer in FIG. 34.
Figure 41:
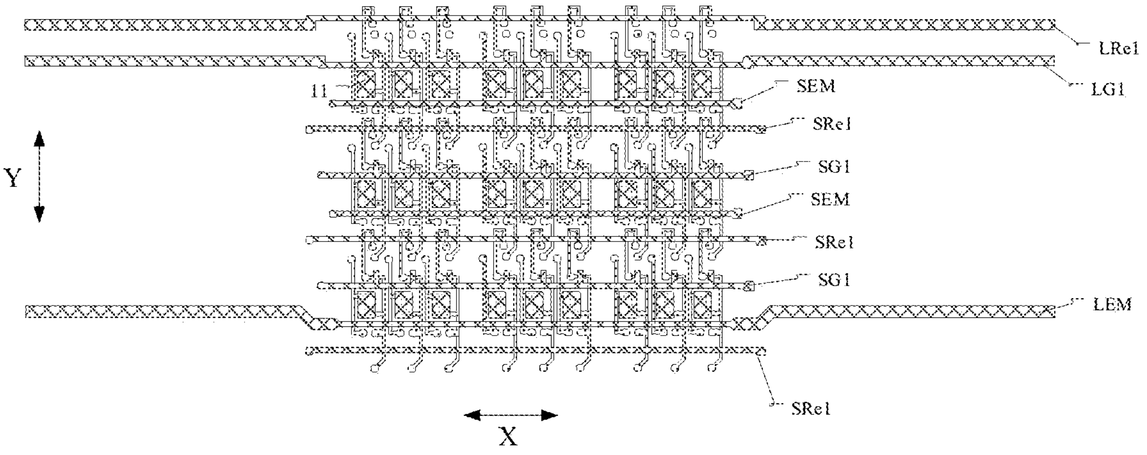
FIG. 41 is a structural layout of the active layer and the first conductive layer in FIG. 34.
Figure 42:
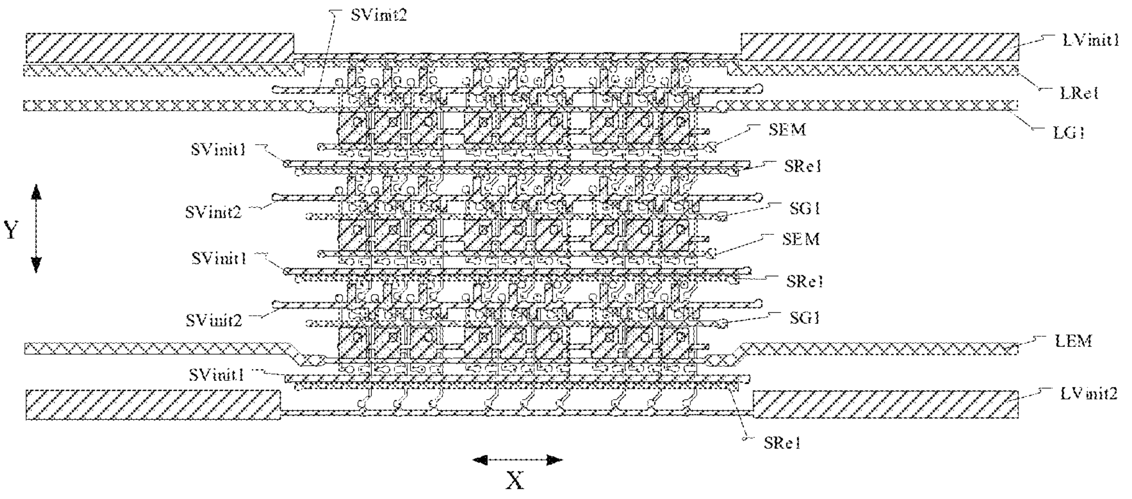
FIG. 42 is a structural layout of the active layer, the first conductive layer, and the second conductive layer in FIG. 34.
Figure 43:
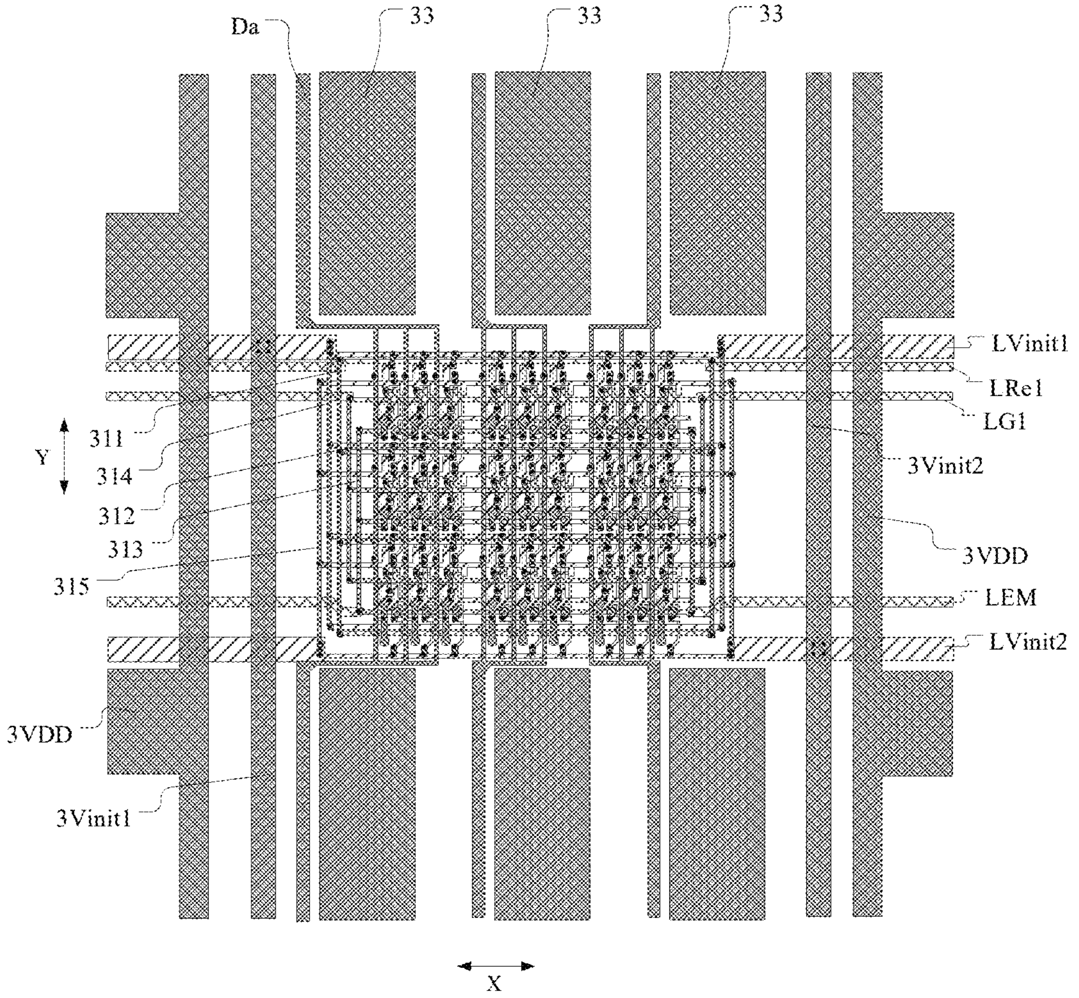
FIG. 43 is a structural layout of the active layer, the first conductive layer, the second conductive layer, and the third conductive layer in FIG. 34.
Figure 44:
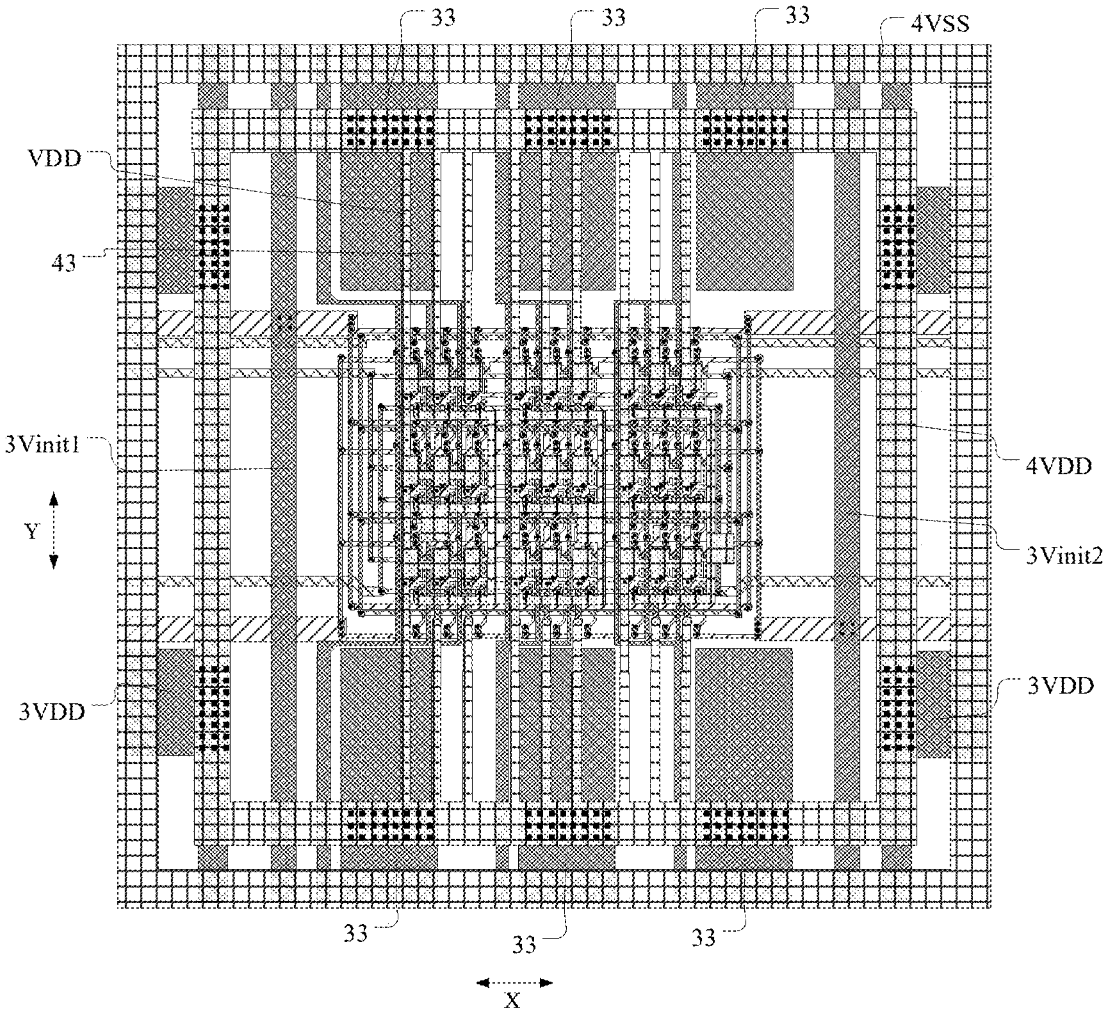
FIG. 44 is a structural layout of the active layer, the first conductive layer, the second conductive layer, the third conductive layer, and the fourth conductive layer in FIG. 34.

As shown in FIGS. 34 to 44, FIG. 34 is a structural layout of a display panel according to another example of the present disclosure. FIG. 35 is a structural layout of an active layer in FIG. 34. FIG. 36 is a structural layout of a first conductive layer in FIG. 34. FIG. 37 is a structural layout of a second conductive layer in FIG. 34. FIG. 38 is a structural layout of a third conductive layer in FIG. 34. FIG. 39 is a structural layout of a fourth conductive layer in FIG. 34. FIG. 40 is a structural layout of an electrode layer and a pixel definition layer in FIG. 34. FIG. 41 is a structural layout of the active layer and the first conductive layer in FIG. 34. FIG. 42 is a structural layout of the active layer, the first conductive layer and the second conductive layer in FIG. 34. FIG. 43 is a structural layout of the active layer, the first conductive layer, the second conductive layer and the third conductive layer in FIG. 34. FIG. 44 is a structural layout of the active layer, the first conductive layer, the second conductive layer, the third conductive layer and the fourth conductive layer in FIG. 34.

As shown in FIGS. 34 to 44, the display panel may include a plurality of pixel units, and the plurality of pixel units may distributed in an array along a first direction X and a second direction Y. FIG. 34 shows the layout structure of one pixel unit. Each pixel unit may include a plurality of pixel driving circuits distributed in the first direction X. In this example embodiment, each pixel unit may include three pixel driving circuits distributed in the first direction X. A pixel driving circuit in FIG. 34 may include all structural features of the pixel driving circuit shown in FIG. 25.

As shown in FIGS. 27, 31, 34, 36, 38, 41 and 42, a plurality of first reset signal lines include a first long reset signal line LRe1 and a first short reset signal line SRe1. The long reset signal line LRe1 is provided corresponding to pixel driving sub-circuits located in the same row. The first long reset signal line LRe1 is connected to pixel driving sub-circuits corresponding to the first long reset signal line LRe1. The first short reset signal line SRe1 is provided corresponding to pixel driving sub-circuits in the same row in a pixel driving circuit group. The first short reset signal line SRe1 is connected to the pixel driving sub-circuits corresponding to the first short reset signal line SRe1, and orthographic projections of a plurality of first short reset signal lines SRe1 corresponding to pixel driving sub-circuits in the same row on the base substrate are spaced apart in the row direction. A plurality of first gate lines include a first long gate line LG1 and a first short gate line SG1. The first long gate line LG1 is provided corresponding to pixel driving sub-circuits located in the same row. The first long gate line LG1 is connected to the pixel driving sub-circuits corresponding to the first long gate line LG1. The first short gate line SG1 is provided corresponding to pixel driving sub-circuits in the same row in a pixel driving circuit group. The first short gate line SGI is connected to pixel driving sub-circuits corresponding to the first short gate line. Orthographic projections of a plurality of first short gate lines SG1 corresponding to pixel driving sub-circuits in the same row on the base substrate are spaced apart in the row direction. A plurality of enable signal lines EM include a long enable signal line LEM and a short enable signal line SEM. The long enable signal line LEM is provided corresponding to pixel driving sub-circuits located in the same row. The long enable signal line LEM is connected to the pixel driving sub-circuits corresponding to the long enable signal line LEM. The short enable signal line SEM is provided corresponding to pixel driving sub-circuits in the same row in a pixel driving circuit group. The short enable signal line SEM is connected to pixel driving sub-circuits corresponding to the short enable signal line SEM. Orthographic projections of a plurality of short enable signal lines SEM corresponding to pixel driving sub-circuits in the same row on the base substrate are spaced apart in the row direction. The third conductive layer further includes a first connection line 311, a second connection line 312, and a third connection line 313. Orthographic projections of the first connection line 311, the second connection line 312 and the third connection line 313 on the base substrate extend along the second direction Y. The first connection lines 311 is connected to a first long reset signal line LRe1 and a first short reset signal line SRe1 through via holes respectively. The second connection line 312 is connected to a first long gate line LG1 and a first short gate line SG1 through via holes respectively. The third connection line 313 is connected to a long enable signal line through LEM and a short enable signal line SEM through via holes respectively.

As shown in FIGS. 28, 33, 34, 37, 39, 42 and 43, a plurality of first initialization signal lines include a first long initialization signal line LVinit1 and a first short initialization signal line SVinit1. The first long initialization signal line LVinit1 is provided corresponding to pixel driving sub-circuits located in the same row. The first long initialization signal line LVinit1 is connected to the pixel driving sub-circuits corresponding to the first long initialization signal line LVinit1. The first short initialization signal line SVinit1 is provided corresponding to pixel driving sub-circuits in the same row in a pixel driving circuit group. The first short initialization signal line SVinit1 is connected to the pixel driving sub-circuits corresponding to the first short initialization signal line SVinit1. Orthographic projections of a plurality of first short initialization signal lines SVinit1 corresponding to pixel driving sub-circuits in same row on the base substrate are spaced apart in the row direction. A plurality of second initialization signal lines include a second long initialization signal line Lvinit2 and a second short initialization signal line SVinit2. The second long initialization signal line Lvinit2 is arranged corresponding to pixel driving sub-circuits located in the same row. The second long initialization signal line LVinit2 is connected to the pixel driving sub-circuits corresponding to the second long initialization signal line LVinit2. The second short initialization signal line SVinit2 is arranged corresponding to pixel driving sub-circuits in the same row in a pixel driving circuit group. The second short initialization signal line SVinit2 is connected to the pixel driving sub-circuits corresponding to the second short initialization signal line SVinit2. Orthographic projections of a plurality of second short initialization signal lines SVinit2 corresponding to pixel driving sub-circuits in the same row on the base substrate are spaced apart in the row direction. The third conductive layer further includes a fourth connection line 314 and a fifth connection line 315. The fourth connection line 314 is connected to a first long initialization signal line LVinit1 and a first short initialization signal line SVinit1 through via holes respectively. The fifth connection lines 315 is connected to a second long initialization signal line Lvinit 2 and a second short initialization signal line Svinit 2 through via holes, respectively.

As shown in FIGS. 34, 38 and 43, three pixel driving circuits in the same pixel unit form a pixel driving circuit group. The third conductive layer may further include a first initialization connection line 3Vinit1 and a second initialization connection line 3Vinit2. Orthographic projections of the first initialization connection line 3Vinit1 and the second initialization connection line 3Vinit2 on the base substrate extend along the second direction Y. The first initialization connection line 3Vinit1 is arranged corresponding to a column of pixel driving circuit groups. The first initialization connection line 3Vinit1 is connected, through a via hole, to a first initialization connection line whose orthographic projection on the base substrate intersects an orthographic projection of the first initialization connection line 3Vinit1 on the base substrate. The first initialization connection line 3Vinit1 and the first initialization connection line form a grid structure to reduce the voltage drop of the signal on the first initialization signal line. The second initialization connection line 3Vinit2 is arranged corresponding to a column of pixel driving circuit groups. The second initialization connection line 3Vinit2 is connected, through a via hole, to a second initialization connection line whose orthographic projection on the base substrate intersects the orthographic projection of the second initialization connection line 3Vinit2 on the base substrate. The second initialization connection line 3Vinit2 and the second initialization connection line form a grid structure to reduce the voltage drop of the signal on the second initialization signal line. The orthographic projection of a pixel driving circuit group on the base substrate is located between the orthographic projections of a corresponding first initialization connection line 3Vinit1 and a corresponding second initialization connection line 3Vinit2 on the base substrate.

As shown in FIGS. 30, 34, 39 and 44, the fourth conductive layer may further include a first power connection line 4VDD. The orthographic projection of the first power connection line 4VDD on the base substrate is a ring-like shape. The first power connection line 4VDD is arranged corresponding to a pixel driving circuit group, and the orthographic projection of the pixel driving circuit group on the base substrate is located within the orthographic projection of the corresponding first power connection line 4VDD on the base substrate. The first power connection line 4VDD may be connected, through a via hole, to a first power line sub-portion VDD corresponding to the pixel driving circuit group. In this example embodiment, the ring shape refers to an image formed by lines connected end to end, and the ring-like shape may be a rectangle, a circle, a triangle, a polygon, etc. The fourth conductive layer may further have a first connection portion 43. An orthographic projection of the first connection portion 43 on the base substrate extends along the second direction Y. The first connection portion 43 is connected between a second conductive portion 42 and a first power connection line 4VDD which are adjacent in the second direction. The first connection portion 43 can further reduce the voltage drop of the power signal on the first power line VDD.

As shown in FIGS. 34, 38 and 43, the third conductive layer may further include: a plurality of third bridge portions 33. An orthographic projection of at least a part of a structure of a third bridge portion 33 on the base substrate is located between orthographic projections of two first power connection lines 4VDD which are adjacent in the second direction Y on the base substrate. A third bridge portion 33 may be connected, through via holes, to two first power connection lines adjacent to the third bridge portion 33. The third bridge portion 33 may be connected to first power connection line(s) 4VDD distributed in the second direction Y.

As shown in FIGS. 34, 38 and 43, the third conductive layer further includes a power bridge line 3VDD. An orthographic projection of the power bridge line 3VDD on the base substrate extends along the second direction Y. An orthographic projection of at least a part of the structure of the power bridge line 3VDD on the base substrate is located between orthographic projections of two adjacent first power connection lines 4VDD in the first direction X on the base substrate, and the power bridge line 3VDD is connected, through via holes, to the two first power connection lines 4VDD adjacent to the power bridge line 3VDD. The power bridge line 3VDD can enable first power connection lines 4VDD distributed in the first direction X to be connected with each other. The power bridge line 3VDD and the first power connection lines 4VDD can make the first power line VDD form a grid structure to reduce the voltage drop of the power signal on the first power line.

As shown in FIGS. 34 and 40, the electrode layer may include a plurality of electrode portions: a first electrode portion G, a second electrode portion B, and a third electrode portion R. Each electrode portion may be connected to a first bridge portion 41 through a via hole to connect to the second electrode of the sixth transistor. A plurality of pixel openings PH are formed in the pixel definition layer. The pixel openings PH are arranged corresponding to the electrode portions. An orthographic projection of a pixel opening PH on the base substrate coincides with an orthographic projection of a corresponding electrode portion on the base substrate. The first electrode portion G may be used to form an electrode portion of a green light-emitting unit in the display panel. The second electrode portion B may be used to form an electrode portion of a blue light-emitting unit in the display panel. The third electrode portion R may be used to form an electrode portion of a red light-emitting unit.

As shown in FIGS. 34, 39, 40 and 44, the fourth conductive layer may further include a second power connection line 4VSS. The second power connection line 4VSS and a first power connection line 4VDD are arranged correspondingly. An orthographic projection of the second power connection line 4VSS on the base substrate is a ring shape. An orthographic projection of a first power connection line 4VDD on the base substrate is located within an orthographic projection of a corresponding second power connection line 4VSS on the base substrate. The electrode layer may further include a first electrode ring 5VSS. An orthographic projection of the first electrode ring 5VSS on the base substrate is a ring shape. The first electrode ring 5VSS and a second power supply connection line 4VSS are arranged correspondingly, and is connected to the corresponding second power connection line 4VSS. The display panel may further include a common electrode layer. The common electrode layer is located at a side of the electrode layer away from the base substrate. The common electrode layer may be used to form the second electrode of the light-emitting unit. The second power connection line 4VSS may be connected to the common electrode layer through the first electrode ring 5VSS. The second power connection line 4VSS and the first electrode ring 5VSS can reduce the voltage drop of the power signal on the common electrode layer.

Figure 45:
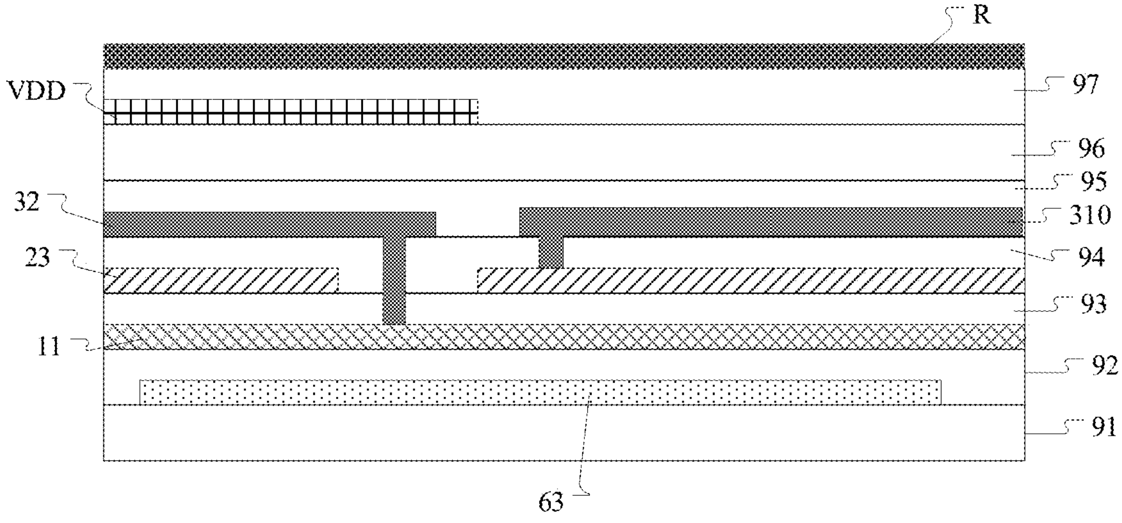
FIG. 45 is a partial cross-sectional view of the display panel shown in FIG. 34 taken along a dotted line CC.

As shown in FIG. 45, it is a partial cross-sectional view of the display panel shown in FIG. 34 taken along the dotted line CC. The display panel may further include a first insulating layer 92, a second insulating layer 93, a dielectric layer 94, a passivation layer 95, a first planarization layer 96, and a second planarization layer 97.The base substrate 91, the active layer, the first insulating layer 92, the first conductive layer, the second insulating layer 93, the second conductive layer, the dielectric layer 94, the third conductive layer, the passivation layer 95, the first planarization layer 96, the fourth conductive layer, the second planarization layer 97, and the electrode layer are stacked in sequence. The first insulating layer 92 and the second insulating layer 93 may include one or more layers of silicon oxide and silicon nitride layers. The dielectric layer 94 may include a silicon nitride layer. The materials of the first planarization layer 96 and the second planarization layer 97 may be organic materials, such as polyimide (PI), polyethylene terephthalate (PET), polyethylene naphthalate (PEN), silicon-glass bonding structure (SOG) and the like. The passivation layer 95 may be a silicon oxide layer. The base substrate 91 may include a glass substrate, a barrier layer, and a polyimide layer which are stacked in sequence. The barrier layer may be an inorganic material. The materials of the first conductive layer and the second conductive layer may be one of molybdenum, aluminum, copper, titanium and niobium or an alloy, or a molybdenum/titanium alloy or stacked layers of molybdenum/titanium, etc. The materials of the third conductive layer and the fourth conductive layer may include a metal material, such as one of molybdenum, aluminum, copper, titanium, and niobium or an alloy, or a molybdenum/titanium alloy or stacked layers of molybdenum/titanium, etc., or stacked layers of titanium/aluminum/titanium. The electrode layer may include an indium tin oxide layer or a silver layer. The square resistance of any one of the first conductive layer and the second conductive layer may be greater than the square resistance of any one of the third conductive layer and the fourth conductive layer.

Figure 46:
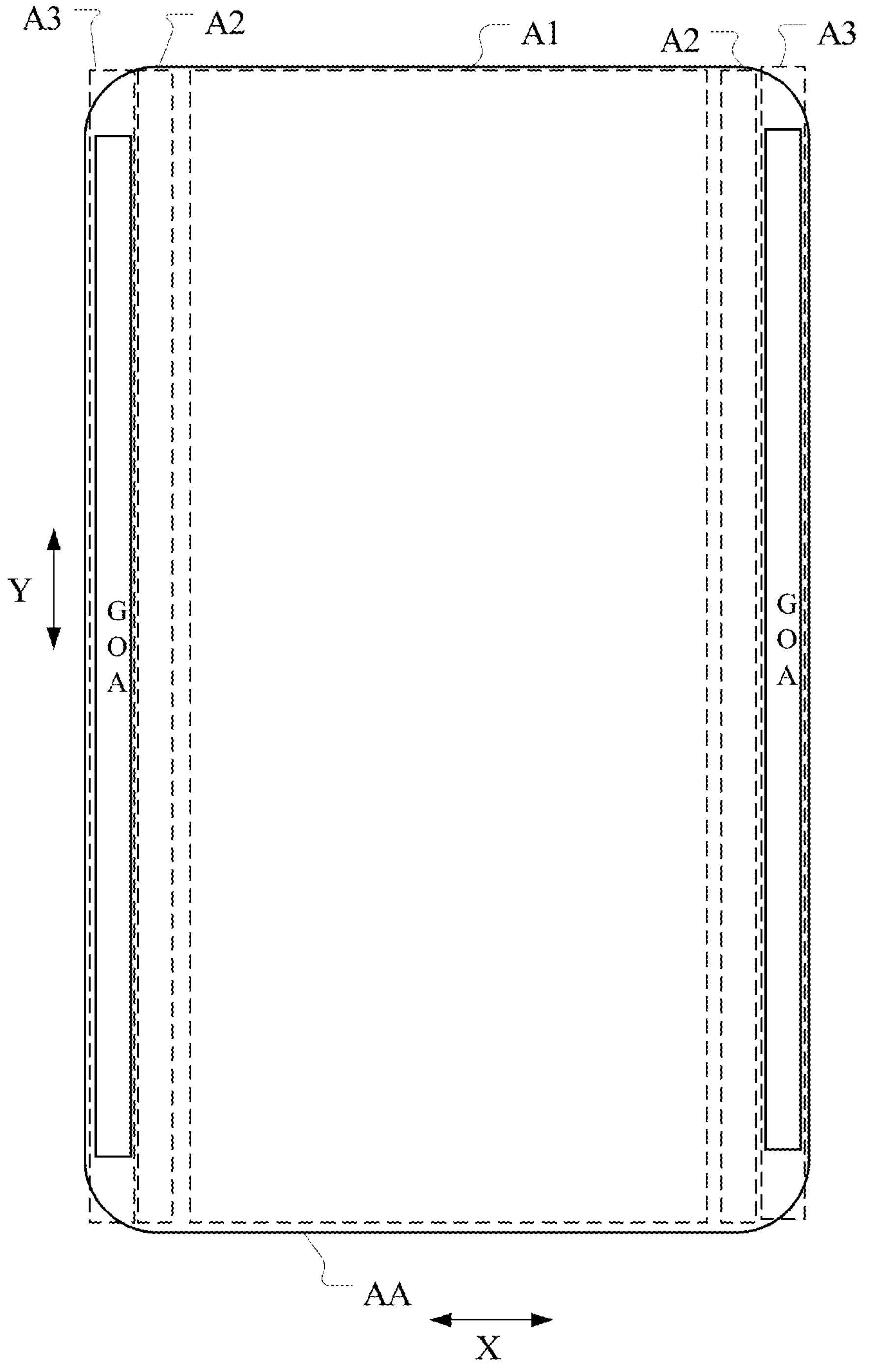
FIG. 46 is a schematic structural diagram of a display panel according to an example embodiment of the present disclosure.

As shown in FIG. 46, it is a schematic diagram of the structure of a display panel according to an example of the present disclosure. The display region AA of the display panel may include a normal display region A1, a compression region A2, and an integration region A3. The compression region A2 is located at a side of the normal display region A1 in the first direction X, and the integration region A3 is located at a side of the compression region A2 away from the normal display region A1. A pixel unit located in the normal display region A1 is a first pixel unit, and a pixel unit located in the compression region A2 is a second pixel unit. Pixel driving circuits in the first pixel unit form a first pixel driving circuit group. Pixel driving circuits in the second pixel unit form a second pixel driving circuit group. The layout structure of the first pixel unit may be as shown in FIG. 12 or FIG. 34. The compression region A2 in the display panel may be provided with one or more columns of pixel units. The integration region A3 may be used to integrate a gate driving circuit GOA.

Figure 47:
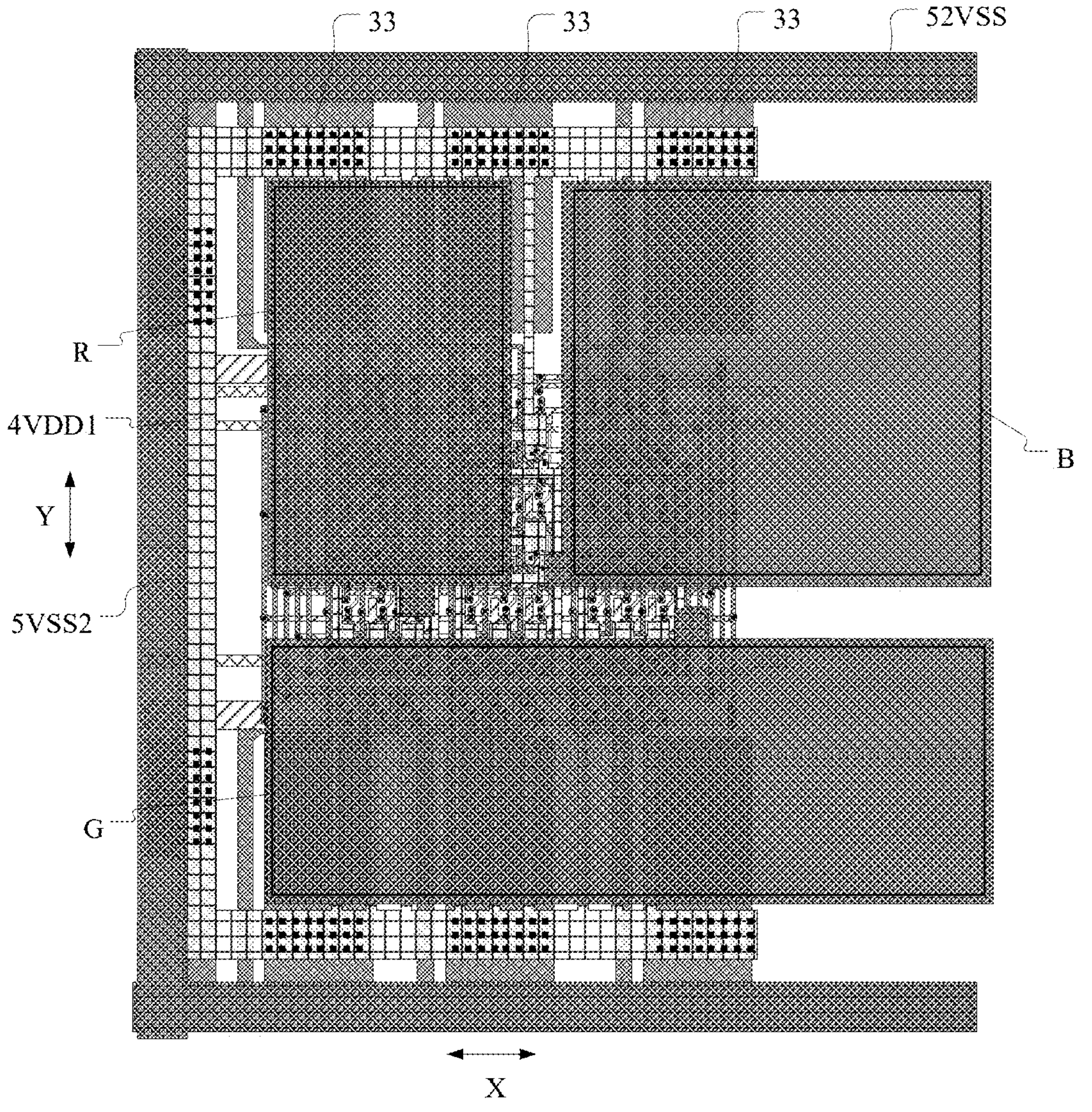
FIG. 47 is a structural layout of a second pixel unit on the right side of FIG. 46.
Figure 48:
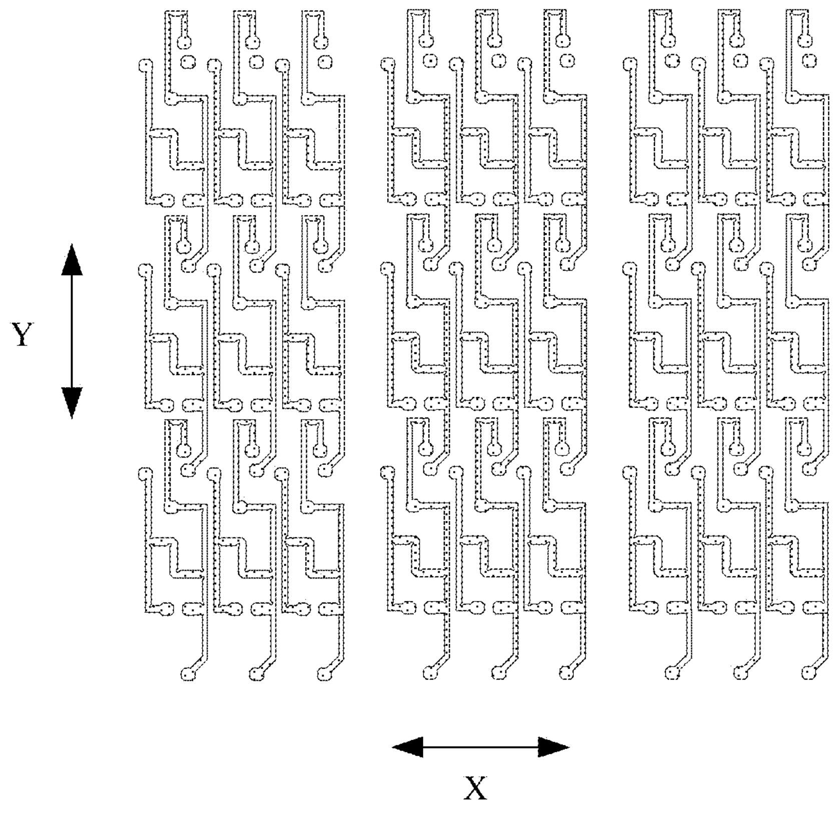
FIG. 48 is a structural layout of an active layer in FIG. 47.
Figure 49:
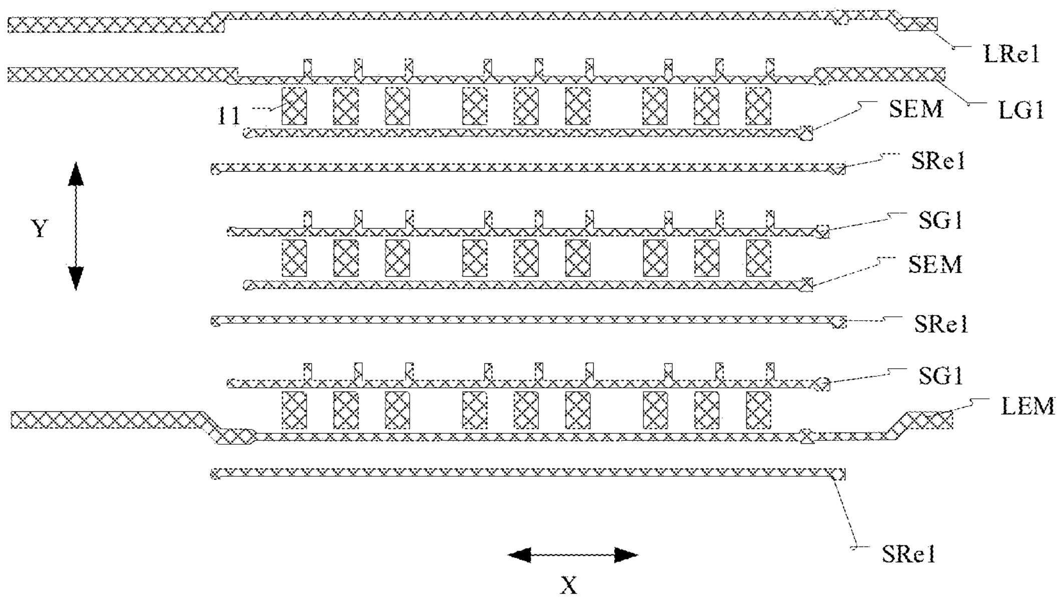
FIG. 49 is a structural layout of a first conductive layer in FIG. 47.
Figure 50:
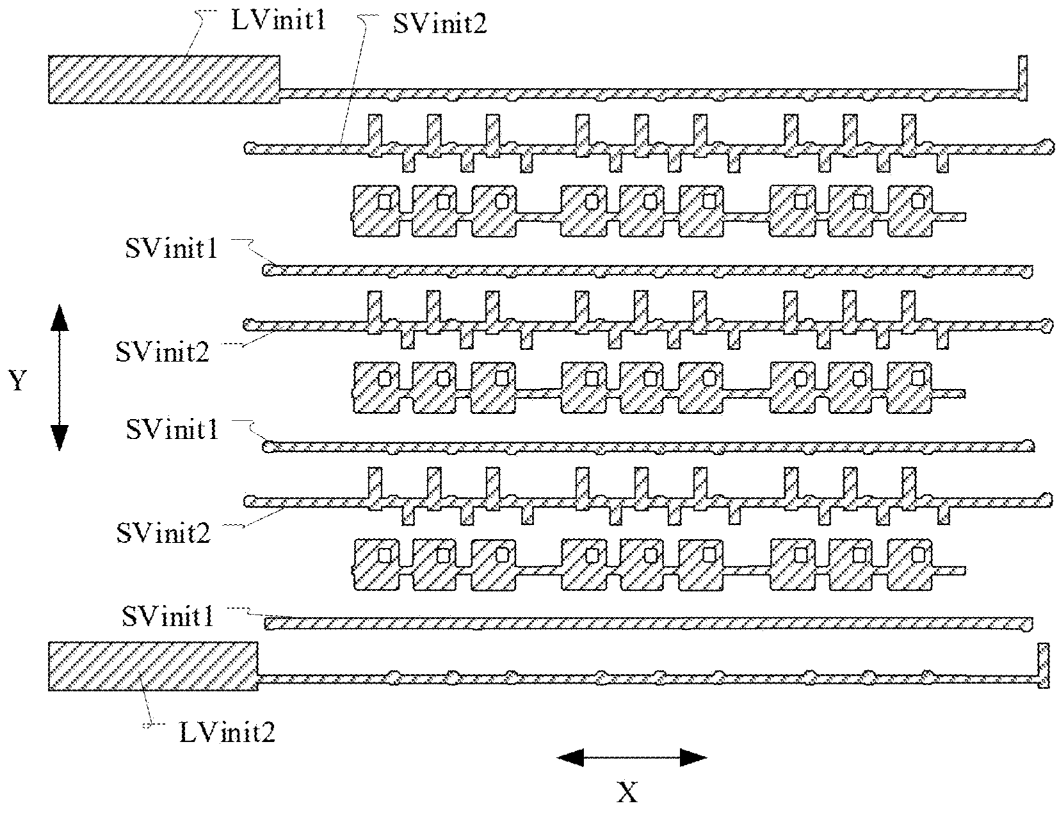
FIG. 50 is a structural layout of a second conductive layer in FIG. 47.
Figure 51:
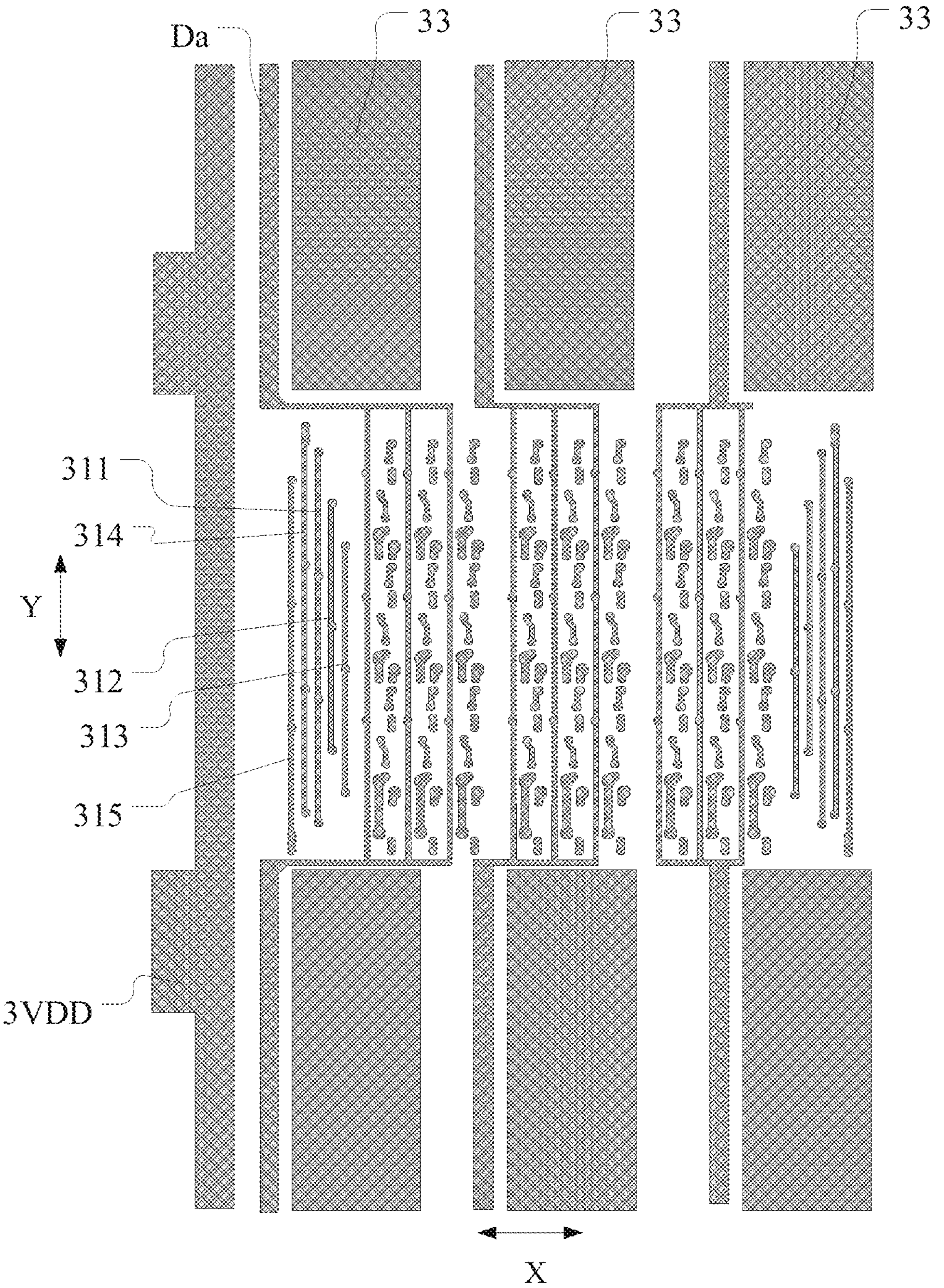
FIG. 51 is a structural layout of a third conductive layer in FIG. 47.
Figure 52:
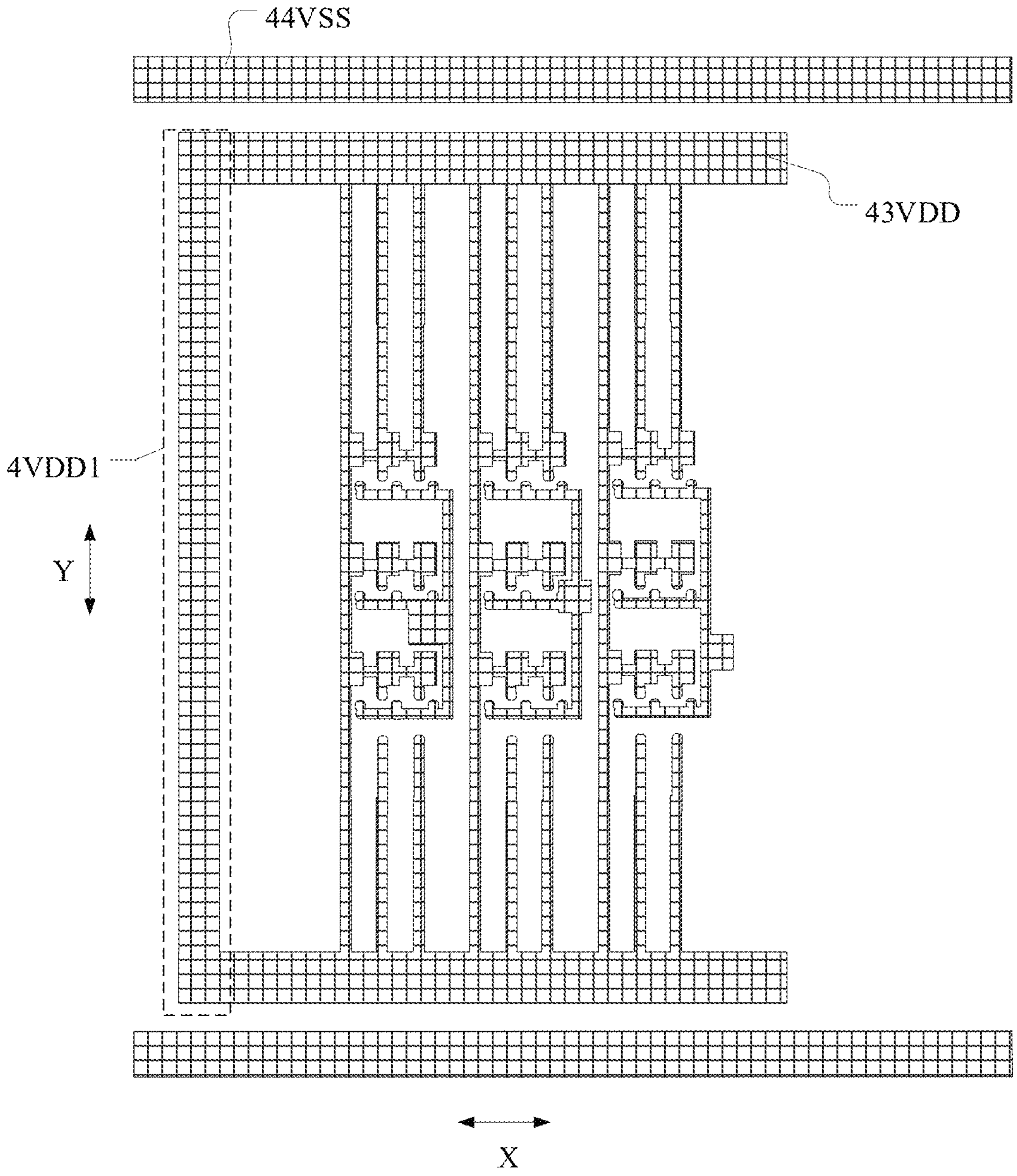
FIG. 52 is a structural layout of a fourth conductive layer in FIG. 47.
Figure 53:
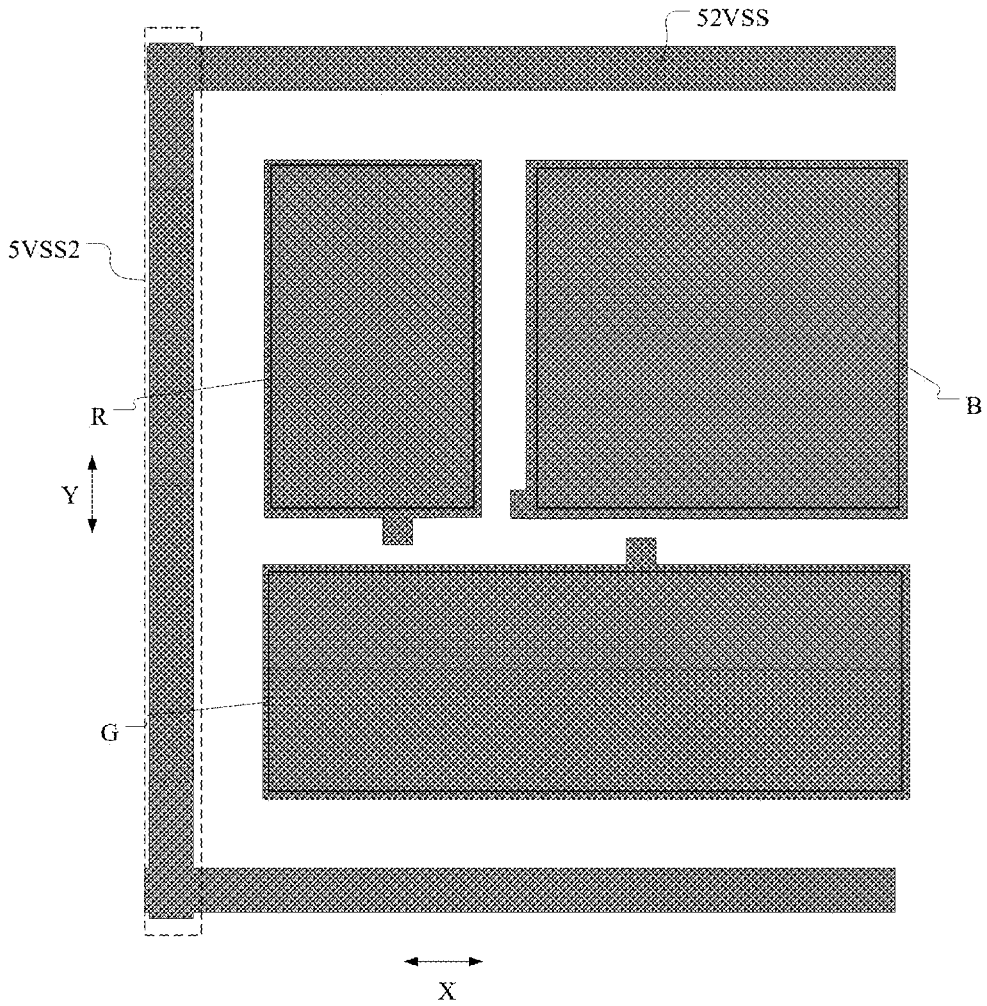
FIG. 53 is a structural layout of an electrode layer and a pixel definition layer in FIG. 47.
Figure 54:
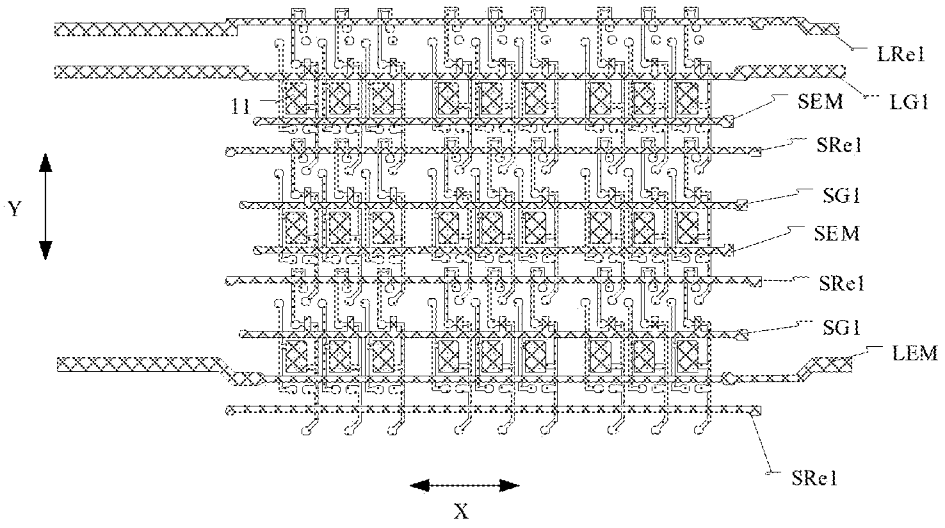
FIG. 54 is a structural layout of the active layer and the first conductive layer in FIG. 47.
Figure 55:
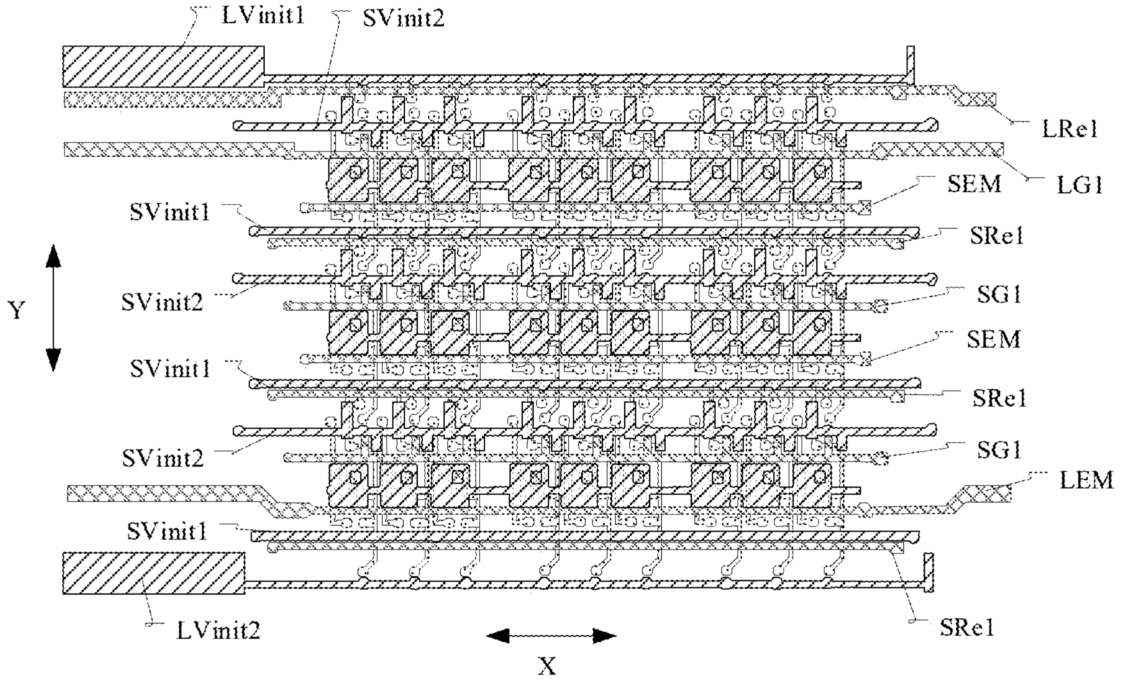
FIG. 55 is a structural layout diagram of the active layer, the first conductive layer, and the second conductive layer in FIG. 47.
Figure 56:
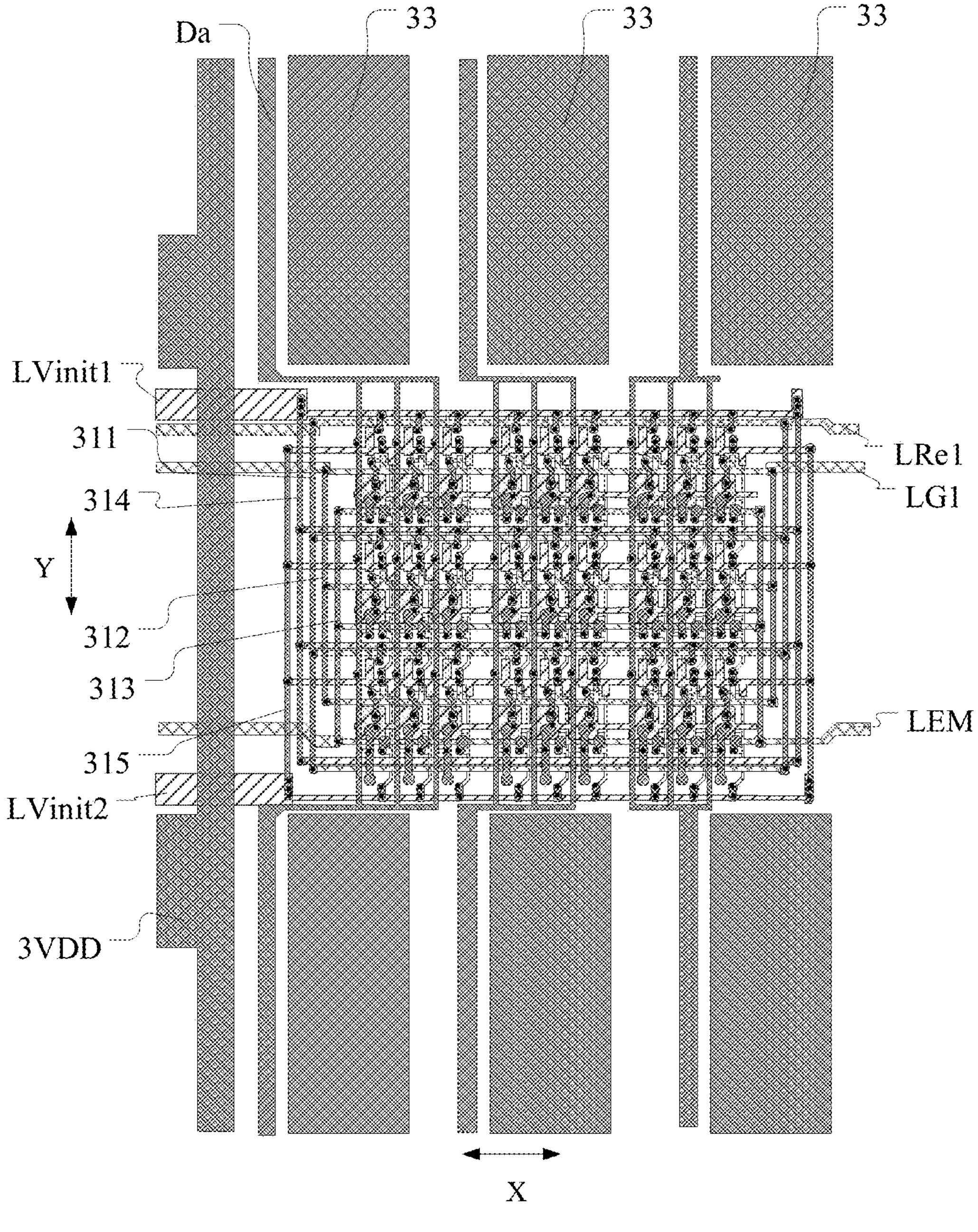
FIG. 56 is a structural layout of the active layer, the first conductive layer, the second conductive layer, and the third conductive layer in FIG. 47.
Figure 57:
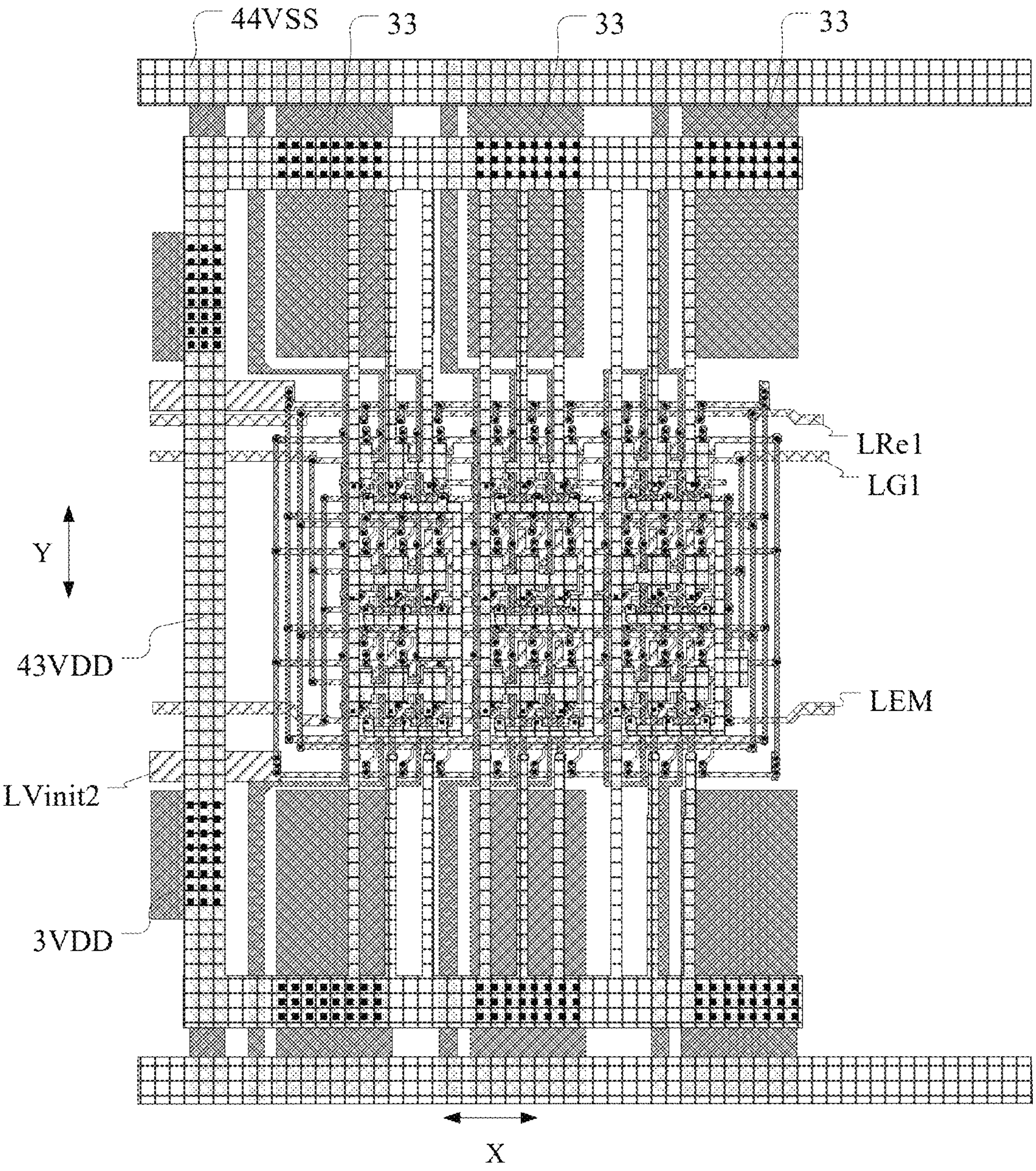
FIG. 57 is a structural layout of the active layer, the first conductive layer, the second conductive layer, the third conductive layer, and the fourth conductive layer in FIG. 47.

As shown in FIGS. 47 to 57, FIG. 47 is a structural layout of a second pixel unit on the right side in FIG. 46. FIG. 48 is a structural layout of an active layer in FIG. 47. FIG. 49 is a structural layout of a first conductive layer in FIG. 47. FIG. 50 is a structural layout of a second conductive layer in FIG. 47. FIG. 51 is a structural layout of a third conductive layer in FIG. 47. FIG. 52 is a structural layout of a fourth conductive layer in FIG. 47. FIG. 53 is a structural layout of an electrode layer and a pixel definition layer in FIG. 47. FIG. 54 is a structural layout of the active layer and the first conductive layer in FIG. 47. FIG. 55 is a structural layout of the active layer, the first conductive layer and the second conductive layer in FIG. 47. FIG. 56 is a structural layout of the active layer, the first conductive layer, the second conductive layer, and the third conductive layer in FIG. 47. FIG. 57 is a structural layout of the active layer, the first conductive layer, the second conductive layer, the third conductive layer, and the fourth conductive layer in FIG. 47.

The main differences between the second pixel unit and the first pixel unit are as follows.

A first initialization connection line and a second initialization connection line are not arranged in the second pixel unit.

A power bridge line 3VDD is not provided at a side of the second pixel unit close to the integration region A3.

In the second pixel unit, the first power connection line 4VDD is replaced with a third power connection line 43VDD, and the third power connection line 43VDD opens at a side close to the integration region A3.

In the second pixel unit, the second power connection line 4VSS is replaced with a fourth power connection line 44VSS, and the fourth power connection line 44VSS opens on both sides in the first direction X.

The third power connection line 43VDD includes a first side 4VDD1. An orthographic projection of the first side 4VDD1 on the base substrate extends along the second direction Y and is located at a side of a corresponding second pixel driving circuit group in the first direction X. A distance in the first direction X between an orthographic projection of a first power connection line 4VDD in a first pixel unit on the base substrate and an orthographic projection of a first pixel driving circuit group on the base substrate is greater than a distance in the first direction X between an orthographic projection of the first side 4VDD1 on the base substrate and an orthographic projection of the second pixel driving circuit group on the base substrate.

In the second pixel unit, the first electrode ring 5VSS is replaced with a second electrode line 52VSS, and the second electrode line 52VSS opens at a side close to the integrated region A3.

The second electrode line 52VSS includes a second side 5VSS2. An orthographic projection of at least a part of a structure of the second side 5VSS2 on the base substrate is located at a side of the orthographic projection of the first side 4VDD1 on the base substrate away from the orthographic projection of the second pixel driving circuit group on the base substrate. A distance in the first direction X between the orthographic projection of the first side 4VDD1 on the base substrate and the orthographic projection of the second side 5VSS2 on the base substrate is smaller than a distance in the first direction X between the orthographic projection of the first electrode ring 5VSS on the base substrate and the orthographic projection of the first power connection line 4VDD on the base substrate. As shown in FIG. 47, the orthographic projection of the first side 4VDD1 on the base substrate intersects the orthographic projection of the second side 5VSS2 on the base substrate, and a distance in the first direction between the orthographic projection of the first side 4VDD1 on the base substrate and the orthographic projection of the second side 5VSS2 on the base substrate is 0.

The above-mentioned differentiating arrangement can reduce the size of the pixel circuit layer (including the active layer, the first conductive layer, the second conductive layer, the third conductive layer, and the fourth conductive layer) in the second pixel unit in the first direction, thereby leaving space for the integrated region A3 where the gate driving circuit GOA is arranged. The integrated region A3 is provided with a light-emitting unit.

The layout structure of the second pixel unit on the left side of the display panel shown in FIG. 46 may be the same as or similar to the layout structure of the pixel unit on the right side.

It should be noted that, as shown in FIGS. 3, 11, 12, 21, 22, 25, 33, 34, 43, 44, 47, 56 and 57, the black squares drawn at a side of the third conductive layer away from the base substrate represent via holes for the third conductive layer to connect with other layers at a side facing the base substrate; the black squares drawn at a side of the fourth conductive layer away from the base substrate represent via holes for the fourth conductive layer to connect with other layers at a side facing the base substrate; the black squares drawn at a side of the electrode layer away from the base substrate represent via holes for the electrode layer to connect with other layers at a side facing the base substrate. The black squares represent the positions of the via holes. Different via holes represented by black squares at different positions can penetrate different insulating layers.

It should be noted that scale of the drawings in the present disclosure can be used as a reference in actual processes, but the present disclosure is not limited the scale of the drawings. For example, the width-to-length ratios of channels, the thicknesses and spacing of respective film layers, or the widths and spacing of respective signal lines can be adjusted according to actual needs. The number of pixels in the display substrate and the number of sub-pixels in each pixel are not limited to the number shown in the drawings. The drawings described in the present disclosure are only structural schematic diagrams. In addition, qualifier words such as "first", "second" are only used to define different structural names, and they do not mean a specific order and quantity. In example embodiments, an orthographic projection of a certain structure on the base substrate extends in a certain direction, which can be understood as the orthographic projection of the structure on the base substrate extending along a straight line or extending in a bent manner. A transistor refers to an element including at least three terminals: a gate electrode, a drain electrode and a source electrode. The transistor has a channel region between the drain (drain terminal, drain region or drain electrode) and the source (source terminal, source region or source electrode), and the current can flow through the drain electrode, the channel region and the source electrode. In example embodiments, the channel region refers to a region where the current mainly flows. In example embodiments, a first electrode may be a drain electrode and a second electrode may be a source electrode, or the first electrode may be a source electrode and the second electrode may be a drain electrode. In the case of using a transistor with opposite polarities or when the current direction changes during circuit operation, the functions of the "source electrode" and the "drain electrode" are sometimes interchanged. Therefore, in example embodiments, the "source electrode" and the "drain electrode" may be interchanged. In addition, the gate electrode may also be referred to as a control electrode.

An example embodiment further provides a display device, which includes the above-mentioned display panel. The display device can be a display device such as a mobile phone, a tablet computer, a television, etc.

Those skilled in the art will readily appreciate other embodiments of the present disclosure after considering the specification and practicing what is disclosed herein. The present disclosure is intended to cover any variations, uses, or adaptations of the present disclosure that follow the general principles of the present disclosure and include common knowledge or customary technical means in the art that are not disclosed in the present disclosure. The specification and embodiments are to be considered as exemplary only, and the true scope and spirit of the present disclosure are indicated by the claims.

The drawings in the present disclosure only refer to the structures involved herein, and for other structures, reference may be made to common designs. If there is no conflict, the embodiments of the present disclosure and the features in the embodiments may be combined with each other to obtain new embodiments. Those of ordinary skill in the art should understand that the technical solutions of the present disclosure can be modified or equivalently substituted without departing from the spirit and scope of the technical solutions of the present disclosure, and all such modification and substitutions should fall within the scope of the claims of the present disclosure.

It is to be understood that the present disclosure is not limited to the precise structures described above and illustrated in the accompanying drawings, and various modifications and changes may be made without departing from the scope thereof. The scope of the present disclosure is limited only by the appended claims.

What is claimed is:

1. A display panel, wherein the display panel comprises a light- emitting unit and a pixel driving circuit for driving the light-emitting unit, the pixel driving circuit comprises a plurality of driving transistors, a second electrode of each of the plurality of driving transistors is connected to a first electrode of a same light-emitting unit, and each of the plurality of driving transistors is configured to input a driving current to the light-emitting unit according to a voltage of a gate electrode of each of the plurality of driving transistors;

wherein the display panel further comprises:

a base substrate; and an active layer at a side of the base substrate, wherein the active layer comprises a plurality of third active portions, and the third active portions are used to form channel regions of the plurality of driving transistors;

wherein the pixel driving circuit comprises a plurality of pixel driving sub-circuits, and orthographic projections of the plurality of pixel driving sub-circuits on the base substrate are distributed in an array along a first direction and/or a second direction, and the first direction intersects the second direction;

each of the plurality of pixel driving sub-circuits comprises the at least one of the driving transistors, and each of the plurality of pixel driving sub-circuits is connected to a same light-emitting unit, and each of the plurality of pixel driving sub-circuits is used to provide a driving current to the light-emitting unit;

wherein the display panel further comprises:

an active layer at a side of the base substrate, wherein the active layer comprises a plurality of third active portions, and the plurality of third active portions are used to form channel regions of the driving transistors;

a first conductive layer at a side of the active layer away from the base substrate, wherein the first conductive layer comprises a plurality of first conductive portions spaced apart, the first conductive portions and the third active portions are arranged correspondingly, and an orthographic projection of one of the first conductive portions on the base substrate covers an orthographic projection of a corresponding third active portion on the base substrate, and the first conductive portion is to form the gate electrode of at least one of the driving transistors.

2. The display panel according to claim 1, wherein the active layer further comprises an eighth active portion and a ninth active portion, and the third active portions in a same pixel driving circuit are connected in parallel between the eighth active portion and the ninth active portion.

3. The display panel according to claim 2, wherein an orthographic projection of the eighth active portion on the base substrate and an orthographic projection of the ninth active portion on the base substrate extend along a second direction;

wherein orthographic projections of the plurality of third active portions in the same pixel driving circuit on the base substrate are spaced apart along the second direction.

4. The display panel according to claim 3, wherein the pixel driving circuit further comprises a fourth transistor and a fifth transistor, a first electrode of the fourth transistor is connected to a data line, a second electrode of the fourth transistor is connected to a first electrode of at least one of the driving transistors, a first electrode of the fifth transistor is connected to a first power line, and a second electrode of the fifth transistor is connected to the first electrode of at least one of the driving transistors;

wherein the active layer further comprises:

a fourth active portion connected to an end of the eighth active portion, wherein the fourth active portion is used to form a channel region of the fourth transistor;

a fifth active portion connected to the other end of the eighth active portion, wherein the fifth active portion is used to form a channel region of the fifth transistor;

wherein the display panel further comprises a first conductive layer, the first conductive layer is located at a side of the active layer away from the base substrate, and the first conductive layer comprises:

a first gate line, wherein an orthographic projection of the first gate line on the base substrate extends along a first direction and covers an orthographic projection of the fourth active portion on the base substrate, a partial structure of the first gate line is used to form a gate electrode of the fourth transistor, and the first direction intersects the second direction;

an enable signal line, wherein an orthographic projection of the enable signal line on the base substrate extends along the first direction and covers an orthographic projection of the fifth active portion on the base substrate, and a partial structure of the enable signal line is used to form the gate electrode of the fifth transistor;

wherein the orthographic projections of the third active portions on the base substrate are located between the orthographic projection of the first gate line on the base substrate and the orthographic projection of the enable signal line on the base substrate.

5. The display panel according to claim 2, wherein the display panel further comprises:

a first conductive layer at a side of the active layer away from the base substrate, wherein the first conductive layer comprises a first conductive portion, an orthographic projection of the first conductive portion on the base substrate covers an orthographic projection of each of the third active portions in the same pixel driving circuit on the base substrate; and wherein at least a partial structure of the first conductive portion is used to form a gate electrode of the driving transistors.

6. The display panel according to claim 1, wherein one of the plurality of pixel driving sub-circuits further comprises a sixth transistor and a seventh transistor, a first electrode of the sixth transistor is connected to a second electrode of at least one of the driving transistors, a second electrode of the sixth transistor is connected to a first electrode of the light-emitting unit, a first electrode of the seventh transistor is connected to a second initialization signal line, and a second electrode of the seventh transistor is connected to the first electrode of the light-emitting unit;

wherein the active layer further comprises:

a sixth active portion connected to the third active portion, wherein the sixth active portion is used to form a channel region of the sixth transistor;

a seventh active portion connected to an end of the sixth active portion away from the third active portion, wherein the seventh active portion is used to form a channel region of the seventh transistor; and at least one tenth active portion connected between the sixth active portion and the seventh active portion;

wherein the display panel further comprises:

a fourth conductive layer at side of the first conductive layer away from the base substrate, wherein the fourth conductive portion comprises a first bridge portion, the first bridge portion is respectively connected to each of at least one tenth active portion in a same pixel driving circuit, and the first bridge portion is connected to the first electrode of the light-emitting unit.

7. The display panel according to claim 1, wherein one of the plurality of pixel driving sub-circuits further comprises a first transistor, a second transistor and a seventh transistor, wherein:

a first electrode of the first transistor is connected to a first initialization signal line, and a second electrode of the first transistor is connected to a gate electrode of at least one of the driving transistors, a first electrode of the second transistor is connected to the gate electrode of at least one of the driving transistors, and a second electrode of the second transistor is connected to a second electrode of at least one of the driving transistors, a first electrode of the seventh transistor is connected to a second initialization signal line, and a second electrode of the seventh transistor is connected to the first electrode of the light-emitting unit;

wherein the active layer further comprises:

a first active portion used to form a channel region of the first transistor; and a second active portion used to form a channel region of the second transistor;

wherein the first conductive layer further comprises:

a first reset signal line, wherein an orthographic projection of the first reset signal line on the base substrate extends along the first direction, the orthographic projection of the first reset signal line on the base substrate covers an orthographic projection of the first active portion on the base substrate, and a partial structure of the first reset signal line is used to form a gate electrode of the first transistor;

a first gate line, wherein an orthographic projection of the first gate line on the base substrate extends along the first direction, the orthographic projection of the first gate line on the base substrate covers the orthographic projection of the second active portion on the base substrate, and a partial structure of the first gate line is used to form a gate electrode of the second transistor;

wherein the display panel further comprises a second conductive layer, the second conductive layer is located at a side of the first conductive layer away from the base substrate, and the second conductive layer comprises:

a second initialization signal line, wherein an orthographic projection of a second initialization signal line for an adjacent previous row of pixel driving sub-circuits on the base substrate is located between an orthographic projection of a first reset signal line for a current row of pixel driving sub-circuits on the base substrate and an orthographic projection of a first gate line for the current row of pixel driving sub-circuits on the base substrate.

8. The display panel according to claim 7, wherein the active layer further comprises:

an eleventh active portion connected between the first active portion and the second active portion;

wherein the second conductive layer further comprises:

a first protrusion connected to the second initialization signal line, wherein an orthographic projection of the first protrusion on the base substrate extends along the second direction, and the orthographic projection of the first protrusion on the base substrate at least partially overlaps with the orthographic projection of the eleventh active portion on the base substrate; or wherein the second transistor is a double-channel structure, the double channel of the second transistor comprises a first channel and a second channel, and the second active portion comprises:

a first active sub-portion used to form the first channel of the second transistor; and a second active sub-portion used to form the second channel of the second transistor;

wherein the active layer further comprises:

a third active sub-portion connected between the first active sub-portion and the second active sub-portion;

wherein the second conductive layer further comprises:

a second protrusion connected to the second initialization signal line, wherein an orthographic projection of the second protrusion on the base substrate extends along the second direction, and the orthographic projection of the second protrusion on the base substrate at least partially overlaps with an orthographic projection of the third active sub-portion on the base substrate.

9. The display panel according to claim 1, wherein a display region of the display panel comprises a normal display region, and the display panel further comprises:

a fourth conductive layer at a side of the active layer away from the base substrate, wherein the fourth conductive layer comprises a first power connection line, the first power connection line is used to provide a high-level power signal to the pixel driving circuit, and an orthographic projection of the first power connection line on the base substrate is a ring.

10. The display panel according to claim 9, wherein the display panel further comprises:

a third conductive layer between the active layer and the fourth conductive layer, wherein the third conductive layer comprises a power bridge line, and an orthographic projection of the power bridge line on the base substrate extends along a second direction;

wherein an orthographic projection of at least part of a structure of the first power connection line on the base substrate is located between orthographic projections of two power bridge lines which are adjacent in a first direction on the base substrate, and the power bridge lines are connected to the first power connection line through via holes, respectively, and the first direction intersects the second direction; or wherein the pixel driving circuit comprises a fifth transistor, a first electrode of the fifth transistor is connected to the first power line, and a second electrode of the fifth transistor is connected to the first electrode of at least one of the driving transistors;

wherein the display panel further comprises:

a third conductive layer between the active layer and the fourth conductive layer, wherein the third conductive layer comprises a first power line;

wherein an orthographic projection of the first power line on the base substrate extends along a second direction, the orthographic projection of the first power line on the base substrate at least partially overlaps with an orthographic projection of a first power connection line on the base substrate, and the first power line is connected to the first power connection line through a via hole.

11. The display panel according to claim 9, wherein the pixel driving circuit comprises a fifth transistor, a first electrode of the fifth transistor is connected to the first power line, and a second electrode of the fifth transistor is connected to the first electrode of at least one of the driving transistors;

wherein the display panel further comprises:

a third conductive layer between the active layer and the fourth conductive layer, wherein the third conductive layer comprises a first power line;

wherein an orthographic projection of the first power line on the base substrate extends along a second direction, the orthographic projection of the first power line on the base substrate at least partially overlaps with an orthographic projection of a first power connection line on the base substrate, and the first power line is connected to the first power connection line through a via hole; or wherein the pixel driving circuit comprises a plurality of pixel driving sub-circuits, and orthographic projections of the plurality of pixel driving sub-circuits on the base substrate are distributed in an array along a first direction and/or a second direction, and the first direction intersects the second direction;

wherein each of the plurality of pixel driving sub-circuits comprises at least one of the driving transistors, each of the plurality of pixel driving sub-circuits is connected to a same light- emitting unit, and each of the plurality of pixel driving sub-circuits is used to provide a driving current to the light-emitting unit;

wherein one of the pixel driving sub-circuits further comprises a fifth transistor, a first electrode of the fifth transistor is connected to a first power line sub-portion, and a second electrode of the fifth transistor is connected to a first electrode of at least one of the driving transistors;

wherein the fourth conductive layer further comprises the first power line sub-portion, an orthographic projection of the first power line sub-portion on the base substrate comprises a portion extending along the second direction and a portion extending along the first direction, the first power line sub-portion and the pixel driving circuit are arranged correspondingly, the first power line sub-portion is connected to the first electrode of the fifth transistor in a corresponding pixel driving circuit, and the first power line sub-portion is connected to the first power connection line.

* * * * *